United States Patent
Ishii et al.

(10) Patent No.: US 6,492,692 B1
(45) Date of Patent: Dec. 10, 2002

(54) SEMICONDUCTOR INTEGRATED CIRCUIT AND MANUFACTURING METHOD THEREFORE

(75) Inventors: Kazutoshi Ishii, Chiba (JP); Naoto Inoue, Chiba (JP); Koushi Maemura, Chiba (JP); Shoji Nakanishi, Chiba (JP); Yoshikazu Kojima, Chiba (JP); Kiyoaki Kadoi, Chiba (JP); Takao Akiba, Chiba (JP); Yasuhiro Moya, Chiba (JP); Kentaro Kuhara, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/407,382

(22) Filed: Sep. 28, 1999

Related U.S. Application Data

(62) Division of application No. 08/815,907, filed on Mar. 12, 1997, now Pat. No. 6,022,792.

(30) Foreign Application Priority Data

| | | | |
|---|---|---|---|
| Mar. 13, 1996 | (JP) | | 8-056587 |
| Mar. 21, 1996 | (JP) | | 8-064965 |
| Mar. 21, 1996 | (JP) | | 8-064966 |
| Apr. 15, 1996 | (JP) | | 8-092143 |
| Apr. 18, 1996 | (JP) | | 8-097117 |
| Apr. 18, 1996 | (JP) | | 8-097118 |
| Apr. 18, 1996 | (JP) | | 8-097119 |
| May 14, 1996 | (JP) | | 8-119300 |
| May 14, 1996 | (JP) | | 8-119301 |
| Jun. 7, 1996 | (JP) | | 8-146230 |
| Aug. 2, 1996 | (JP) | | 8-205033 |
| Dec. 2, 1996 | (JP) | | 8-322001 |
| Dec. 2, 1996 | (JP) | | 8-322002 |
| Dec. 2, 1996 | (JP) | | 8-322003 |
| Dec. 2, 1996 | (JP) | | 8-322004 |
| Dec. 2, 1996 | (JP) | | 8-322005 |
| Dec. 2, 1996 | (JP) | | 8-322006 |
| Dec. 9, 1996 | (JP) | | 8-328826 |
| Dec. 16, 1996 | (JP) | | 8-336093 |
| Dec. 19, 1996 | (JP) | | 8-340067 |

(51) Int. Cl.$^7$ ............................................. H01L 29/72
(52) U.S. Cl. ..................... 257/408; 257/761; 257/765; 257/766
(58) Field of Search ............................... 257/761, 765, 257/766, 408

(56) References Cited

U.S. PATENT DOCUMENTS

| | | | |
|---|---|---|---|
| 4,073,055 A | | 2/1978 | Kimura et al. |
| 5,451,549 A | | 9/1995 | Oki et al. |
| 5,542,174 A | * | 8/1996 | Chiu .......................... 257/408 |
| 5,840,593 A | | 11/1998 | Leedy |

\* cited by examiner

*Primary Examiner*—Edward Wojciechowicz
(74) *Attorney, Agent, or Firm*—Hogan & Hartson, LLP

(57) ABSTRACT

To decrease the area of a chip, improve the manufacturing efficiency and decrease the cost in a semiconductor device such as a driver integrated circuit having a number of output pads, and an electronic circuit device such as electronic clock. There are disposed output pads superposed in two dimensions on driving transistors or logic circuits connected thereto, respectively. Further, not only aluminum interconnection but also bump electrodes or barrier metals are used for the interconnection of the semiconductor device. In a case where a semiconductor integrated circuit is electrically adhered on to a printed circuit board in a face down manner, a solder bump disposed on the semiconductor integrated circuit and the interconnection of the printed circuit board are directly connected to each other, thereby realizing the electrical connection. On this occasion, the bump electrode as the external connecting terminal of the semiconductor integrated circuit is laminated on the transistor.

8 Claims, 40 Drawing Sheets

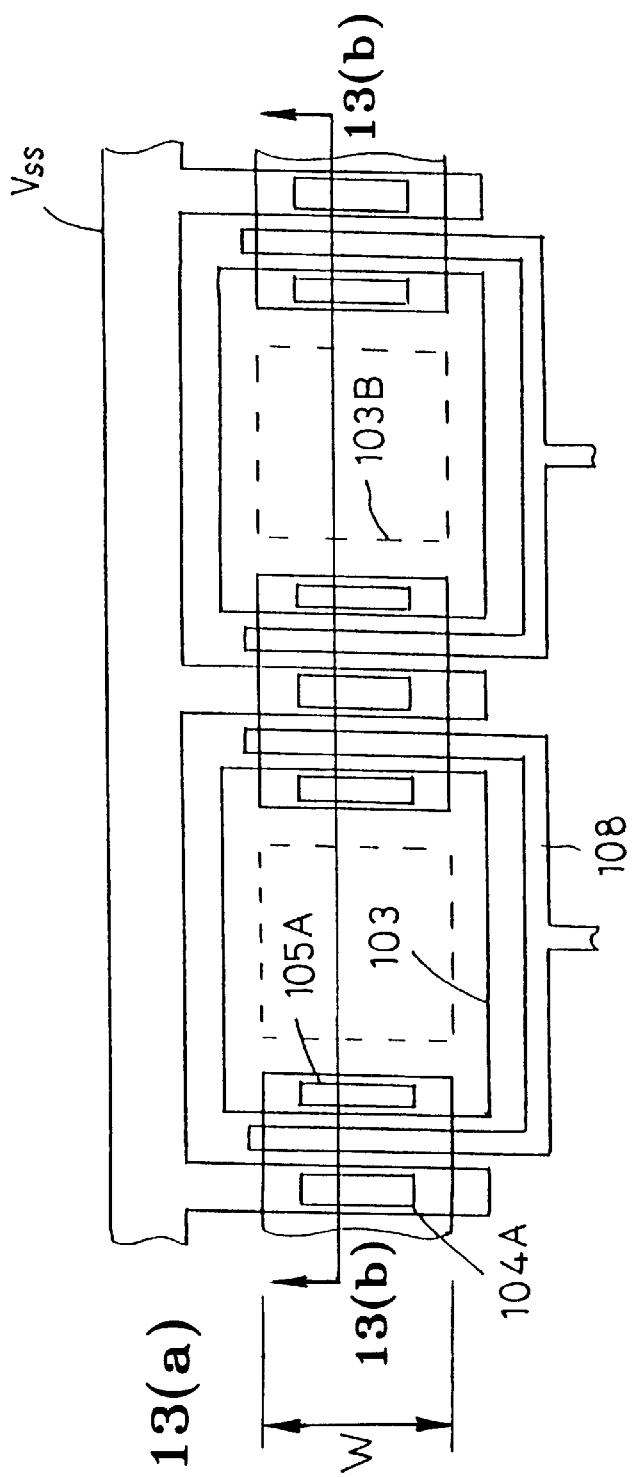
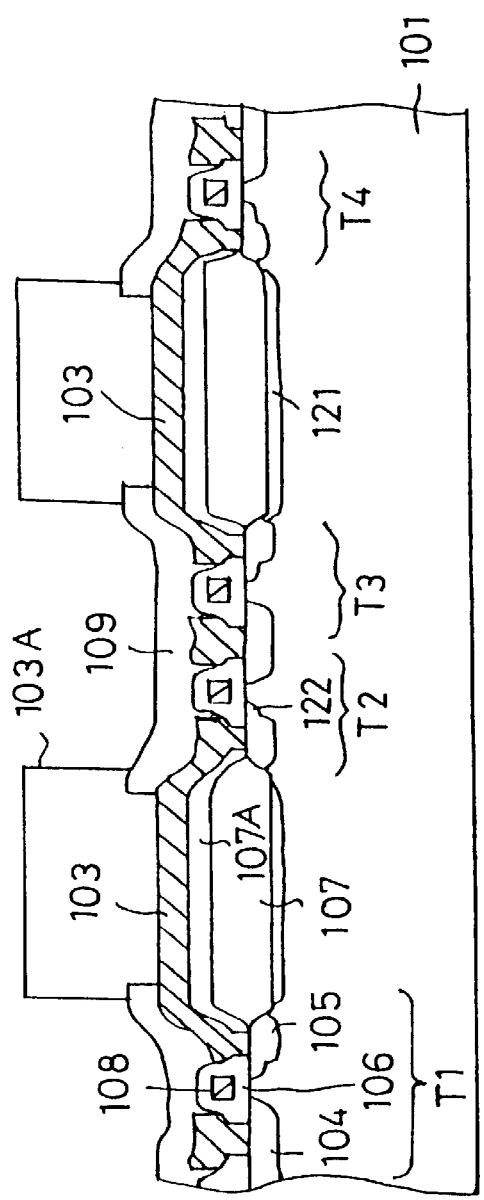
FIG. 13(a)
FIG. 13(b)

FIG. 15
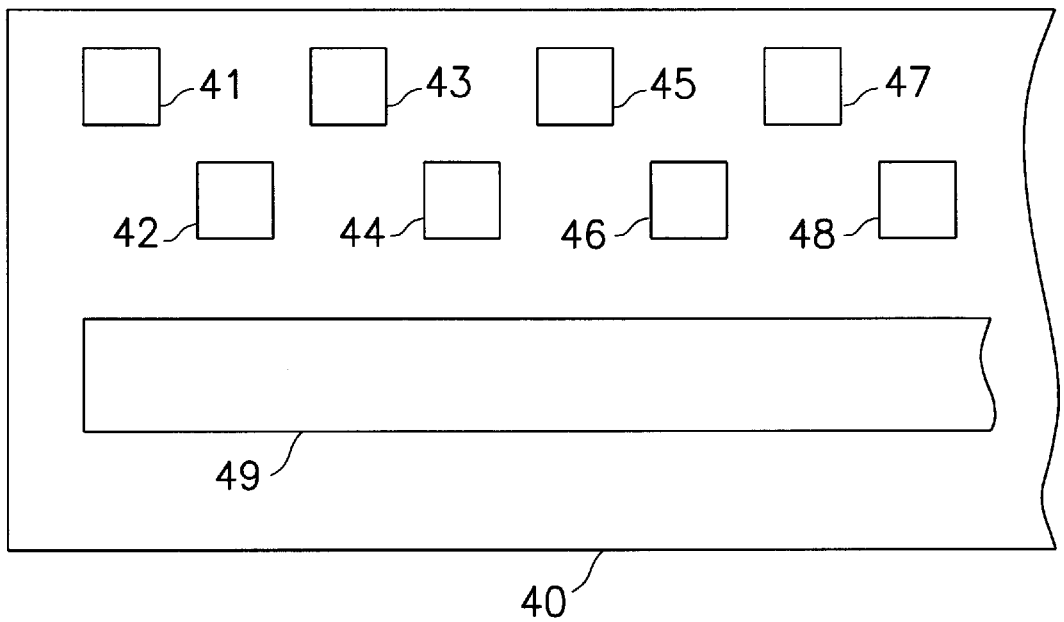
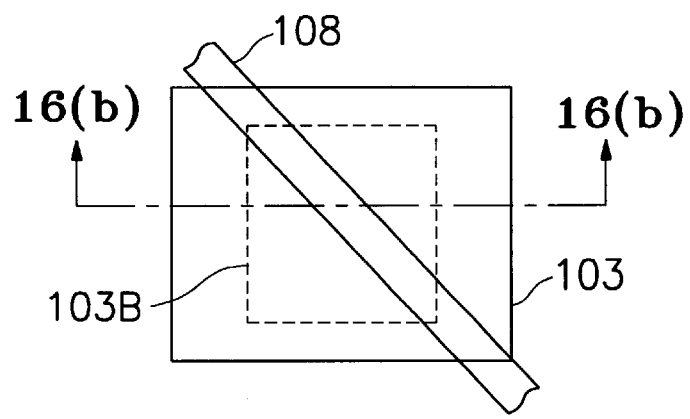
FIG. 16(a)
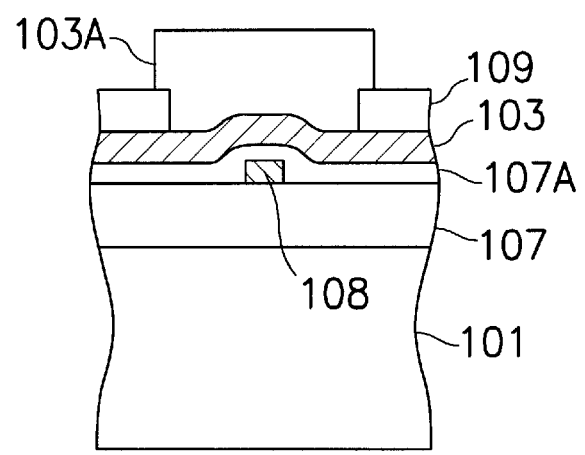
FIG. 16(b)

SEMICONDUCTOR INTEGRATED CIRCUIT AND MANUFACTURING METHOD THEREFORE

This is a division of application Ser. No. 08/815,907 filed Mar. 12, 1997, now U.S. Pat. No. 6,022,792 which application is hereby incorporated by reference in its entirety.

BACKGROUND OF THE INVENTION

The present invention relates to a semiconductor integrated circuit device for driving a liquid crystal of a liquid crystal display panel, for a thermal head used for a printer of a facsimile, for driving a step motor of a quartz clock, and for a nonvolatile memory, and to a manufacturing method therefor.

The present invention relates to an electronic circuit using the above semiconductor integrated circuit, and to a manufacturing method therefor.

The present invention relates to an insulating gate field effect type semiconductor integrated circuit having a high withstand voltage construction, more specifically to a driver integrated circuit for driving a liquid crystal, for driving a thermo-sensitive register, and the like.

The present invention relates to a semiconductor device, more specifically to a semiconductor device having a plurality of driving transistors such as a semiconductor integrated circuit for a thermal head, and having output pads for the driving transistors, respectively.

The present invention relates to a semiconductor circuit device having an external electrically connecting terminal on an electronic circuit.

The present invention relates to a stable operation of a semiconductor integrated circuit device.

The present invention specifically relates to a semiconductor integrated circuit device having bump electrodes on an electronic circuit, The present invention relates to a semiconductor integrated circuit device having a built-in protecting circuit for protecting internal elements.

The present invention relates to a semiconductor integrated circuit device having bump electrodes.

More specifically, the present invention relates to semiconductor integrated circuit, such as a semiconductor integrated circuit for driving a thermal head, in which the side of a chip is remarkably long as compared with the area of the chip.

The present invention relates to a method of manufacturing a semiconductor integrated circuit, more specifically to a method of manufacturing a semiconductor integrated circuit, such as a semiconductor integrated circuit for driving a thermal head, which is remarkably elongated, and having a long periphery length.

The present invention relates to a semiconductor integrated circuit in which a plurality of transistors are integrated on the same substrate, particularly to a semiconductor integrated circuit in which a pad portion as an external connecting terminal is disposed on a transistor.

The present invention relates to an electronic circuit and a manufacturing method therefor, particularly to an electronic circuit including an integrated circuit which is implemented on a printed circuit board in a face down manner, more specifically to an electronic circuit used for an electronic clock.

The conventional semiconductor device (semiconductor integrated circuit) for a thermal head has a switching function for applying an electric current of about 10 mA through a plurality of resistors of several kΩ arranged in line along a thermal-sensitive paper corresponding to a printing information. The respective thermal-sensitive resistors are electrically connected to an external connecting terminal disposed on a surface of the semiconductor device.

FIG. 2 is a sectional view of an output portion of a general semiconductor device for a thermal head. Thermal-sensitive resistors and semiconductor devices are disposed away from each other in two dimensions on a thermal head substrate. The thermal-sensitive resistors are directly connected to bonded wires 11. The bonded wire 11 is mechanically and electrically connected to a pad region made of an aluminum interconnection by a bonding process. The pad region is comprised of an aluminum film pattern formed, used for connection to the external circuit, by perforating a final passivation film 10 on an aluminum interconnection 9. Below the pad region are disposed an intermediate insulating film 8 and a field insulating film 6 which bear mechanical stress at the bonding process. The aluminum interconnection 9 of the pad region is electrically connected to a drain region of a resistor driving insulating gate field effect transistor arranged in two dimensions through a contact region 12. The drain region, being of a high withstand voltage construction, is comprised of a first drain region 3B comprising a low density impurity region, and a second drain region 3A comprising a high density impurity region. A high voltage of about 30 V is added to the thermal-sensitive resistors in order to apply a large electric current of about 10 mA thereto. Accordingly, when the transistor which functions as a switch is turned off, a high voltage of about 30 V is added to the drain region. A plurality of the transistors for switching the respective thermal-sensitive resistors are arranged along a longitudinal direction of the semiconductor by the number of the resistors in a row as shown in FIG. 3.

An example of the conventional semiconductor device is shown in FIG. 3. FIG. 3 is a plane view of a semiconductor integrated circuit for a thermal head. Output pads O1, O2, . . . , ON and electric source pads P1, P2 and the like are arranged on a periphery of a chip 50. The circuit on which transistors are integrated is arranged away from an external leading electrode in two dimensions. In other words, driving transistors T1, T2, . . . , TN are arranged so as to be electrically connected to the corresponding output pads, and further logic circuits L1, L2, . . . , LN for controlling the respective driving transistors are arranged cycle-periodically along a longitudinal direction of the chip 50. The external leading electrode is comprised of a perforation 92 disposed on the final protecting film and a bump 93 is disposed on the perforation 92. The bump in FIG. 3 may be replaced by a bonding.

FIG. 4 shows a conventional semiconductor integrated circuit device. A plurality of pad electrodes 603 as terminals which are to be connected to the external circuit are disposed on a semiconductor substrate 601. The pad electrodes 603 are connected to an internal electronic circuit 602 through protecting circuits 604, respectively. The protecting circuit 604 aims to discharge an eddy-current in order to prevent the breakdown of the internal electronic circuit 602 due to the eddy-current caused by static electricity and noise inputted to the internal electronic circuit 602 from the external circuit. Basically, one protecting circuit 604 is required for one pad electrode 603. Also, in order to discharge the eddy-current, the protecting circuit 604 is required to be sufficiently away from the internal circuit 602 in such a manner that the discharging electric charge does not reach the internal circuit 602.

However, the conventional semiconductor device for the thermal head has the problems described below. That is, as shown in FIG. 2, the transistors and the bonding pads are required to be disposed away from each other in two dimensions, so that the area of the semiconductor device becomes large, which makes it difficult to lower the manufacturing cost.

Also, the conventional high withstand voltage MOS transistor has a shallow diffusion depth of a low density drain region used for obtaining the high withstand voltage characteristic, which requires the transistor having a large area in order for a large electric current to flow therethrough against the increase of the resistance thereat. Further, when raising the density of the low density drain region for obtaining the high withstand voltage characteristic in order to reduce the resistance thereof, the withstand voltage of the drain region is excessively reduced down to not greater than 10 V. Otherwise, when the diffusion depth is made deeper while remaining the low density, the low density drain region for obtaining the high withstand voltage characteristic excessively becomes large in a lateral direction also, which makes the transistor excessively large.

The conventional semiconductor device shown in FIG. 2 has an disadvantage that, since the active element region on which the transistors are arranged and the external leading electrode are located separately on the individual locations, the area of the chip is large, thereby preventing the reduction in the cost of the chip.

The conventional semiconductor device has a problem that, since the external electrically connecting terminal-use metal electrode is formed larger than the size of the opening portion of the passivation film, on the region in which the external electrically connecting terminal-use metal electrode exists cannot be formed thereover the interconnection of the same metal, thereby preventing the reduction in the chip size.

In the technique of directly implementing a semiconductor integrated circuit on a glass substrate such as COG (Chip on Glass), the semiconductor integrated circuit used for a liquid crystal and the like is exposed to the light entering through the glass of the liquid crystal panel, thereby failing to function properly. As a result, the light shielding is required, and therefore the metal interconnections in the integrated circuit are used as the light shielding film. In a case where the metal interconnections are used in the semiconductor integrated circuit used for the liquid crystal panel, there are caused gaps between the interconnections and the light shielding film region, which makes it impossible to shield the light effectively, since the interconnections are essentially used for the connection between the elements. Also, there are easily caused a case that the voltage of the light shielding film cannot be stabilized, since the light is shielded at a location between the interconnections. In this case, there is unexpectedly caused a floating state, which is not preferable in view of the stable operation.

In the conventional semiconductor device, a pressure is applied to a portion between the external circuit and the semiconductor substrate in order to connect the bump electrode with the external circuit. On this occasion, if the passivation film and the polysilicon resistor are formed below the bump electrode, the passivation film and the polysilicon resistor also are applied with a force, thereby causing cracks on the passivation film to lower the reliability of the semiconductor integrated circuit, and deforming the polysilicon resistor to change the resistance value and therefore lowering the characteristic of the semiconductor integrated circuit.

In the conventional semiconductor device, a pressure is applied to a portion between the bonded wire and the semiconductor substrate in order to connect the external electrically connecting terminal-use aluminum electrode with the bonded wire. On this occasion, if the passivation film and the polysilicon resistor are formed below the bump electrode, the passivation film and the polysilicon resistor also are applied with a force, thereby causing cracks on the passivation film to lower the reliability of the semiconductor integrated circuit, and deforming the polysilicon resistor to change the resistance value and therefore lowering the characteristic of the semiconductor integrated circuit.

The conventional semiconductor device requires the protecting circuits 604 which is identical in number with the pad electrodes 603 as shown in FIG. 4. Then, the protecting circuits 604 are required to be located away from the internal electronic circuits 602, thereby enlarging the area of the protecting circuits 604 which occupy the semiconductor substrate 601 to increase the size of the chip of the semiconductor integrated circuit device, which excessively increases of the cost of the semiconductor integrated circuit device.

The conventional semiconductor integrated circuit, having a dummy bump region, therefore has an drawback to increase the chip size and then increases the cost of the chip.

In the corner portion of the conventional semiconductor integrated circuit device, the silicone substrate on the chip is, before implementation, cut to be shaped like a rectangular. The diffusion region constituting the semiconductor integrated circuit is disposed inside the chip about 40 μm away from the scribed surface.

However, the conventional semiconductor integrated circuit device has a drawback that, since the diffusion region is designed/manufactured to be located not less than 40 μm away from the scribed surface, the chip size is large and therefore the cost of the chip cannot be reduced.

It is found out that the conventional semiconductor integrated circuit device has a drawback to excessively change the characteristic of the integrated circuit due to the static electricity when the pad portion is disposed on the separation region. In other words, when a high voltage is applied to the pad portion as the external connecting terminal, a small amount of electric current unexpectedly flows between electrically separated different N+impurity regions formed in a construction of sandwiching the separation region therebetween, although the detail mechanism is still unclear.

It is known from our experiments that the small amount of electric current is recovered by applying ultraviolet irradiation and high temperature to the semiconductor device. However, there is a problem that it is practically impossible to execute the ultraviolet irradiation on all such occasions.

The conventional integrated circuit using the wire bonding has a problem that the chip size cannot be reduced since the active element region and the pad portion are located on separate regions. Further, there is a problem that, since the pad and the printed circuit board are electrically connected through the bonded wire and the lead, the printed circuit board on which the chips are implemented cannot be sized down. Besides, there are problems that the pad and the printed circuit board are connected by a connection method including three-times connection manner, which cannot be carried out simultaneously, thereby be capable of reducing the manufacturing time. Accordingly, as apparent from the above, the chip and the implemented device cannot be sized down and further the manufacturing processes are long and complicated, whereby the implemented electronic circuit cannot be manufactured at a low cost.

It is, therefore, an object of the present invention to reduce the area of the transistor and the pad and therefore to reduce the manufacturing cost of the device, in order to solve the above-mentioned conventional problems.

Further, it is an object of the present invention to obtain a semiconductor device which is capable of applying a large electric current even with the small area in a high withstand voltage MOS transistor in which a high voltage of not less than 10 V is applied to a drain region.

Still further, it is an object of the present invention to solve the above drawbacks then providing a semiconductor device which is capable of reducing the cost of the device due to the reduction of the chip size.

Also, it is an object of the present invention to solve the above drawbacks then providing a semiconductor integrated circuit which is capable of reducing the size of the chip, on which an external electrically connecting terminal-use metal electrode is formed on an electronic circuit even with the small area without changing the characteristic of the circuit.

Further, it is an object of the present invention to solve the above drawbacks then providing a semiconductor device which, being superior in reliability, has a bump electrode at an electronic circuit without changing the characteristic of the circuit.

Still further, it is an object of the present invention to solve the above drawbacks then providing a semiconductor integrated circuit which, being superior in reliability, has an external electrically connecting terminal-use aluminum electrode at an electronic circuit without changing the characteristic of the circuit.

Moreover, it is an object of the present invention to solve the above drawbacks then providing a semiconductor integrated circuit which, being superior in reliability, has an external electrically connecting terminal-use metal electrode at an electronic circuit without changing the characteristic of the circuit.

Further, it is an object of the present invention to solve the above drawbacks then providing a semiconductor integrated circuit which prevents the enlargement of the area of the protecting circuit.

Still further, it is an object of the present invention to solve the above drawbacks then providing a semiconductor integrated circuit device which is capable of reducing the cost of the device due to the reduction of the chip size.

Moreover, it is an object of the present invention to provide a method of manufacturing a semiconductor integrated circuit device which is capable of reducing the cost of the device due to the reduction of the chip size, more specifically to provide a method of manufacturing a semiconductor integrated circuit device which is capable of reducing the area of the chip of an integrated circuit for a thermal head, or a minute integrated circuit such as a closely contact type line sensor integrated circuit.

Besides, it is an object of the present invention to provide a semiconductor device which prevents the increase of the leak electric current even if the static electricity, which is optionally applied to the pad electrode at the time of the implementation, is applied, in the semiconductor device in which the pad portion is laminated on the transistors in order to reduce the area of the semiconductor integrated circuit.

In is an object of the present invention to solve the above problems then reducing the chip size, sizing down the implemented electronic circuit, improving the manufacturing efficiency of the electronic circuit, and reducing the cost of the device.

SUMMARY OF THE INVENTION

The present innovation uses the following means in order to solve the above-mentioned problems.

That is, in a semiconductor integrated circuit comprising a first conductive type semiconductor substrate region disposed on a surface of a support substrate, and a second conductive type insulating gate field effect transistor disposed on a surface of the semiconductor substrate region, and an external electrically connecting terminal disposed so as to be electrically connected to a drain region of the insulating gate field effect transistor through a metal film; the drain region is of a high withstand voltage construction, comprising a first drain region of a second conductive type deep impurity region of low density, and a second drain region of a second conductive type shallow impurity of high density disposed on an inside surface of the first drain region, and the external electrically connecting terminal is partially superposed on the drain region. Also, the external electrically connecting terminal comprises a bump electrode of not less than 10 $\mu$m in height, then a gate insulating film of the insulating gate field effect transistor has a film thickness of 100 to 250 Å.

In a semiconductor integrated circuit comprising high withstand insulating gate field effect transistors electrically connected between a plurality of output pads and an earth electrode in open drain construction manner, respectively, a plurality of preamplifier circuits for controlling voltages of gate electrodes of the high withstand voltage insulating gate field effect transistors, and a plurality of latch circuits for supplying signals to a plurality of the preamplifiers, and flip-flip circuits for supplying in order signals to a plurality of the latch circuits; the output pads, the high withstand insulating gate field effect transistors, the preamplifier circuits, the latch circuits, and the flip-flop circuits are arranged in two dimensions cycle-periodically along a longitudinal direction of the semiconductor integrated circuit, and the high withstand voltage insulating gate field effect transistors each is arranged between the output pads.

In a semiconductor integrated circuit comprising a plurality of output pads to which a voltage greater than an electric source voltage, and high withstand voltage driving insulating gate field effect transistors directly electrically connected to drain regions through an extended conductive film of the output pad, respectively; the high withstand voltage driving insulating gate field effect transistors, each having a gate insulating film thickness of 100 to 250 Å in film thickness, are arranged around the output pad. Also, the high withstand voltage driving insulating gate field effect transistors are arranged line-symmetrically on both sides of the output pads, then the high withstand voltage driving insulating gate field effect transistors are arranged on four sides around the output pad. There is a case that the output pad has a bump. The output pads are arranged in series or in a staggered form along a longitudinal direction of the semiconductor integrated circuit.

In a semiconductor integrated circuit comprising driving insulating gate field effect transistors electrically connected between a plurality of output pads and an earth electrode in open drain construction form, and a plurality of logic circuit cells for controlling voltages of gate electrodes of the driving insulating gate field effect transistors; the output pads, the driving insulating gate field effect transistors and the logic circuit cells are arranged cycle-periodically along a longitudinal direction of the semiconductor device, and the output pads are superposed on the driving insulating gate field effect transistors and the logic circuit cells. Also, there is a case that the output pad comprises a bump electrode disposed on a drain electrode of the driving insulating gate field effect transistor through a barrier metal. There is a case that source electrodes of the driving insulating gate field effect transistors are electrically connected to the barrier metal, respectively. The barrier metal is used as portions of interconnections of the logic circuit cells.

In a semiconductor integrated circuit comprising a semiconductor electronic circuit having insulating gate field effect transistors, an interconnection region and a separation region disposed in the vicinity of a surface of a semiconductor substrate, and an external electrically connecting terminal-use electrode superposed on the semiconductor electronic circuit; a protecting film opening portion for electrically connecting a metal interconnecting layer constituting the electronic circuit and the external electrically connecting terminal-use electrode has a size of not greater than 900 $\pi\mu m^2$ in area. Also, the external electrically connecting terminal-use electrode comprises a bump electrode of not less than 10 $\mu m$ in height. The protecting film opening portion for electrically connecting the metal interconnecting layer constituting the electronic circuit and the external electrically connecting terminal-use electrode is disposed outside on a location except a center portion of the external electrically connecting terminal-use electrode. The protecting film opening portion for electrically connecting the metal interconnecting layer constituting the electronic circuit and the external electrically connecting terminal-use electrode is superposed on an inside surface of the external electrically connecting terminal-use electrode at one or more locations. The external electrically connecting terminal-use electrode is disposed on the metal interconnecting layer through a barrier metal.

In other words, the area of the external electrically connecting terminal-use metal electrode is made not greater than $400\pi$ $\mu m^2$, which realizing the semiconductor integrated circuit device in which the occupied area of the external electrically connecting terminal-use metal electrode is reduced.

On this occasion, the semiconductor electronic circuit comprises an integrated circuit for driving an exothermic body of a thermal printing head. Further, the semiconductor electronic circuit comprises an integrated circuit for driving a liquid crystal of a liquid crystal display panel. The semiconductor electronic circuit comprises an integrated circuit for driving a step motor of a quartz clock. The semiconductor electronic circuit comprises a nonvolatile memory integrated circuit.

When the external electrically connecting terminal-use metal electrode is constructed as described above, the metal interconnecting layer can be superposed on a lower surface of the solder bump external electrically connecting terminal-use electrode or gold bump electrode, which realizing the semiconductor integrated circuit device having a small chip size.

A semiconductor integrated circuit comprises first and second metal electrodes disposed away from each other on a substrate, a metal interconnection made of the same metal as the first and second metal electrodes, a final protecting film disposed on a surface of the substrate including the metal interconnection, a perforation region of the final protecting film disposed on the first and second electrodes, and a barrier metal film interconnected on the perforation region of the final protecting film and the final protecting film between the first and second metal electrodes so as to electrically connect the first and second metal electrodes.

Also, a metal of a bump construction is disposed on the barrier metal film. The barrier metal film has a plane pattern in which a plurality of circle patterns are connected in series.

In a semiconductor integrated circuit having a bump and a barrier metal film below the bump; the barrier metal film is disposed also on a semiconductor element. In other words, the bump, and the barrier metal used for preventing the counter diffusion with the pad are arranged not only below but also on the semiconductor element, thereby enabling the light shielding.

A bump electrode arranged on an electronic circuit comprises a plurality of matrix-like bump electrodes for a single electric electrode, then a bump electrode arranged on an electronic circuit comprises a plurality of line-like bump electrodes for a single electric electrode. Also, a bump electrode arranged on an electronic circuit has a gap therein. A bump electrode arranged on an electronic circuit is shaped like a comb.

In other words, (1) the bump electrode is divided into a plurality of pieces, which provides the semiconductor integrated circuit device having the bump electrodes in which the stress applied to the integrated circuit can be distributed;

(2) two dimensional gaps are formed in the bump electrode, which provides the semiconductor integrated circuit device having the bump electrode in which the stress applied to the integrated circuit can be distributed; and (3) gaps are formed on the periphery portion of the bump electrode, which provides the semiconductor integrated circuit device having the bump electrode in which the stress applied to the integrated circuit can be distributed.

In an external electrically connecting terminal-use electrode disposed on an electronic circuit element, the external electrically connecting terminal-use electrode has a gap, or is shaped like a lattice, a continuous rectangle, or a curve.

In other words, (4) gaps are formed in the external electrically connecting terminal-use aluminum electrode, which provides the semiconductor integrated circuit device having the external electrically connecting terminal-use aluminum electrode in which the stress applied to the integrated circuit can be distributed;

(5) the external electrically connecting terminal-use aluminum electrode is shaped like a plurality of continuously rectangle, which provides the semiconductor integrated circuit device having the external electrically connecting terminal-use aluminum electrode in which the stress applied to the integrated circuit can be distributed; and (6) the external electrically connecting terminal-use aluminum electrode is shaped like a plurality of protrusions, which provides the semiconductor integrated circuit device having the external electrically connecting terminal-use aluminum electrode in which the stress applied to the integrated circuit can be distributed.

In a semiconductor integrated circuit having an external electrically connecting terminal-use electrode disposed on an electronic circuit element, the external electrically connecting terminal-use electrode has a convexoconcave portion at a surface thereof, a convexoconcave portion on a surface of the external electrically connecting terminal-use electrode is formed by a construction film just below the external electrically connecting terminal, is formed by a separation insulating film just below the external electrically connecting terminal-use electrode, or is formed by another interconnecting material just below the external electrically connecting terminal-use electrode, or a convexoconcave portion on a surface of the external electrically connecting terminal-use electrode is shaped like one or more polygons, or like concentric circles or spiral.

In other words, (7) a plurality of protrusions are disposed in the external electrically connecting terminal-use aluminum electrode, which provides the semiconductor integrated circuit device having the external electrically connecting terminal-use aluminum electrode in which the stress applied to the integrated circuit at the time of the implementation of the bonded wire can be distributed. (8) A plurality of protrusions are disposed on a film just below the external electrically connecting terminal-use aluminum electrode, thereby forming a convexoconcave portion on a surface of the external electrically connecting terminal-use aluminum electrode, which provides the semiconductor integrated circuit device having the external electrically connecting terminal-use aluminum electrode in which the stress applied to the integrated circuit at the time of the implementation of the bonded wire can be distributed. (9) A line-like or curved convexoconcave portion is formed on a surface of the external electrically connecting terminal-use aluminum electrode, which provides the semiconductor integrated circuit device having the external electrically connecting terminal-use aluminum electrode in which the stress applied to the integrated circuit at the time of the implementation of the bonded wire can be distributed.

The external electrically connecting terminal-use aluminum electrode is constructed by one or a combination of the above constructions, thereby distributing the stress on the implementation of the device, which is capable of providing a semiconductor integrated circuit of high reliability, having the external electrically connecting terminal-use aluminum electrode on the elecronic circuit which does not change the characteristic of the circuit.

In a semiconductor integrated circuit having a bump electrode, the bump electrode is disposed on an electronic circuit, the bump electrode has a hollow portion, the hollow portion of the bump electrode is embedded by a material softer than that of the bump electrode. The hollow portion of the bump electrode is embedded by a polyimide resin, or the hollow portion of the bump electrode is embedded by a photoresist.

In other words, (10) a hollow portion is disposed in the bump electrode, which provides the semiconductor integrated circuit device having the bump electrode in which the stress applied to the integrated circuit can be distributed; and (11) a region made of a materiel softer than that of the bum electrode is disposed in the bump electrode, which provides the semiconductor integrated circuit device having the bump electrode in which the stress applied to the integrated circuit can be distributed.

According to the above construction, the stress on the implementation of the device is distributed, which is capable of providing a semiconductor integrated circuit of high reliability, having the bump electrode on the elecronic circuit which does not change the characteristic of the circuit.

A semiconductor integrated circuit having an external electrically connecting terminal-use electrode is disposed on an electronic circuit element, and then an insulating film just below the external electrically connecting terminal-use electrode is made of a polyimide resin.

In other words, a layer of a polyimide resin is disposed between the external electrically connecting terminal-use aluminum electrode and the plasma nitride film for the passivation film.

According to the above construction, the stress at the time of the implementation of the device is absorbed, which is capable of providing a semiconductor integrated circuit of high reliability, having the external electrically connecting terminal-use aluminum electrode on the elecronic circuit which does not change the characteristic of the circuit.

In a semiconductor integrated circuit comprising a semiconductor electronic circuit having insulating gate field effect transistors an interconnection region and a separation region disposed in the vicinity of a surface of a semiconductor substrate, and an external electrically connecting terminal-use electrode superposed on the semiconductor electronic circuit; a metal interconnecting layer constituting the semiconductor electronic circuit has a film thickness of 2 to 4 $\mu$m, then a bump electrode of not less than 10 $\mu$m in height is disposed on the external electrically connecting terminal-use electrode. The aluminum interconnecting layer serves as the electrode of the external electrically connecting terminal. The semiconductor electronic circuit comprises an integrated circuit for driving an exothermic body of a thermal printing head. The semiconductor electronic circuit comprises an integrated circuit for driving a liquid crystal of a liquid display panel. The semiconductor electronic circuit comprises an integrated circuit for driving a step motor of a quartz clock. The semiconductor electronic circuit comprises a nonvolatile memory integrated circuit.

In other words, the external electrically connecting terminal-use metal electrode is formed so as to have a thick film of not less than 2 $\mu$m, which provides a semiconductor integrated circuit having the external electrically connecting terminal-use metal electrode in which the stress applied to the semiconductor integrated circuit at the time of the implementation of the bonded wire can be reduced.

The external electrically connecting terminal-use metal electrode is constructed according to the above-mentioned construction, thereby distributing the stress at the time of the implementation, which is capable of providing a semiconductor integrated circuit of high reliability, having the external electrically connecting terminal-use metal electrode on the elecronic circuit which does not change the characteristic of the circuit.

In a semiconductor integrated circuit comprising a plurality of pad electrodes to which a signal is inputted from an external portion, a plurality of protecting circuits connected to the pad electrodes, respectively, for discharging an eddy-current generating due to the signal inputted from the pad electrode, and an internal circuit for processing the external portion signal from the external portion inputted through a plurality of the pad electrodes and a plurality of the protecting circuits; another circuit element is interposed between at least one out of a plurality of the pad electrodes and the protecting circuit corresponding to the pad electrode. In a semiconductor integrated circuit device comprising a plurality of pad electrodes to which a signal is inputted from an external portion, a plurality of protecting circuits connected to the pad electrodes, respectively, for discharging an eddy-current generating due to the signal inputted from the pad electrode, and an internal circuit for processing the external portion signal inputted from the external portion through a plurality of the pad electrodes and a plurality of the protecting circuits; at least two out of a plurality of the protecting circuits are arranged as one or more blocks. Further, an interconnection connecting the pad electrode and the protecting circuit is arranged on a portion of a surface of the internal circuit through an insulating film.

In other words, the protecting circuit and the pad electrode are separated from each other, thereby laying out the protecting circuit freely, which groups a plurality of the protecting circuits into a block to provide the semiconductor integrated circuit device in which the area of the protecting circuits is small.

In a semiconductor integrated circuit device having bump electrodes and dummy bump electrodes; the dummy bump electrodes are arranged on an electronic circuit, then an area of the dummy bump electrode is greater than that of the bump electrode. An area of the dummy bump electrode is less than that of the bump electrode, and the dummy bump electrodes are arranged in a matrix-like manner. Further, dummy electrode has one or more gaps.

In a semiconductor integrated circuit device having bump electrodes and dummy bump electrodes; the dummy bump electrodes are arranged on an electronic circuit, and the dummy bump electrodes are arranged on a periphery of a semiconductor substrate.

In other words, the dummy bumps are disposed on the semiconductor integrated circuit so as to be, irrespective of whether the diffusion region or the interconnection region, superposed on a part of, or all of it.

(12) In a method of manufacturing a semiconductor integrated circuit comprising the steps of forming a plurality of transistors on a surface of a semiconductor region of a wafer, metal-interconnecting electrodes of the transistors, forming a protecting film on the metal interconnection, and cutting the wafer along a scribe region of the water; the wafer cutting step comprises a first cutting step and a second cutting step, and a cutting speed in the first cutting step is less than that in the cutting step.

(13) There is provided a method of manufacturing a semiconductor integrated circuit described in (12), characterized in that the cutting in the first cutting step is carried out by a chemical means. (13) There is provided a method of manufacturing a semiconductor integrated circuit described in (12), a surface of the semiconductor region is cut more deeply than the transistor at the first cutting process. (14) There is provided a method of manufacturing a semiconductor integrated circuit described in (12), a surface of the semiconductor region is cut in a V-like form at the first cutting process. (15) There is provided a method of manufacturing a semiconductor integrated circuit described in (12), an average width of the semiconductor region cut at the first cutting process is made greater than that of the semiconductor region cut at the second cutting process.

In a semiconductor integrated circuit having an electronic circuit on a surface of a first conductive type semiconductor region of a substrate, the substrate being separated into chips by scribe; a stepped region is disposed on the substrate along a scribed surface on a side surface of the chip. The stepped region is deeper than a second conductive type diffusion region constituting the electronic circuit. Further, an external electrically connecting terminal is disposed on a transistor constituting the electronic circuit.

In a semiconductor integrated circuit having a plurality of field effect transistors disposed on a surface of a substrate so as to separated electrically by a separation region, and an external connecting terminal laminated on a part out of a plurality of the field effect transistors; a shield electrode is disposed on the separation region below the external connecting terminal. Also, the external connecting terminal comprises a bump electrode. Further, in a semiconductor integrated circuit having a plurality of field effect transistors disposed on a surface of a substrate so as to be separated electrically by a separation region, and an external connecting terminal laminated on a part out of a plurality of the field effect transistors; an inversion preventing high density impurity region is disposed at an intermediate location of the separation region below the external connecting terminal. Further, in a semiconductor integrated circuit having a plurality of field effect transistors disposed on a surface of a substrate so as to be separated electrically by a separation region, and an external connecting terminal laminated on a part out of a plurality of the field effect transistors, there is included a separation construction in which the separation region below the external connecting terminal and the separation region below a portion except the external connecting terminal.

In an electronic circuit comprising a printed circuit board in which a metal interconnection is disposed on a surface of an insulating substrate, and a semiconductor integrated circuit in which an external connecting terminal is electrically connected to the metal interconnection on a surface of the printed circuit substrate; the external connecting terminal is disposed on active element region of the semiconductor integrated circuit. The external connecting terminal comprises a bump electrode. In a method of manufacturing a semiconductor integrated circuit, comprising the steps of working an integrated circuit on a surface of a semiconductor wafer, forming a protecting film on a surface of the integrated circuit, perforating a portion of the protecting film to form a pad possession as an external connecting terminal region, forming a solder bump electrode on the pad portion, and scribing the semiconductor electrode to be made into a chip, spaying a resin flux cored solder on a surface of the solder bump electrode located on a surface of the chip, adhering the chip to the printed circuit board to be implemented, in a face down manner at a predetermined location at which the solder bump electrode and a metal interconnection of the printed circuit board are superposed to each other, heating the chip from a rear surface of the chip, and forming a shielding film on a surface of the chip. The chip heating step comprises a step of applying a heated wind to the rear surface of the chip.

As described above, a portion of the transistor and the pad region as the output terminal can be superposed in two dimensions, which has an effect to reduce the area of the chip to reduce the manufacturing cost. Also, the distance between the gate electrode of the transistor and the contact hole of the drain region can be increased, which has an effect to reduce the electrostatic withstand voltage.

Further, even in the metal interconnection comprising one layer, the area of the external electrically connecting terminal-use metal electrode is made small, thereby superposing the metal interconnecting layer on a lower surface of the external electrically connecting terminal-use solder bump electrode or the gold bump electrode, which is capable of providing the semiconductor integrated circuit device in which the chip size is small.

Moreover, the light is shielded by the barrier metal even in the metal interconnection comprising one layer, so that the semiconductor never fail to function properly.

The bump electrode is constructed by one or a combination of the above constructions, thereby distributing the stress at the time of the implementation of the device, which is capable of providing a semiconductor integrated circuit of high reliability, having the bump electrode on the elecronic circuit which does not change the characteristic of the circuit.

Besides, in the semiconductor integrated circuit device constructed as above, the dummy bumps are arranged freely, thereby reducing the size of the semiconductor integrated circuit device.

In the semiconductor integrated circuit constructed as above, the crystal defect in the vicinity of the scribed surface induced by scribing is hard to be caused up to the diffusion region. Accordingly, the distance between the scribed surface and the diffusion region in two dimensions can be reduced.

BRIEF DESCRIPTION OF THE DRAWINGS

FIG. 13($a$) is a plan view of an output pad portion of a semiconductor integrated circuit according to the present invention, and FIG. 13($b$) is a sectional view taken along the line 13($b$)—13($b$) of FIG. 13($a$).

FIG. 15 is a plan view of a semiconductor integrated circuit according to the present invention.

FIG. 16($a$) is a plan view of an output pad portion of a semiconductor integrated circuit according to the present invention, and FIG. 16($b$) is a sectional view taken along the line 16($b$)—16($b$of FIG. 16($a$).

DETAILED DESCRIPTION OF PREFERRED EMBODIMENTS

The invention will now be described in detail with reference to the drawings showing an embodiment thereof.

Figure 1:
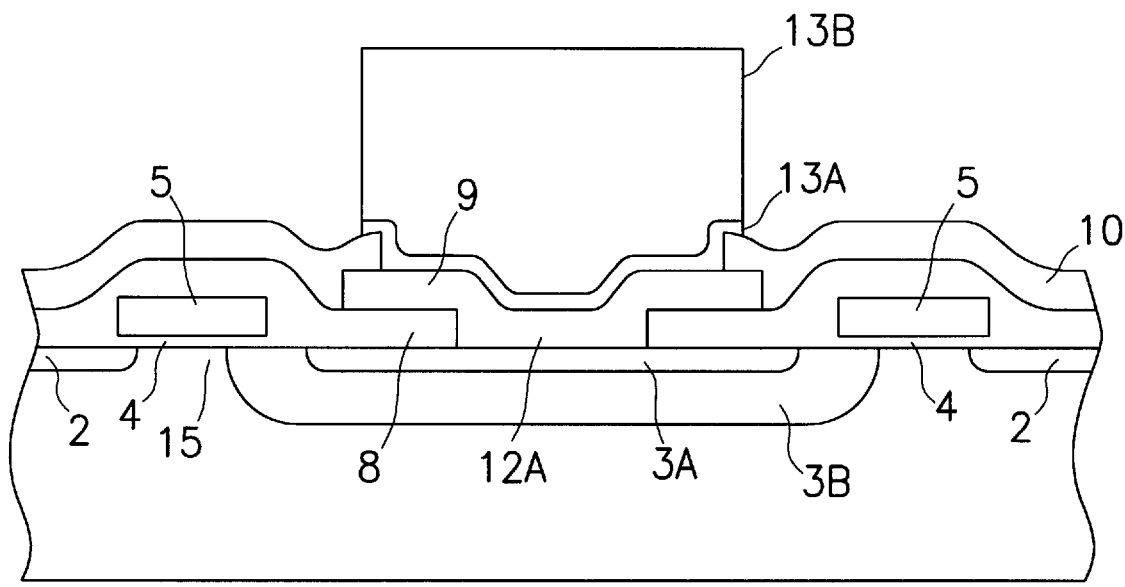
FIG. 1 is a sectional view of an output portion of a semiconductor device according to the present invention.
Figure 2:
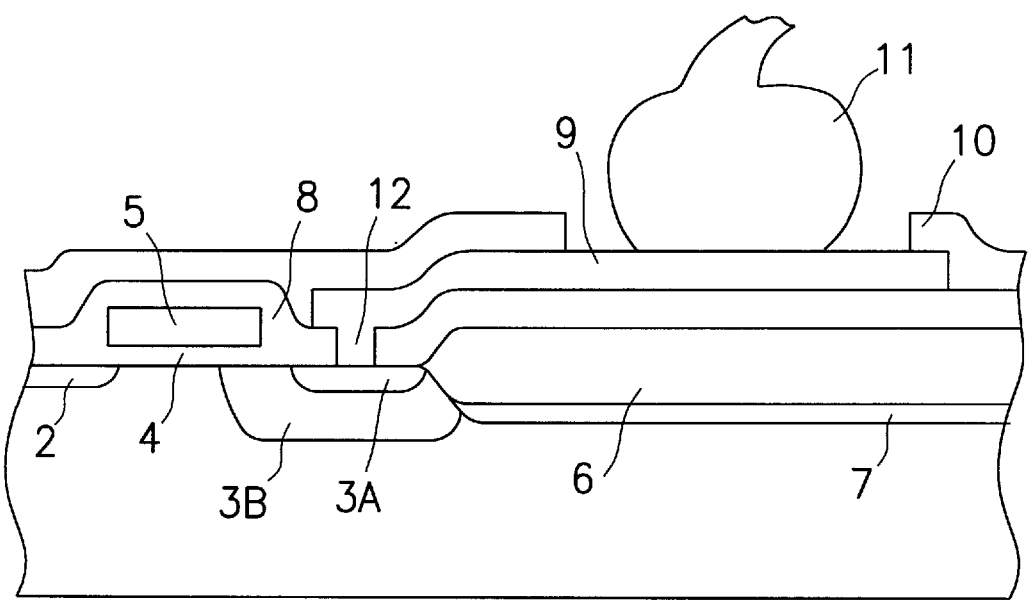
FIG. 2 is a sectional view of an output portion of a conventional semiconductor device.
Figure 3:
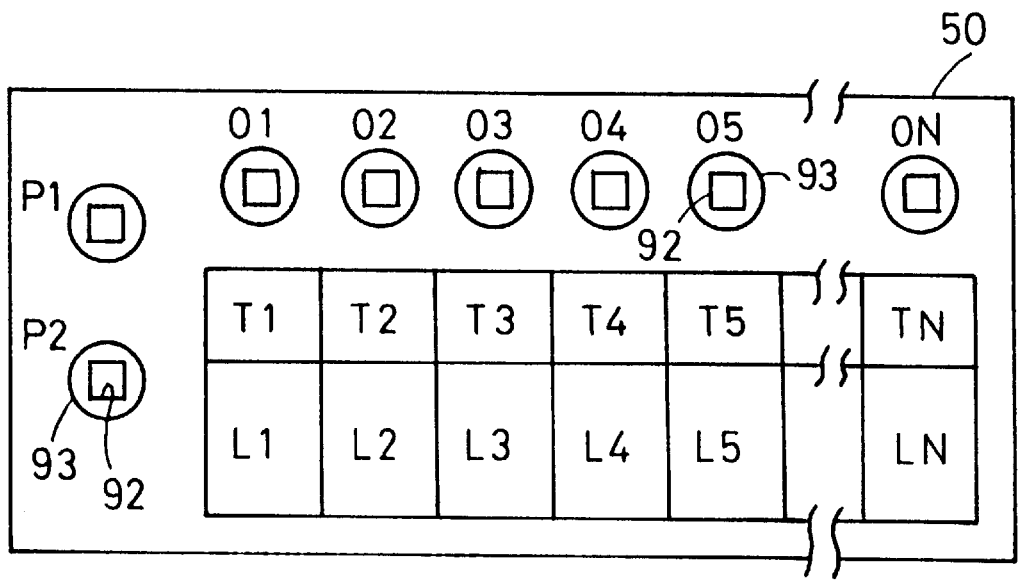
FIG. 3 is a plan view of a conventional semiconductor device.

FIG. 1 is a sectional view of an output portion of a semiconductor device for a thermal head according to the present invention. The transistor for applying an electric current to a thermo-sensitive resistor is comprised of a source region 2 as an $N^+$ type impurity region, disposed on a surface of a P type semiconductor region 1, a first drain region 3B as an $N^-$ type impurity region, disposed away from the source region 2 through a channel forming region 15, a second drain region 3A as an $N^+$ type impurity region, disposed inside a surface of the first drain region 3B, and a gate electrode 5 disposed on a surface of a channel forming region 15 through a gate insulating film 4. An intermediate film 8 is disposed on the gate electrode 5. An aluminum interconnection is patterned on the intermediate insulating film 8. A separation region comprised of a field insulating film and a field dope region disposed on the surface of the semiconductor region 1 below the field insulating layer causes a separation between the transistors, like the conventional manner.

As shown in FIG. 1, an output aluminum pad region 9 is disposed on the second drain region 3A through the intermediate insulating film 3 and a contact hole 12A. An external electrically connecting terminal B is disposed on a perforation pattern of a final protecting film 10 in the pad region.

The embodiment of FIG. 1 has a plating-grown bump 13B made of an alloy including tin and lead disposed on the aluminum pattern for the pad through a chromium film 13A. The bump 13B is of a column-like construction having a height not less than ten times of a film thickness of the aluminum interconnection. The aluminum pad region 9 has a film thickness of about 1 μm, so that the bump is not less than 10 μm in height. In FIG. 1, the transistors are arranged symmetrically on both sides of the external electrically connecting terminal.

The drain region and the pad are constructed as shown in FIG. 1, so that the contact hole 12A can be arranged away from the gate electrode 5 in two dimensions. In the semiconductor device according to the present invention, the drain region 3A of the transistor is connected directly to the output pad, which is a problem related to a withstand electrostatic voltage. However, the above construction according to the present invention makes longer a distance between the gate electrode 5 and the contact hole 12A, which distance raises the withstand electrostatic voltage. That is, the semiconductor device according to the present invention is so constructed as to be capable of raising the withstand electrostatic voltage.

Accordingly, the gate insulating film 4 can be now made thinner down to 100 to 250 Å, which was once difficult.

In the semiconductor device of FIG. 1, the external electrically connecting terminal is constructed by the plating-grown bump, so that the mechanical stress to the substrate 1 of the semiconductor device is remarkably small. A pad region can be superposed on the drain region 3A in two dimensions.

Figure 5:
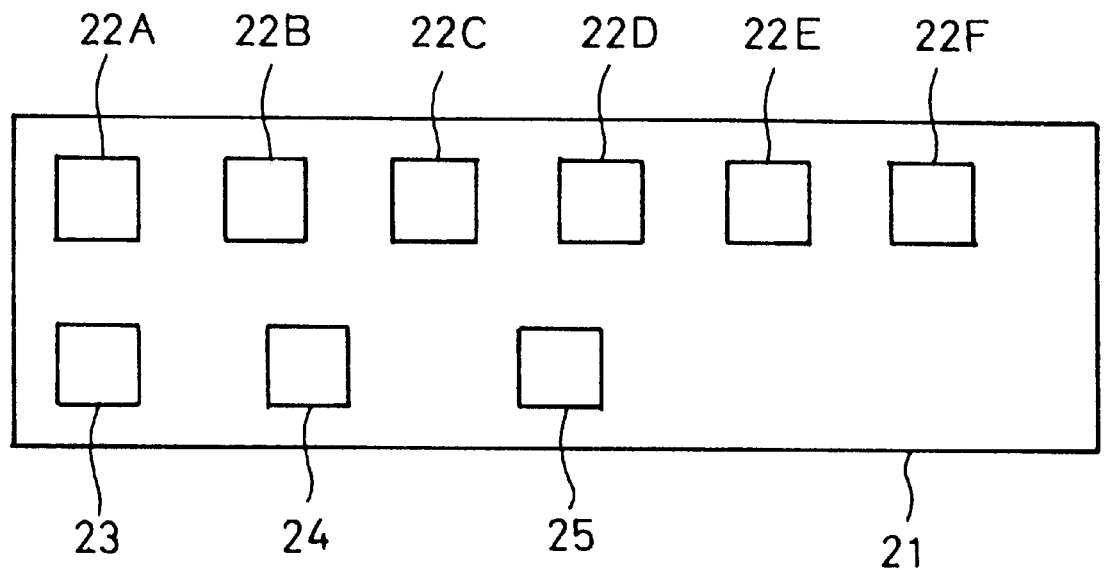
FIG. 5 is a plan view of a semiconductor device according to the present invention.

FIG. 5 is a plan view showing a pad arrangement of the semiconductor device according to the present invention. A plurality of output pads 22A to 22F are disposed along a longitudinal direction of a chip. Power source pads 23, 24 and a printing input terminal 25 are disposed on another region. As shown in FIG. 5, in the case of the semiconductor device for the thermal head, the area rate of the external electrically connecting terminal to the chip is not less than 20%, which is remarkably large. Accordingly, the chip area can be made smaller by partially superposing the pad region on the drain region of the transistor in two dimensions as shown in FIG. 1.

Figure 6:
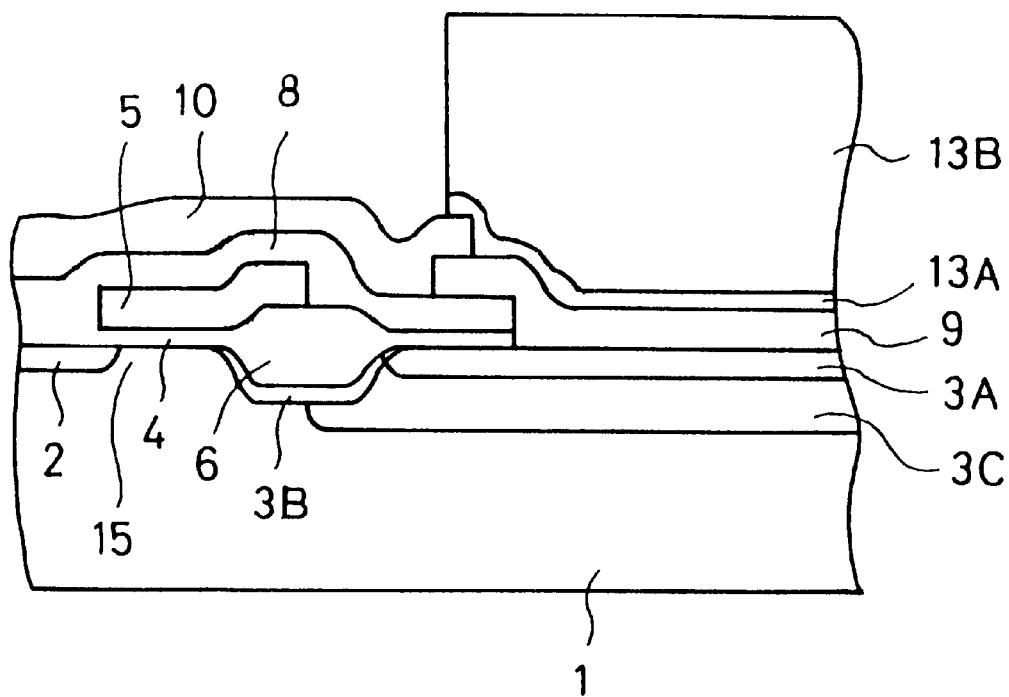
FIG. 6 is a sectional view of an output portion of a semiconductor device according to another embodiment of the present invention.

FIG. 6 is a sectional view of a semiconductor device according to another embodiment of the present invention.

A field insulating film 6 and a first drain region 3B as an N⁻ type impurity region disposed below the field insulating film 6 are disposed between a channel forming region 15 and a second drain region 3A as a N⁻ type impurity region, thereby forming a high withstand voltage construction. A third drain region 3C as an N⁻ type impurity region is formed on a deep position so as to be superposed on the first drain region 3B and the second drain region 3A. The third drain region 3C is formed in a diffusion region sufficiently deeper than the first and second drain regions. The diffusion depth of the third drain region 3C is 1 to 5 μm. which generally serves as an N⁻ well of a P type insulating gate field effect transistor disposed on the surface of the same semiconductor region. Pad regions 13A, 13B are arranged on the deep diffusion region 3C as shown in FIG. 6, thereby preventing the electrical deterioration of the semiconductor due to stresses caused when the semiconductor is implemented on or electrically connected to another electric circuit. Also, as seen from FIGS. 1 and 4, the tall column-like bump serves as a stress relieving means at the time of the implementation.

There is explained in FIG. 6 such a case that the external electrically connecting terminal is constructed by the bump, but it may be formed by a bonded terminal as before.

Figure 7:
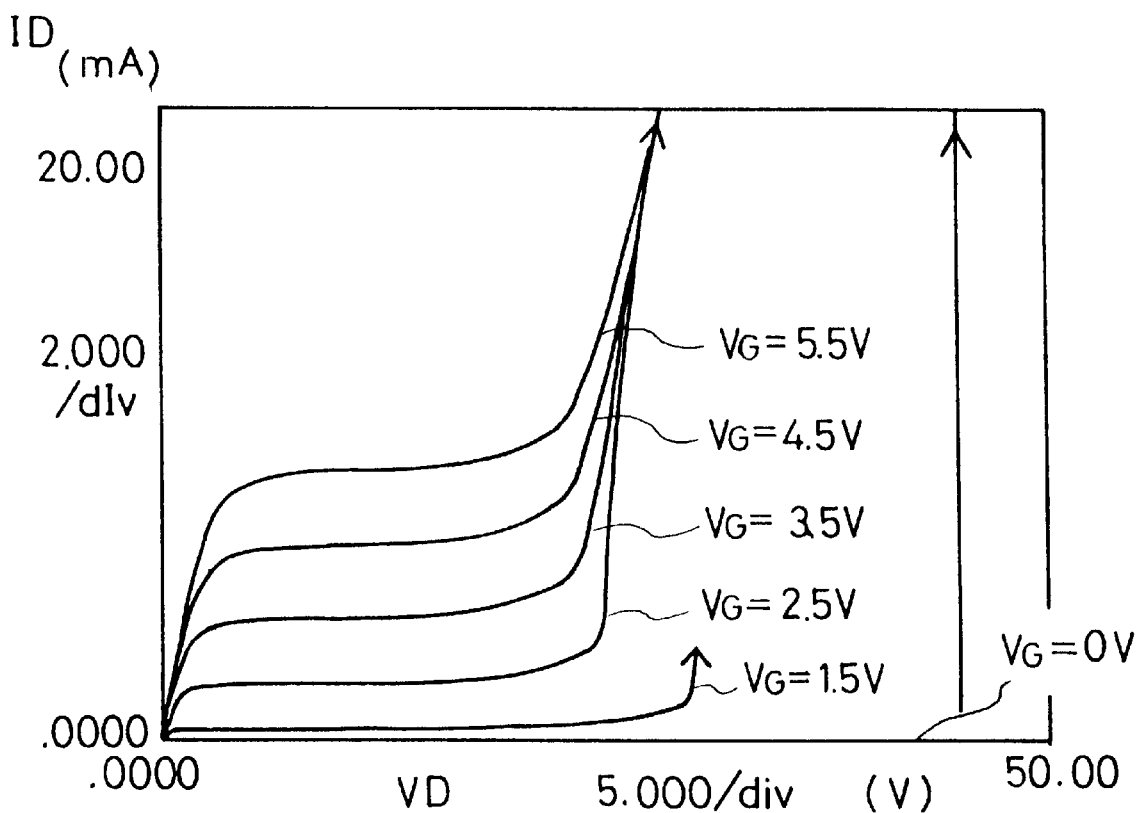
FIG. 7 is an electrical characteristic diagram of the semi conductor device according to the present invention.

FIG. 7 is an electrical characteristic diagram of a high withstand voltage insulating gate field effect transistor used for a semiconductor integrated circuit of the present invention. When VG=0 V, a high voltage not less than 30 V is applied to the drain region, so that the drain withstand voltage corresponding to a case of VG=0 V is set to about 45 V greater than 30 V. In a case where an electric source voltage of 5 V is applied to the gate electrode, the channel forming region is reversed and the semiconductor device according to the present invention becomes an ON state, and the drain withstand voltage decreases down to about 22 V. When the semiconductor device is on the ON state, only a voltage less than 1 V is applied to the drain region. In the semiconductor device according to the present invention, the withstand voltage required on the ON state is set to a value lower than 30 V which is the maximum voltage out of the voltage applied to a driver integrated circuit. The resistance per unit area of the semiconductor device which is on the ON state can be decreased by making the withstand voltage required on the ON state lower than the maximum applied voltage.

The following means are specifically used in order to decrease the withstand voltage required on the ON state:
(1) to make the length of the channel not greater than 2.5 μm;
(2) to thin the film of the gate insulating film down to 50 to 250 Å;
(3) to form the resistor between the source region and the substrate-electrode region by arranging the P+ region as an electrode of the channel forming region away from the source region; and
(4) to arrange a low density drain region for a high withstand voltage as a field dope region disposed below the selected oxidized region.

Figure 8:
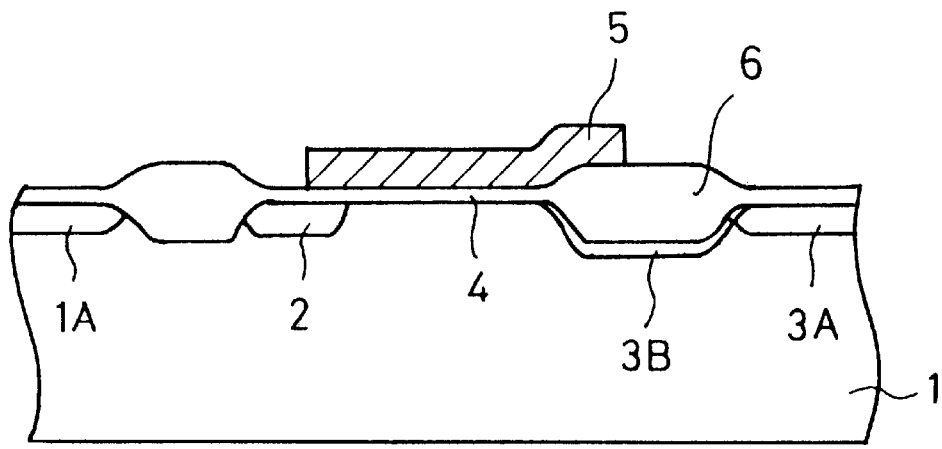
FIG. 8 is a sectional view of a semiconductor device according to the present invention.

FIG. 8 is a sectional view, taken along the channel direction, of the high withstand voltage insulating gate field effect transistor which is used for the semiconductor integrated circuit of the present invention. An N⁺ type source region 2 and a drain region 3B are formed away from each other on the surface of a P type substrate 1. The drain region is comprised of a low density drain region 3B and a high density drain region 3A. The low density drain region 3B is disposed between a channel forming region below a gate insulating film 4 and the high density drain region 3A. The gate electrode 5 is disposed on the gate insulating film 4. The low density drain region 3B is disposed, as a field dope region, below a field insulating film 6 having a film thickness of about 5,000 to 10,000 Å in the embodiment of FIG. 8. A P⁺ type impurity region 1A for applying a potential to the substrate 1 is disposed away from the source region 2.

There is employed in the semiconductor device of the present invention shown in FIG. 8 a snap back phenomenon for lowering the drain withstand voltage required on the ON state down to 30 V which is the maximum drain applied voltage. That is, the length of the channel is made shorter than 2.5 μm, thereby raising the electric current amplitude factor of an NTN conjunction transistor comprised of a source region, a channel forming region and a drain region. Further, the film thickness of the gate insulating film is made 150 to 200 Å in order to generate much the electric current on the substrate as a trigger for the snap back phenomenon, thereby increasing the field intensity along the channel direction. When the electric current on the substrate is generated, a substrate electrode 1A and the source region 2 are formed away from each other in order to facilitate the bipolar operation, thereby providing the resistance value therebetween.

Figure 9:
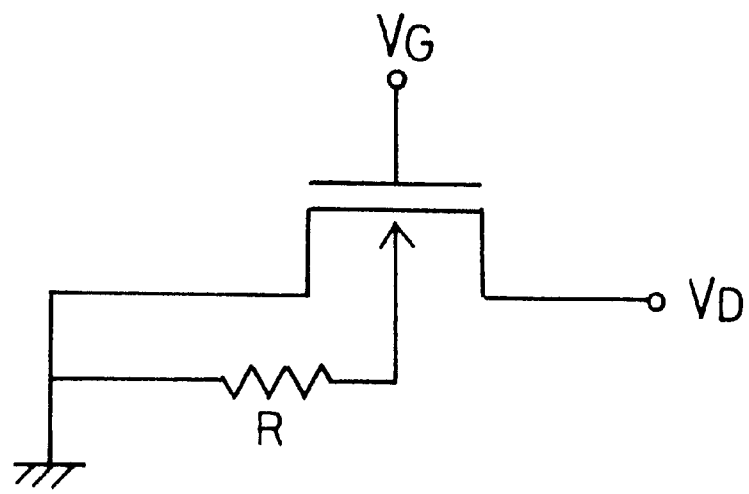
FIG. 9 is an electric equivalent circuit diagram of the semiconductor device according to the present invention.

FIG. 9 is an electric equivalent circuit diagram of the semiconductor device of the present invention for the case where the resistor is provided between the source region and the substrate electrode. The resistance value R is remarkably small simply if the source region and the substrate electrode 1A are disposed away from each other in three dimensions as shown in FIG. 8. The contact size of the substrate electrode 1A may be made small in order to increase the resistance value R. A diffused resistor may be disposed on a surface of the substrate in order to increase the resistance value R.

Figure 10:
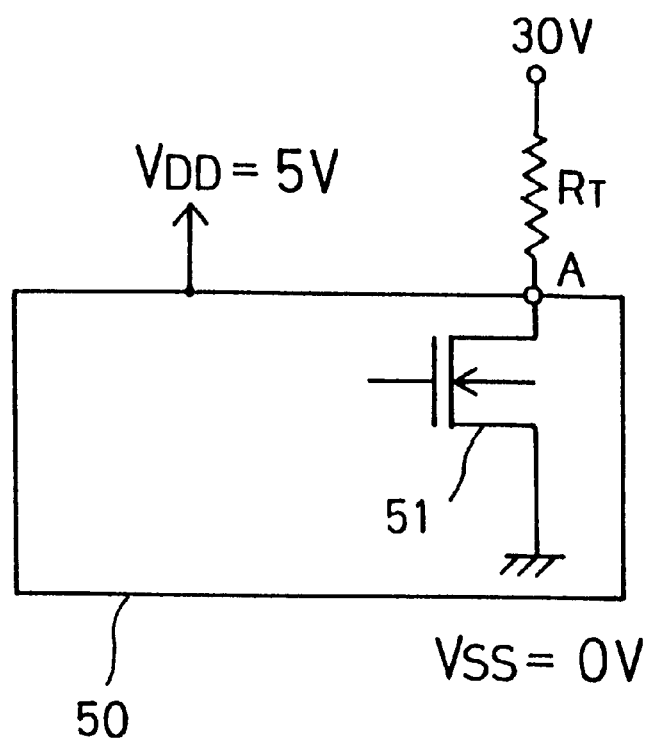
FIG. 10 is an electric circuit diagram of a thermal head integrated circuit which uses the semiconductor device according to the present invention.

There is shown in FIG. 10 a circuit diagram in which the semiconductor device of the present invention is applied to a thermal head. A heating resistor RT is disposed between a high power source 30 V and a high withstand transistor 51 of the present invention. A source region of the high withstand voltage transistor 51 is earthed to an electric source $V_{ss}$. The electric current applied to the heating resistor RT can be controlled by applying the voltage to the gate electrode of the high withstand voltage transistor 51.

An integrated circuit 50 including the high withstand voltage transistor of the present invention includes a digital circuit for controlling a gate voltage to a gate electrode, and then is operated by a power source voltage VDD (5V at present, 3 V or 1.5 V in the future). The integrated circuit 50 is electrically connected to the heating resistor RT disposed on the external portion, through a pad led from the drain region of the high withstand voltage transistor 51. In the thermal head driver integrated circuit shown in FIG. 10 (designated by Reference symbol A), a static electricity is applied to a drain electrode of the high withstand voltage transistor from the external portion through the pad. The thermal head driver integrated circuit has an open drain construction which is not an output of a CMOS, thereby easily become weak against the static electricity. The semiconductor device of the present invention, since a drain withstand voltage required when the transistor for the driver is on an ON state is made low, is so constructed that the static electricity generated when the static electricity is applied is easy to be discharged to the VSS, which realizes an integrated circuit resistant to the static electricity.

Figure 11:
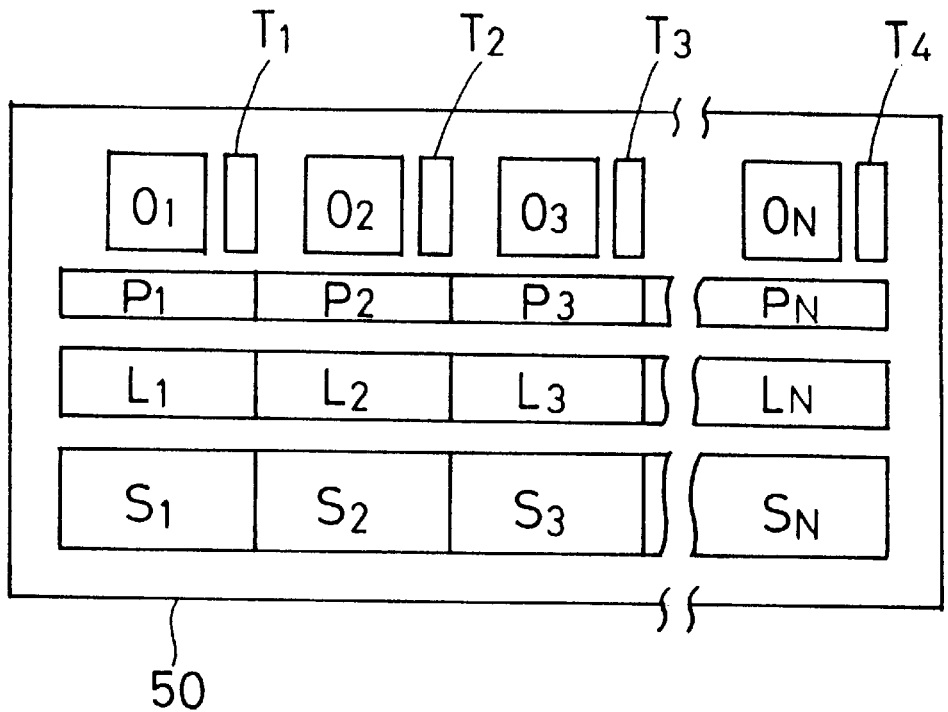
FIG. 11 is a plan view of a semiconductor integrated circuit according to the present invention.

FIG. 11 is a plan view of a resistor driving integrated circuit for executing a printing on a thermo-sensitive paper by the use of the Joule heat of the resistor. On a thermal head driving integrated circuit chip 50 are arranged, in series along a long side of the chip 50, output pads O1, O2, . . . , ON corresponding to the thermal resistors, to which high withstand voltage driving transistors T1, T2, . . . , TN shown in FIG. 7 are electrically connected in an open drain construction form, respectively. The potentials of the gate electrodes of the respective transistors T1, T2, . . . , TN are controlled by preamplifier circuits P1, P2, . . . , PN. The respective preamplifier circuits P1, P2, . . . , PN are controlled based on the data of the corresponding latch circuits L1, L2, . . . , LN. To the respective latch circuits are added the data by flip-flop circuits S1, S2, . . . , SN. The data of the output pad O1 is controlled to be determined by the flip-flop circuit S1, the latch circuit L1 to which is inputted the output of the flip-flop circuit S1, the preamplifier P1 to which is inputted the output of the latch circuit L1, and the high withstand voltage transistor T1 driven by the preamplifier circuit P1. Respective N of shift registers, the latch circuits and preamplifiers are arranged in the longitudinal direction of the chip 50 while corresponding to the output pad. The respective high withstand voltage transistors T1, T2, . . . , Tn are arranged on the sides of the corresponding output pads. The area equivalent to that for the flip-flop circuits is usually required in order to apply an electric current of not less than 5 mA as a driving current. In the present invention, the high withstand voltage transistor can be made high in driving capability, and therefore can be arranged away from one another and on the sides of the output pads as shown in FIG. 11. As a result, the length of a short side of the chip can be shortened by about 30%, and therefore the cost of the integrated circuit can be reduced by 30%.

Figure 12:
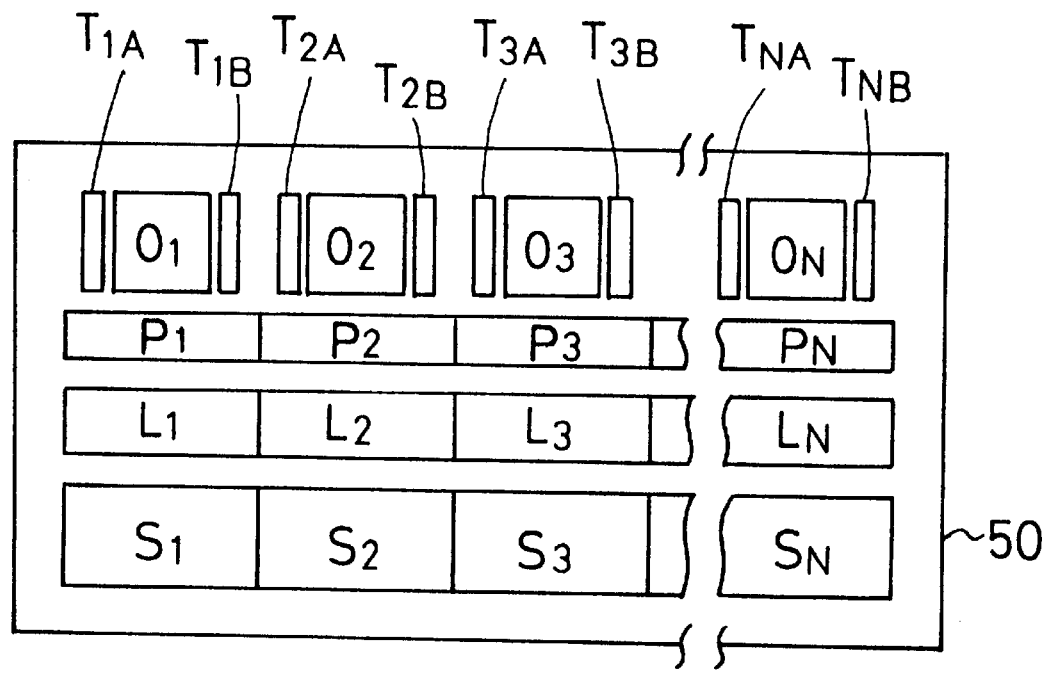
FIG. 12 is a plan view of a semiconductor integrated circuit according to the present invention.

FIG. 12 is a plan view of the semiconductor integrated circuit according to the present invention in which high withstand voltage transistors are arranged on the both sides of the corresponding output pads, respectively. For example, in the case of the output pads O2, transistors T1A and T1B are arranged on the both sides of the output pads in the longitudinal direction of the chip 50. The gate electrodes of the transistors T1A and T1B are driven by the preamplifier P1, and therefore the sum of the electric currents of the transistors T1A. and T2B are outputted to the output pad O1. The transistors T1A and T1B are arranged in a linesymmetrical manner with respect to a center of the output pad. There is caused a variation of an electric current according to the layout direction of the transistors in the case of the high withstand voltage transistor in which the source region and the drain region are arranged asymmetrically as shown in FIG. 7.

As shown in FIG. 12, the transistors T1A and T2a are arranged in the direction which is different from that of the output pads, and the sum of the electric current of the respective transistors is outputted, thereby being capable of making small the variation of the sum of the electric current.

FIG. 13(a) is a plan view of the periphery of the output pads of the semiconductor integrated circuit according to the present invention, and FIG. 13(b) is a sectional view of the same. The output pad is comprised of an aluminum film 103 used as an interconnection of the integrated circuit, and a plating-formed bump 103A disposed thereon. On the aluminum film 103 except the pad region is disposed a plasma silicone nitride film 109 as a final protecting film.

The bump 103A is disposed on the aluminum film 103 through a metal, such as chromium, for plating-forming. The aluminum film of the pad region is usually of a large pattern of 50 to 100 $\mu$m. When the integrated circuit is tested, the large area is required for frobing the bump. In the case of the integrated circuit according to the present invention, as shown in FIGS. 13(a) and 13(b), the pattern of the aluminum film of the pad region is directly extended to be electrically connected to a drain region 105 of a high withstand voltage insulating gate field effective transistor (hereinafter referred to as the HVMISFET). The pattern of the aluminum film is extended constantly up to a contact hole 105A of the drain region 105.

The magnitude of the electric current of the HVMISFET is proportional to a width W of the channel which is a passage of the electric current. The width W of the channel each extends along the periphery of the pad region, that is, at least two sides thereof in order to increase the electric current driving capability of the transistor. In the embodiment of FIG. 13, the T1 and T2 are laid out linesymmetrically with respect to the center of the pad region as the HVMISFET. The facsimile-use thermal head driving integrated circuit requires the driving capability of applying the large electric current of not less than 5 mA to the thermal resistors. A plurality of the printing thermal resistors are disposed in close vicinity to one another in series along the thermal-sensitive paper. Accordingly, the HVMISFETs for applying the electric current of not less than 5 mA are connected to the plurality of the thermal resistors arranged in series. The number of the output pads is not less than 50 per one integrated circuit, which is remarkably high.

The drain region of the HVMISFET, in order to raise the drain withstand voltage, is comprised of an N type high density drain region 5 and a N type low density drain region 121. The source region 104, being not applied with the high withstand voltage, is therefore made of an N type impurity region of high density. A gate insulating film 106 is made of a thin insulating film of 100 to 250 Å in order to enlarge the channel conductance, which is usually made of a silicone oxide film, or a silicone film. A gate electrode 108 for controlling the channel conductance is disposed on the gate insulating film 106. There are disposed on the HVMISFET a source region and a drain region and which are asymmetrical with the gate electrode 8. Accordingly, the electric current flowing through the transistor is apt to undergo an influence related to the positioning deviation caused during the photographing process at the time of manufacturing the same. However, the sum of the electrical currents of the transistors T1 and T2 can be made hard to undergo the influence related to the positioning deviation caused during the photographing process by arranging them on the both sides of the pad region in a line-symmetrical manner in two dimensions.

The withstand voltage of an N type low density drain region 121 to a P type silicone substrate 101 is higher than the electric source voltage. There are an OFF withstand voltage obtained when the transistor is turned off, and an ON withstand voltage obtained when the transistor is turned on, as the drain withstand voltage.

The OFF withstand voltage is set to a value not less than 4 times of the electric source voltage in the case of a facsimile-use integrated circuit, which value usually falls within a rage between 20 to 50 V. The high density drain region 5 is provided for carrying out the ohmic contact to the aluminum film 104 through the contact hole 105A. As aluminum film 103 of a pad region 103B is exposed to a final protecting film 109. A bump 103A is plating-grown up to the thickness of not less than 10 μm. The thick bump relieves the stress added to the integrated circuit at the time of the testing and the implementation, which reduces the stress added to the integrated circuit to arrange the transistors closer to the pad region than before. In FIG. 13, the aluminum film of the pad region 103B is disposed on a substrate 101 through a field oxide film 7 and an intermediate insulating film 107A. The intermediate insulating film 107A is disposed between the gate electrode 108 and the aluminum film 103. In the case of the semiconductor integrated circuit according to the present invention, the bump has an effect to relieve the stress to the integrated circuit at the time of the implementation. Accordingly, the aluminum film 103 of the pad region 103B can be directly arranged on the drain region without the thick insulating film 107.

Figure 14A:
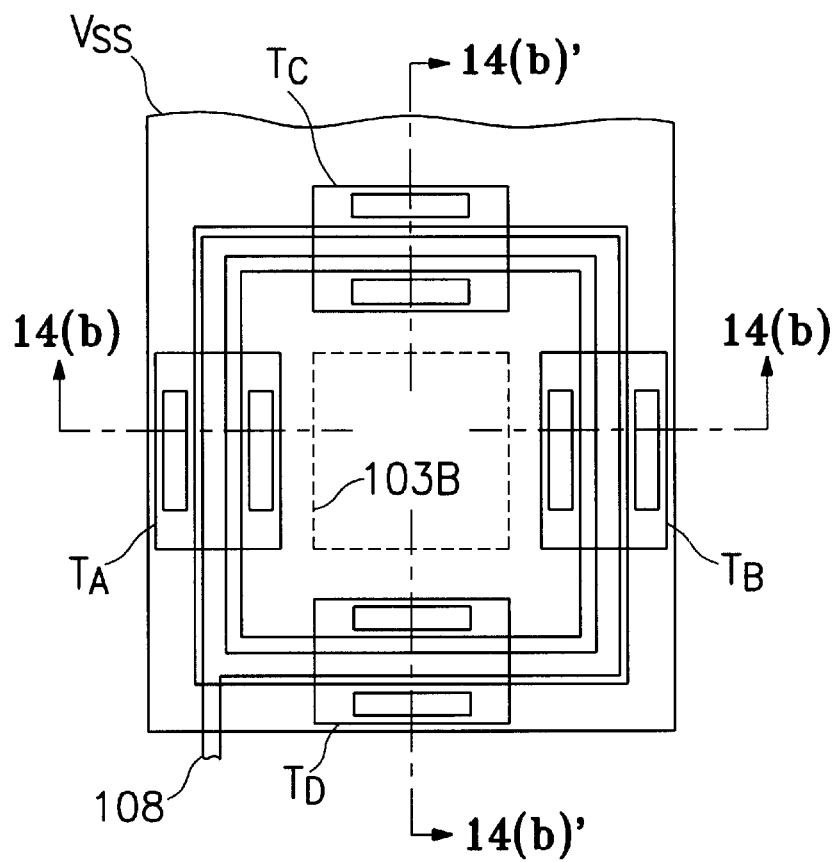
FIG. 14($a$) is a plan view of an output pad portion of a semiconductor integrated circuit according to another embodiment of the present invention, and FIG. 14($b$) is a sectional view taken along the lines 14($b$)—14($b$), or 14($b$)—14($b$), of FIG. 14($a$).
Figure 14B:
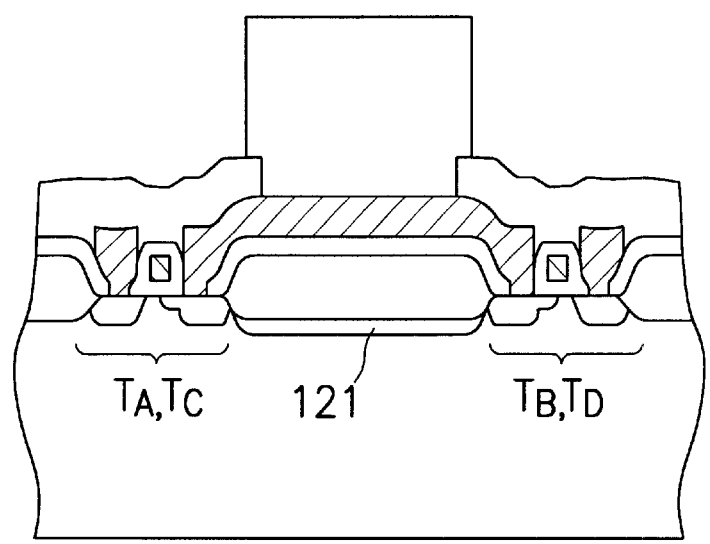

FIG. 14(*a*) is a plan view of the periphery of the pad region of the semiconductor integrated circuit according to the present invention, and FIG. 14(*b*) is a sectional view taking along the line 14(*b*)—14(*b*), or 14(*b'*)—14(*b'*), of FIG. 14(*a*). The HVMISFET is arranged along four sides of the pad region 103B. The aluminum film of the pad region 103B has a contour comprised of at least four sides. The HVMISFETs are arranged on four sides of the pad region 103B in two dimensions. The respective transistors are laid out symmetrically with respect to a center of the pad region 103B. The carrier electrons which cause the channel electric current of the respective transistors to flow from the source region to the drain region, that is, from the source region toward the pad region.

FIG. 15 is a plan view of a semiconductor integrated circuit 40. Output pads 41, 42, 43, 44, 45, 46, 47, 48 are arranged linearly along the longitudinal direction of the chip 40 in a staggered manner. In the embodiment of FIG. 15, the output pads 41, 43, 45, 47 are arranged in one row in the longitudinal direction of the chip 40, while the output pads 42, 44, 46, 48 are similarly arranged in one row. The staggered arrangement shown in FIG. 15 is called the two stage staggered arrangement. Although not illustrated, more one row of the output pad is added thereto to thereby realize three stage staggered arrangement, which is capable of decreasing the length of the chip. Further, the present invention can be realized by simply arranging the output pads without arranging them in a staggered manner as shown in FIG. 15. The potentials of the gate electrodes of the HVMISFETs connected to the respective output pads are controlled by a logic circuit 49. There is shown in FIG. 5 an embodiment in which the gate electrodes of the HVMISFETs connected to the external output pads 41, 43, 45, 47 are interconnected to the logic circuit, in a case where the source region is served commonly to the adjacent the HVMISFETs and the output pads are laid out in a staggered manner as shown in FIG. 13. That is, the gate electrode 108 is arranged under the inner output pads 42, 44, 46, 47 so as to overlap therewith. FIG. 16(*a*) is a plan view of a portion of an inner output pad on which the gate electrode 8 is interconnected, and FIG. 16(*b*) is a sectional view taken along with the line 16(*b*)—16(*b*) of FIG. 16(*a*). The HVMISFETs are disposed along four sides of the output pad therearound as shown in FIG. 14. This enables the interconnection 108 of the gate electrode to be interconnected without crossing the transistor by interconnecting diagonally with respect to the output pad. The interconnection 108 of the gate electrode is usually made of polycrystal silicone film. As shown in FIG. 16(*b*), the interconnection 108, being disposed below the aluminum film 103, is therefore so constructed as to be protected for the stress exerted by the bump 103A.

Figure 17:
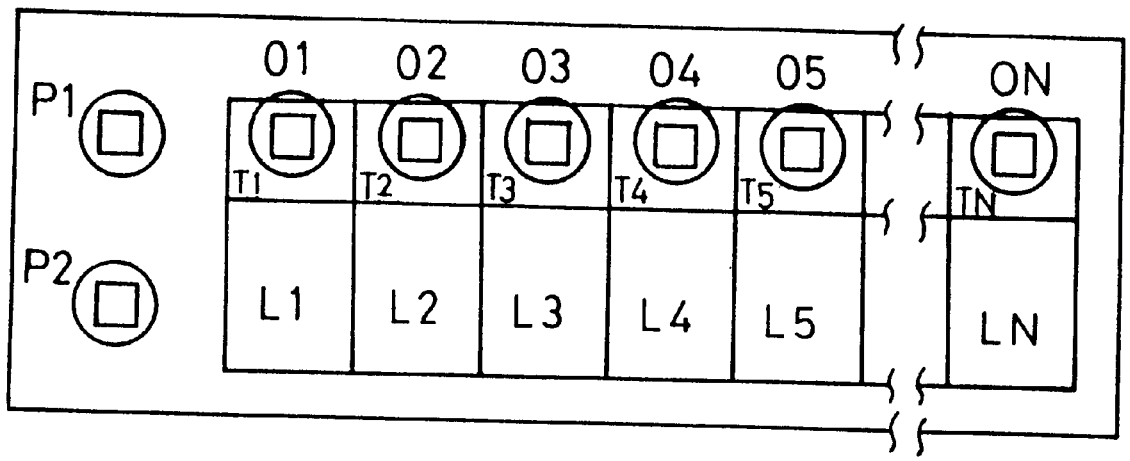
FIG. 17 is a plan view of a semiconductor device according to the present invention.

FIG. 17 is a plan view of the integrated circuit in which the semiconductor integrated circuit according to the present invention is applied to a thermal head-use integrated circuit. There are arranged cycle-periodically in the longitudinal direction of the chip output pads O1, O2, . . . , ON as external leading terminals for applying the electric current of about 10 mA to the thermal sensitive resistor disposed outside the chip. For example, in the case of N=144, the length of the chip is not less than 1 cm when the distance between the output pads is 100 μm. Similarly, electrode terminals P1, P2, a clock terminal (not shown) and a print input signal terminal (not shown) and the like as outside leading terminals except the output pad are arranged on the periphery of the chip 50. A high withstand voltage driving insulating gate field effect transistor of open drain construction (hereinafter referred to as the MISFET) T1, T2, . . . , TN are electrically connected to each of the output pads between the grand wiring thereof. Accordingly, the output pads are identical in cycle-period with the driving MISFETS. The gate electrodes of the driving MISFETs are controlled by logic circuits L1, L2, . . . , LN comprised of the preamplifier circuit, the latch circuit and the flip-lop circuit.

Similarly, the logic circuits are arranged along the longitudinal direction of the chip 10 periodically with the same pitch of the output pads. In the thermal head-use thermal head driver integrated circuit according to the present invention, the output pads are arranged on the driving transistors. The width of the chip can be thinned down to the area of the driving transistor and the logic circuit. The inventor's design realizes 0.3 mm of the width of the chip, accordingly the cost is reduced by over 30% than before, because of conventionally 0.45 mm. Particularly, the thermal head-use thermal head driver integrated circuit in which a number of the output pads are arranged repeatedly has an large cost reducing effect, since the area of the pad occupies about 30%.

In FIG. 17, the output pads are arranged on the driving transistor, but, the similar effect can be obtained if they are arranged on the logic circuits.

Figure 18:
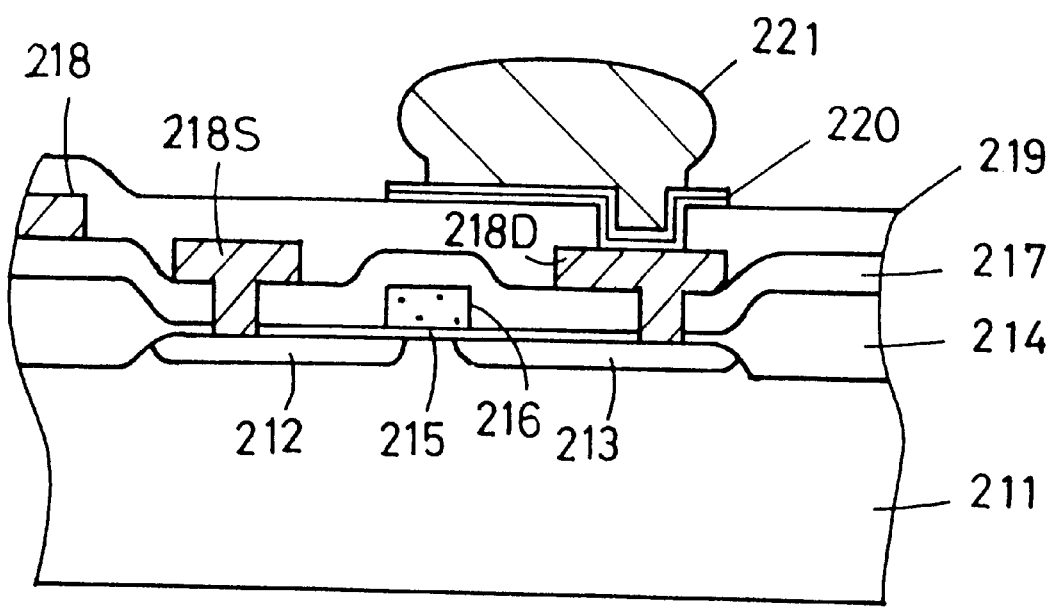
FIG. 18 is a sectional view of the vicinity of an output pad of a semiconductor device according to the present invention.

FIG. 18 is a sectional view of the vicinity of the output pad of the semiconductor integrated circuit of FIG. 17. The driving MISFET is formed on a surface of the P type silicone substrate 211 constituting the substrate. That is, the MISFET is arranged inside a field insulating film 214, and constituted by an N type source region 212 and a drain region 213 disposed away from each other on a surface of the substrate 201, and a gate electrode 216 disposed through a gate insulating film 215 on a surface of a substrate 211 between the source region 212 and the drain region 213. The gate electrode 216 is usually is made of a conductive film including a polysilicon film. On the drain region 213 are disposed a contact hole on an intermediate insulating film (an insulating separation film between an aluminum interconnection and a conductive film of the gate electrode), and a drain electrode 218D electrically connected to the drain region 213 so as to be embedded in the contact hole. The drain electrode 218D is generally made of an aluminum film which is the same as that of an interconnection 218. A silicon nitride film 219 as the final protecting film is disposed on the aluminum film. The silicone nitride film 219 in a region of the outside leading terminal is perforated as shown in FIG. 18. In the perforated pad portion is disposed a bump electrode 221 through a barrier metal 220. The barrier metal 220 is usually of a two layer construction. The lower layer film prevents the upper layer film from penetrating to the aluminum film 218D, and the upper layer film is made of a metal which is suitable for forming the bump. For example, when the bump 221 is formed by solder (Sn—Pb)-plating, a chromium (Cr) film is used as the lower layer film and a copper(Cu) film is used as the upper layer film.

As shown in FIG. 18, the output pad 221 of a bump construction is arranged on the driving transistor so as to be superposed thereon. Since the driving transistor and the output pad are superposed in two dimensions, the chip can be reduced in area.

Figure 19:
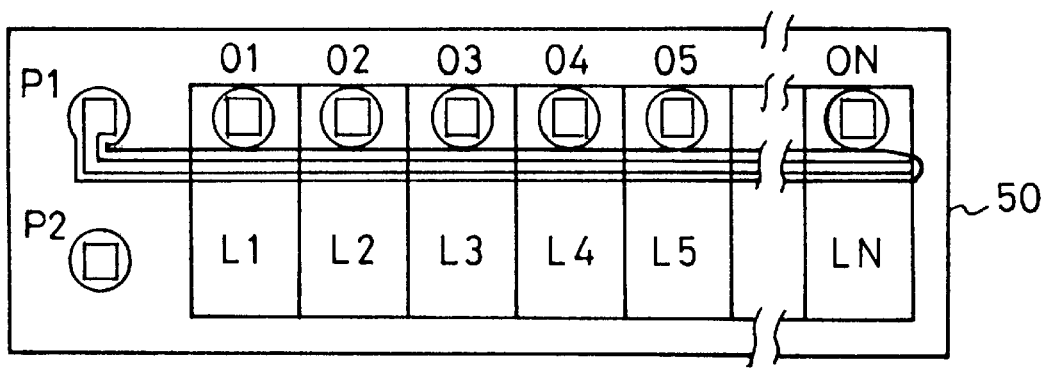
FIG. 19 is a plan view of a semiconductor device according to another embodiment of the present invention.

FIG. 19 shows another embodiment of the semiconductor device according to the present invention. FIG. 19 is a plan view of the integrated circuit in which the present invention is applied to the thermal head-use integrated circuit. In FIG. 19, the source regions of the respective transistors are electrically connected through the barrier metal and the bump electrodes which are disposed on the protecting film silicone nitride film 219. FIG. 19 shows an example in which the source electrodes of the respective transistors and the electric source terminal can also electrically connected to one another directly by the barrier metal and the bump electrode. In the example of FIG. 19, the barrier metal and bump electrode serve as the function and operation as the interconnection except the function as the outside leading terminal. Accordingly, up to now, in the chip 50, the region in which the aluminum interconnection is located can be replaced by the metal of the barrier and the bump electrode. In particular, in the case of the thermal head-use integrated circuit in which the high electrical current of not less than 1 mA is applied from the respective output terminals without variation, the potential of the source regions of the respective transistors are required to be firmly fixed to the grand potential. In order to firmly fix the potential source region at the grand potential, the source electrodes of the respective driving transistors are usually connected through the aluminum interconnection having a width of several ten $\mu$m, therefore the wide width of the chip is made wide. Further, the barrier metal and the bump electrode on the protecting film are arranged as the interconnection as shown in FIG. 19, which reduces the width of the chip, that is, the area of the chip. In a case where the bump electrode is used as the interconnection, the width of the interconnection is preferably not less than the height of the bump. If the width of the bump is smaller, the mechanical strength is easily lower because the protecting film is not provided on the upper portion thereof.

Figure 20:
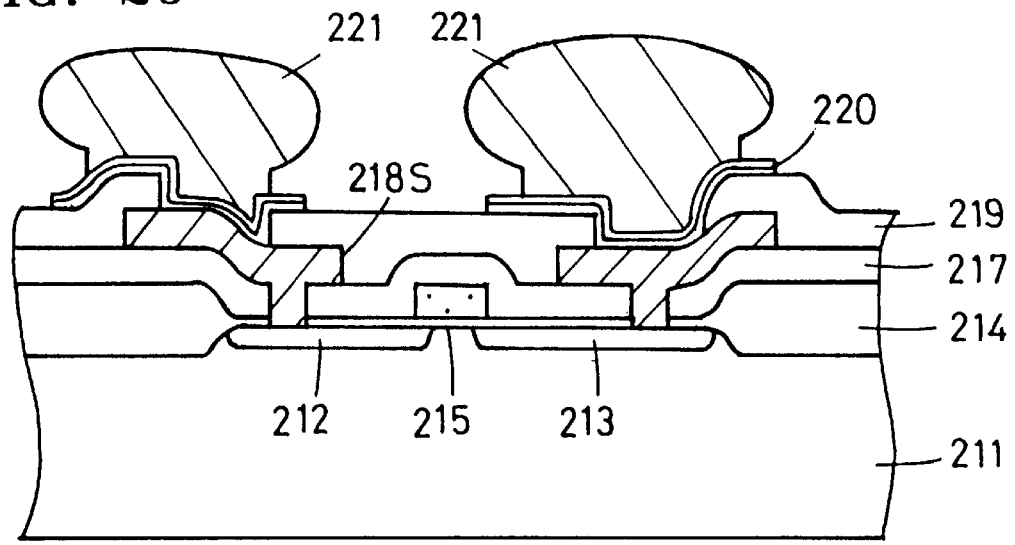
FIG. 20 is a sectional view of a semiconductor device according to another embodiment of the present invention.

FIG. 20 is a sectional view of the semiconductor device of FIG. 19 in the vicinity of the output pad. A source electrode 218S is disposed on the source region similarly to the drain region, and a barrier metal 220 and a bump electrode 221 are disposed thereon. The bump electrode is disposed on the drain region functions on an output pad. The bump electrode is disposed on the drain region functions as the interconnection for connecting electrically the respective source electrodes. Accordingly, when the integrated circuit shown in FIG. 20 is flip-chip-implemented on another substrate to be implemented in a phase down manner, the corresponding electrodes of the substrate to be implemented may not be disposed on the bump electrode on the source electrode. The corresponding electrodes to the substrate to be implemented are necessarily disposed on the bump electrode of the drain electrode. Further, there is shown in FIG. 21 an example which facilitates the barrier metal on the source electrode to function as the interconnection.

Figure 21:
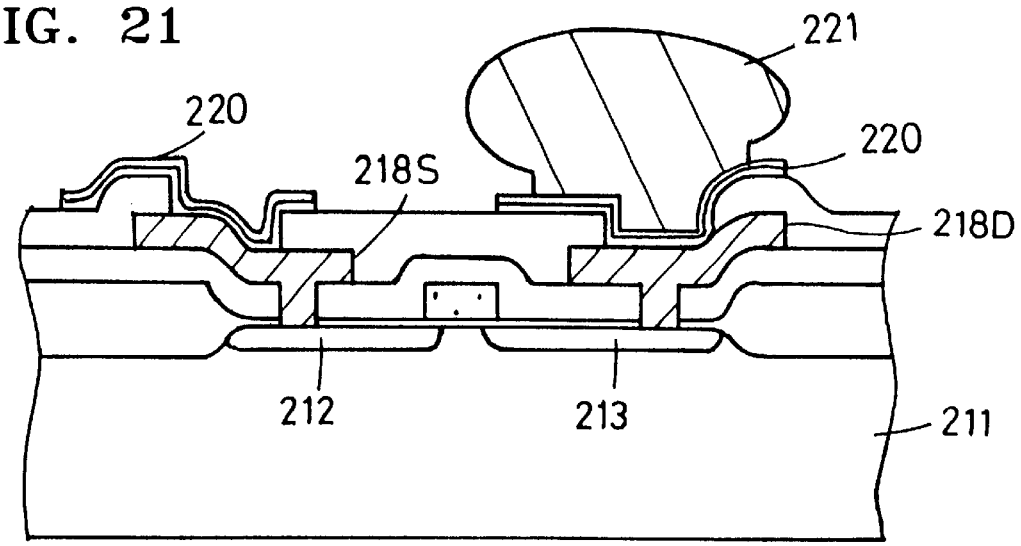
FIG. 21 is a sectional view of a semiconductor device according to another embodiment of the present invention.

FIG. 21 is a sectional view of an output driving transistor similar to FIG. 20. There is only the barrier metal 220 but not bump electrode 21 on the source electrode 218S. No bump electrode 221 is preferably disposed thereon in order to realize the function as the interconnection. When the substrate to be implemented and the integrated circuit are mechanically and electrically connected to each other in a case where the bump electrode 221 is formed by solder, the heating treatment of about 150° C. is carried out. At that time, there is a case that the solder is liquefied which brings about inclination of the bump electrode. However, the source electrodes of the respective driving transistors are electrically connected only through the barrier metals as shown in FIG. 21, so that there can be obtained the stable interconnection which is not changed in construction at the time of the heating treatment during the implementation. The bump electrode 221 is disposed only on the drain electrode 218D as the outside leading terminal. The construction having not the bump electrode on the source electrode 218S enables the patterning to be executed in such a manner that the width of the interconnection is thinned to a degree of the aluminum interconnection. The barrier metal is formed by sputtering and the like instead of the plating-growing, thereby realizing the interconnection, of a low resistance, having a film thickness of not greater than 20 $\mu$m, which makes the width of the interconnection not greater than 10 $\mu$m. Also, in a case where the substrate to be implemented is connected to the integrated circuit, the barrier metal on the source electrode 218S is constructed so as not to be mechanically connected to the substrate to be implemented, so that it functions as the constitutionally stable interconnection regardless of the stress from the substrate to be implemented.

Figure 22:
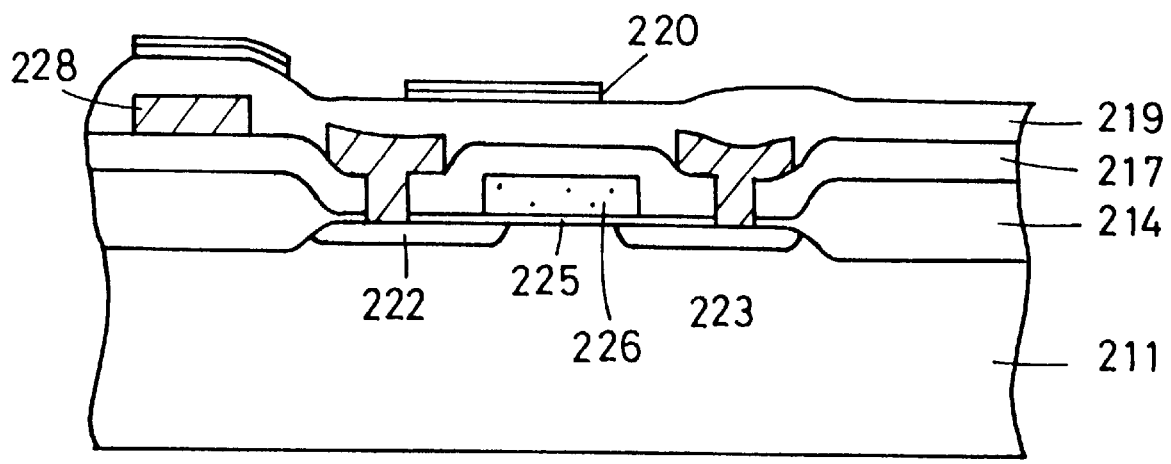
FIG. 22 is a sectional view of a semiconductor device according to another embodiment of the present invention.

FIG. 22 is a sectional view of the semiconductor device in which the interconnection of the barrier metal used in the device of FIG. 21 is also applied to the interconnection used for the logic. That is, an interconnection 220 made of a barrier metal is disposed on the MISFET used for the usual logic or the aluminum interconnection 228 through a silicone nitride film 219 as the protecting film. The construction shown in FIG. 22 adds the interconnection of the barrier metal, as the metal interconnection, to the usual aluminum interconnection, which results in decreasing of the area of the logic circuit itself.

Generally, in a case where the semiconductor integrated circuit device having the external electrically connecting terminal on the electrical circuit thereof is implemented on the external circuit, the electronic circuit, for example, the polysilicon resistor is disposed on the semiconductor substrate, the upper portion thereof is covered by the interlaminar film, the external electrically connecting terminal-use metal electrode is disposed thereon, and the bonded wire is connected thereto.

Otherwise, in a case where the semiconductor integrated circuit device having the external electrically connecting terminal on the electrical circuit thereof is implemented on the external circuit, the electronic circuit, for example, the polysilicon resistor is disposed on the semiconductor substrate, the upper portion thereof is covered by the interlaminar film, the external electrically connecting terminal-use metal electrode is disposed. The external electrically connecting terminal-use solder bump electrode and the gold bump electrode are disposed on the metal electrode through barrier metal to thereby be connected to the external electrode.

Figure 23A:
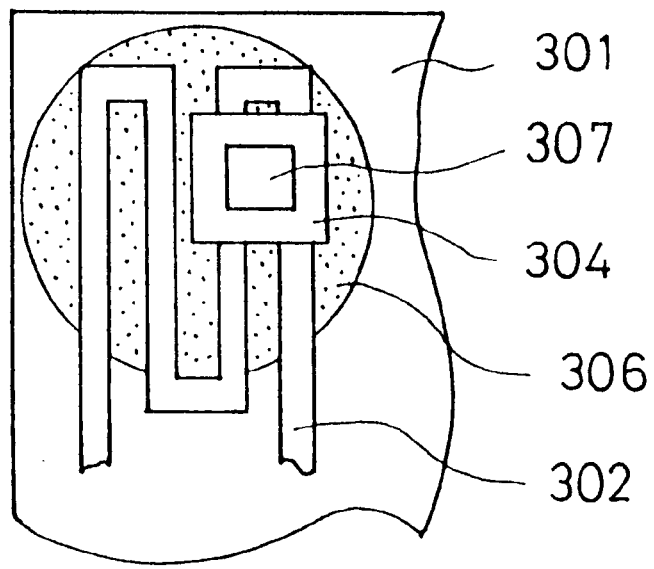
FIG. 23($a$) is a plan view of a semiconductor integrated circuit device according to one embodiment of the present invention, and FIG. 23($b$) is a sectional view of a semiconductor integrated circuit device according to the present invention, showing a state at the time of the implementation.
Figure 23B:
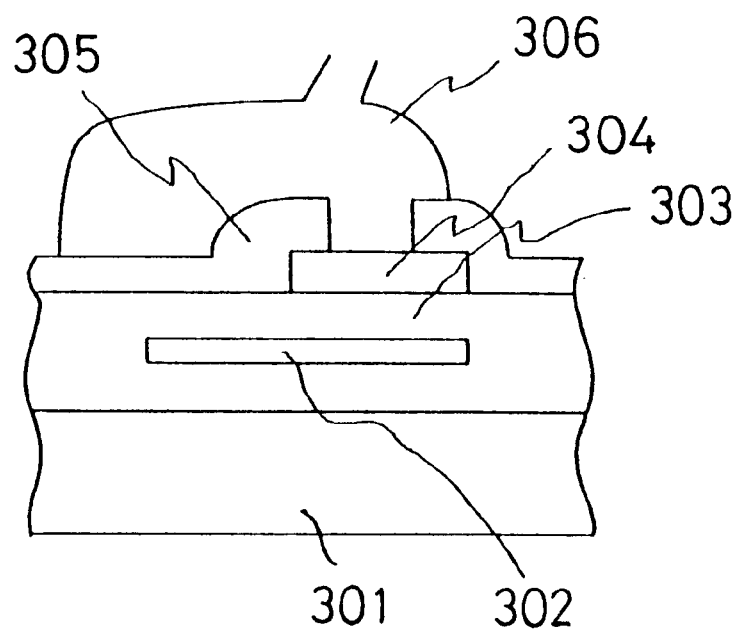

FIG. 23($a$) is a plan view of an external electrically connecting terminal electrode portion of a semiconductor integrated circuit device according to one embodiment of the present invention. An electrical circuit, for example, a polysilicon resistor 302 is disposed on a semiconductor substrate 301, on the polysilicon resistor 302 through an interlaminar film 303 is superposed an external electrically connecting terminal-use metal electrode 304, on a portion of which a passivation film 305 having an opening portion 307 is disposed. The interlaminar film 303 serves as a protecting film, and there is a case that the passivation film 305 having the opening portion 307. is not disposed on a portion of the external electrically connecting terminal-use metal electrode 304.

FIG. 23($b$) is a sectional view of an external electrically connecting terminal-use electrode portion of the semiconductor circuit device according to one embodiment of the present invention. An electrical circuit, for example, a polysilicon resistor 302 is disposed on the semiconductor substrate 301 of FIG. 23($b$), on the polysilicon resistor 302 through an interlaminar film 303 is superposed an external electrically connecting terminal-use metal electrode 304, on which a passivation film 305 having a passivation film opening portion 307 is disposed. The passivation film opening portion 307 has an area less than that of the external electrically connecting terminal-use metal electrode 304, specifically not greater than 900$\pi$ $\mu$m$^2$, and then is superposed on the external electrically connecting terminal-use metal electrode 304. The area of the passivation film opening portion 307 is preferably 200 to 600$\pi$ $\mu$m$^2$, further may be 1 to 200$\pi$ $\mu$m$^2$. Moreover, the wire bonding is executed on a region including the passivation film opening portion 307, then the bonded wire 306 is connected to an external terminal.

Figure 24A:
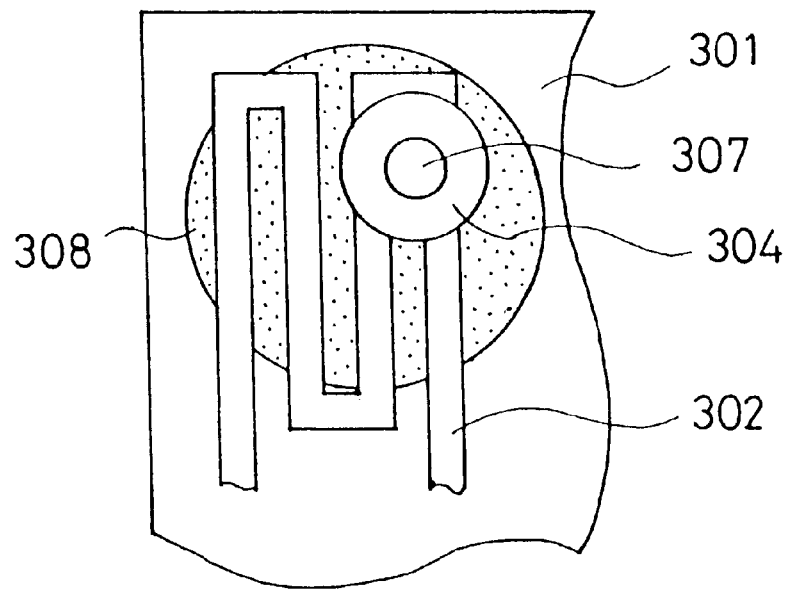
FIG. 24($a$) is a plan view of a semiconductor integrated circuit device according to one embodiment of the present invention, and FIG. 24($b$) is a sectional view of a semiconductor integrated circuit device according to the present invention, showing a state at the time of the implementation.
Figure 24B:
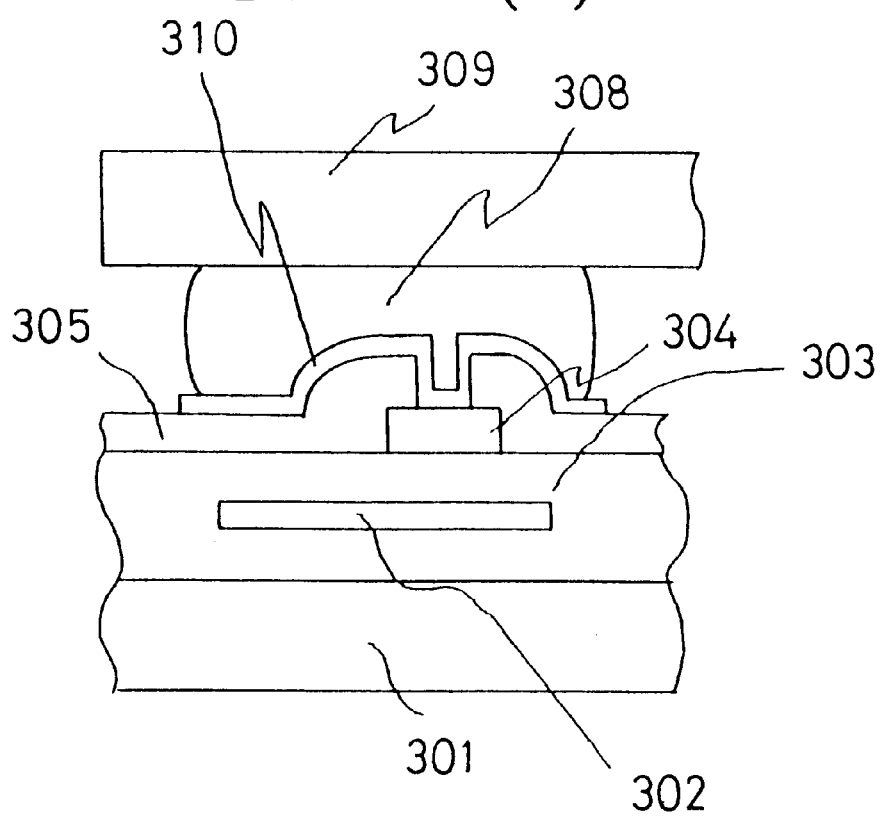

FIG. 24($a$) is a plan view of an external electrically connecting terminal electrode portion, on which a solder or gold bump is disposed on an electrode circuit, of the semiconductor integrated circuit device according to one embodiment of the present invention. An electrical circuit, for example, a polysilicon resistor 302 is disposed on a semiconductor substrate 301, on the polysilicon resistor 302 through an interlaminar film 303 is disposed an external electrically connecting terminal-use metal electrode 304, on a portion of which a solder or gold bump electrode 308 is disposed through a passivation film 305 having an opening portion 307. A barrier metal 310 is preferably disposed between the solder or gold bump electrode 308 and the passivation film 305 having the opening portion 307 on a portion of the external electrically connecting terminal-use metal electrode 304. The interlaminar film 303 serves as a protecting film, and there is a case that the passivation film 305 having the opening portion 307 is not disposed on a portion of the external electrically connecting terminal-use metal electrode 304.

FIG. 24($b$) is a sectional view of the semiconductor circuit device according to one embodiment of the present invention, in which a solder or gold bump is implemented thereto. An electrical circuit, for example, a polysilicon resistor 302 is disposed on a semiconductor substrate 301 of FIG. 24($b$), on the polysilicon 302 through an interlaminar film 303 is superposed an external electrically connecting terminal-use metal electrode 304, on which a passivation film 305 having a passivation film opening portion 307 is disposed. The passivation film opening portion 307 has an area less than that of the external electrically connecting terminal-use metal electrode 304, specifically not greater than 230$\pi$ $\mu$m$^2$, and then is superposed on the external electrically connecting terminal-use metal electrode 304. The area of the passivation film opening portion 307 is preferably 16 to 30$\pi$ $\mu$m$^2$, further may be 1 to 400$\pi$ $\mu$m$^2$.

Moreover, a solder or gold electrode 308 is disposed on a region including the passivation film opening portion 307 through the barrier metal, then connected to an external terminal electrode 309. The barrier metal is preferably made of a Cu compound, further may be made of the other materials for decreasing the contact resistance or improving the implementation strength.

Figure 25:
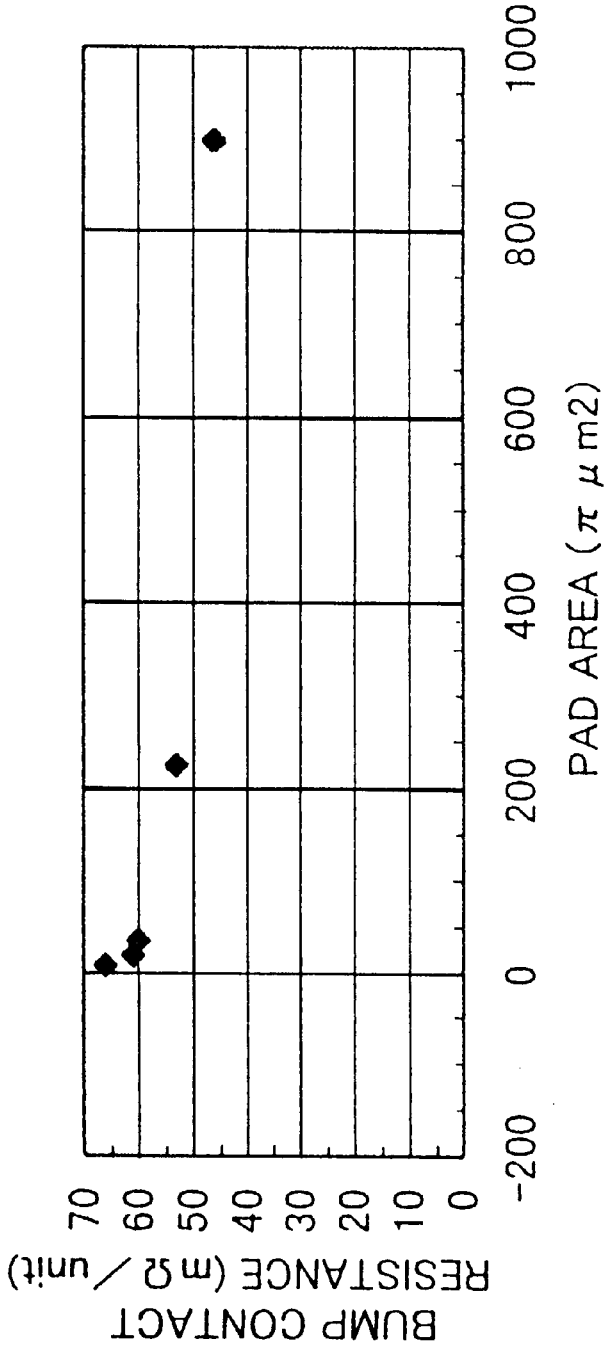
FIG. 25 is a characteristic diagram of the semiconductor integrated circuit device according to one embodiment of the present invention.

FIG. 25 is a characteristic diagram of the opening portion area and the contact resistance. The contact resistance is not remarkably changed in a range of down to not less than 50$\pi$ $\mu$m$^2$ of the area, but remarkably increases in a range of not greater than 50$\pi$ $\mu$m$^2$. This is because the contact resistance is apt to be affected by the manufacturing variation when the size of the passivation film opening portion 307 becomes smaller. If the manufacturing variation can be controlled to be low, the size of the passivation film opening portion 307 can be further reduced. However, it goes without saying that the size of the passivation film opening portion 307 is required to be investigated in view of the implementation strength Moreover, if the passivation film opening portion 307 is disposed on a portion except a center portion of the external electrically connecting terminal-use metal electrode 304, the region below the solder or gold bump electrode 308 is increased in degree of free, which is more effective.

Although not illustrated, a plurality of the passivation film opening portions 307 on the external electrical connecting-use metal electrode 304 can be provided so long as they are located at a region below the solder or gold bump electrode 308. On this occasion, since the area of the connecting region between one solder or gold bump electrode and the external electrically connecting terminal-use metal electrode 304 becomes large, the area of one of the passivation film opening portions 307 becomes small, then the degree of freedom of the region below the solder or gold bump electrode 308 increases more. For example, when there are provided two of the passivation film opening portions 307, the area of one of the passivation film opening portions 307 may be reduced to half to obtain the necessary characteristic.

The external electrically connecting terminal-use metal electrode 304 used in the above embodiment can be used as an interconnection layer of the semiconductor electronic circuit, further another metal layer can be used as an interconnection layer of the semiconductor electronic circuit.

In a general thermal head driver integrated circuit, output pads and electrode pads are arranged around a chip as an external leading electrode. The circuit on which transistors are integrated is arranged away from the external leading electrode in two dimensions. That is, the driving transistors are arranged so as to be connected to the output pads through the electrodes, respectively. The logic circuits for controlling the gate electrodes of the driving transistors are arranged cycle-periodically along the longitudinal direction of the chip. The bump is disposed, as the external leading electrode, on the perforation which is disposed on the final protecting film.

Figure 26:
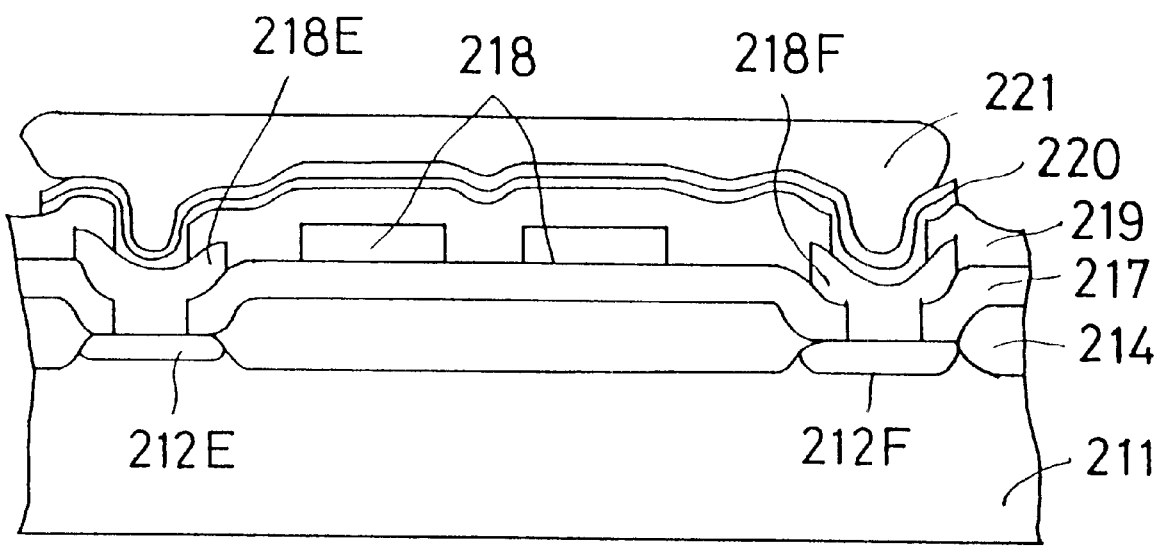
FIG. 26 is a sectional view of a semiconductor device according to the present invention.

FIG. 26 is a sectional view of the semiconductor of the present invention. N type diffusion regions 212E and 212F are disposed away from each other on the P type silicone substrate 201. A field insulating film 214 for constituting a separation region is formed on a surface of the silicone substrate 201. A field insulating film 214 for constituting the separation region is formed on a surface of the silicone substrate 201 between the diffusion regions. An intermediate insulating film 217 is formed on each of the diffusion regions 212E and 212F. A contact hole is arranged on the intermediate insulating film 217 located between the diffusion regions 212E and 212F, and a metal electrode such as aluminum is arranged on the contact hole. Aluminum interconnections 218 each of which is not directly connected to the electrode of the diffusion region are arranged on the separation region between the diffusion regions. A nitride silicone film 219 which is a final protecting film-is formed on the aluminum interconnection and the intermediate insulating film 217. The final protecting film 219 on the electrodes 218E and 218F of the diffusion regions is perforated at a process of forming pad regions. The barrier metal 220 is arranged so as to be connected to the electrodes 218E and 218F through the perforation of the protecting film. The barrier metal 220 is arranged so as to connect the electrodes 218E and 218F. The barrier metal 220 is made of a metal film having a two layer construction. The upper layer film is made of a metal which is easy to be subjected to soldering or gold-plating at the next process. For example, in the case of the solder plating, the metal is preferably of copper. The lower layer is made of a metal which prevents the upper layer metal from diffusing to the aluminum electrode.

For example, when the upper layer film is made of copper, the chromium film is used as the lower layer film, thereby preventing copper from diffusing to the aluminum electrode. The bump interconnection 221 made of solder or gold is plating-grown on the barrier metal 220 with the barrier metal 220 as a base. The diffusion regions 212E and 212F electrically connected to each other through the bump interconnection 221 through the aluminum electrodes. The metal interconnections of usual aluminum interconnections and the like can be arranged bellow the bump interconnection 221 through the protecting film 219. That is, due to the construction shown in FIG. 26, the interconnection layer can be increased by one layer as compared with before. FIG. 26 shows an embodiment in which the diffusion region and another diffusion region are electrically connected to each other through aluminum interconnections. Although not illustrated, the bump interconnection can be used for the simple electrical connection between the aluminum interconnections, which corresponds to a case in which the aluminum electrodes 218E and 218F are constructed as simple aluminum interconnections not electrodes on the diffusion regions in FIG. 26. Further, the diffusion region and the aluminum interconnection can be electrically connected to each other through the bump interconnection. Moreover, it goes without saying that at least one of the diffusion region and the aluminum interconnection can be electrically connected to the thin film such as a polycrystal silicone film through the bump interconnection.

Figure 27:
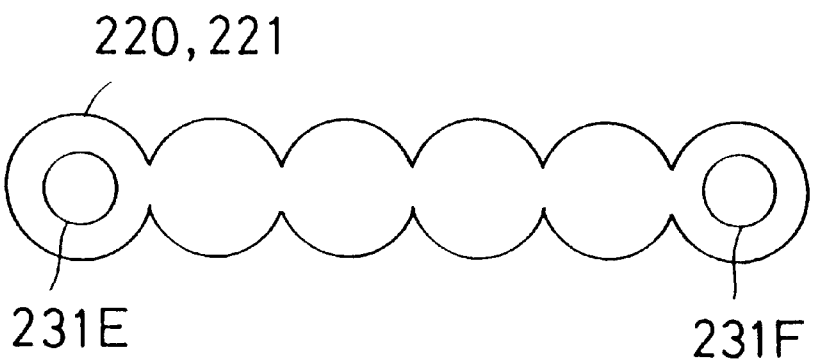
FIG. 27 is a plan view of a semiconductor device according to another embodiment of the present invention.

FIG. 27 is a plan view of the bump which is interconnected as shown in FIG. 26. A perforation region 231E of the protecting film on the diffusion region 212E and a perforation region 231F of the protecting film on the diffusion region 212F are electrically connected to each other through the bump interconnection 221. The two dimensional figure of the bump interconnection is patterned in such a manner that a plurality of circle patterns are connected in series. The pattern of the barrier metal 220 and the bump interconnection 221 shown in FIG. 27 prevents the uneven distribution of the bump caused due to the reflow of the bump.

Figure 28:
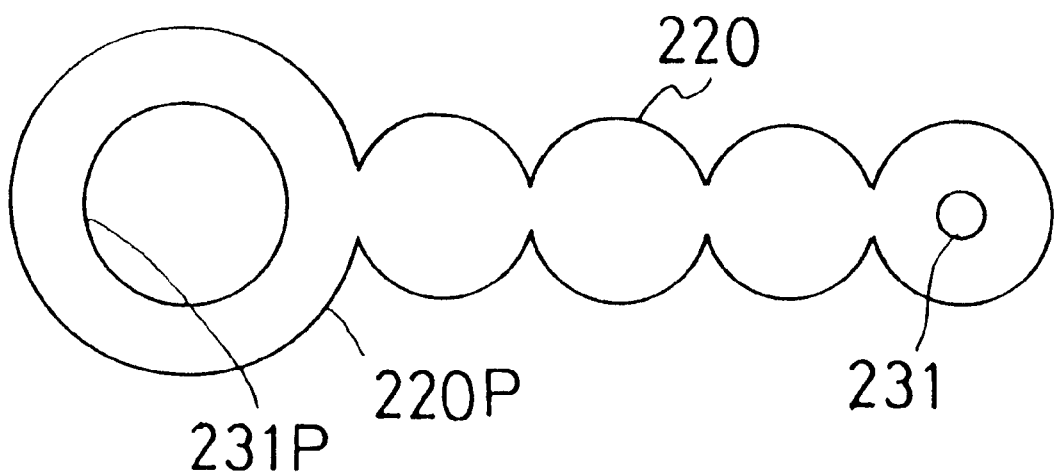
FIG. 28 is a plan view of a semiconductor device according to still another embodiment of the present invention.

FIG. 28 is a plan view of a bump interconnection in which one end portion 231P of the bump interconnection is an external electrically connecting terminal (hereinafter referred to as the pad region) and the other end portion 231 thereof is a diffusion electrode, or an aluminum interconnection, or a thin film electrode. The diameters of the perforation pattern 231P and the bump 220P of the protecting film of the pad region are designed/formed larger than the perforation pattern 231 and the bump 220 of the other protecting film. As to the size of the barrier metal bellow the bump also, the pad region is the largest. Accordingly, when forming the bump, the electric current for the plating-growth flows efficiently through the pad region. In other words., the bump becomes the highest in the pad region. The bump used for the interconnection is formed to be low since the barrier metal is small. Accordingly, as shown in FIG. 28, the barrier metal for the interconnection portion is made thin and the barrier metal for the bump region are made thick, which making small the variation of the volume of the bump at the interconnection portion and making small the variation of the height of the bump at the bump region due to the reflow of the bump. As shown in FIG. 28, there is realized a pattern in which the bump does not move in two dimensions at the time of the reflow of the bump, which further making small the variation of the height of the bump at the bump region.

Figure 4:
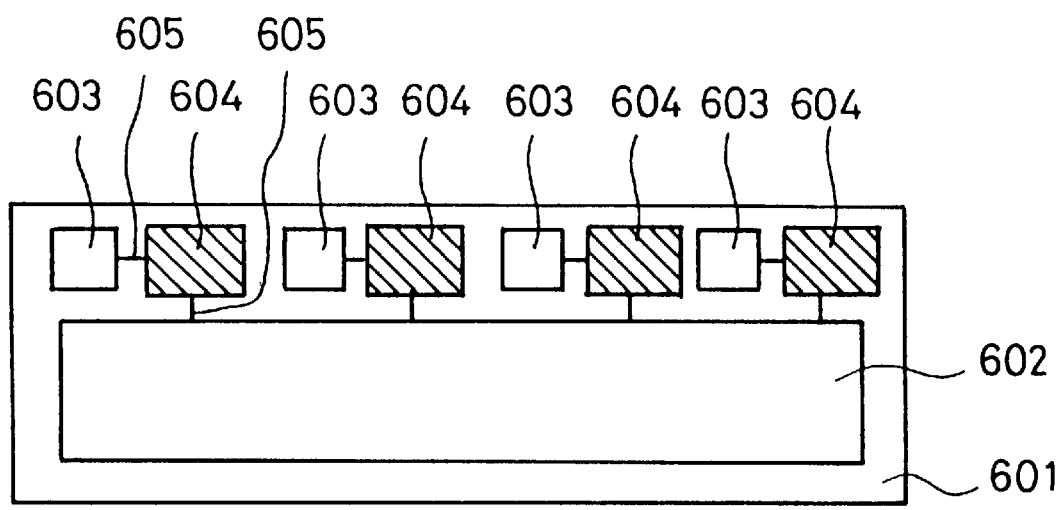
FIG. 4 is a plan view of an example of a conventional semiconductor integrated circuit device.
Figure 29:
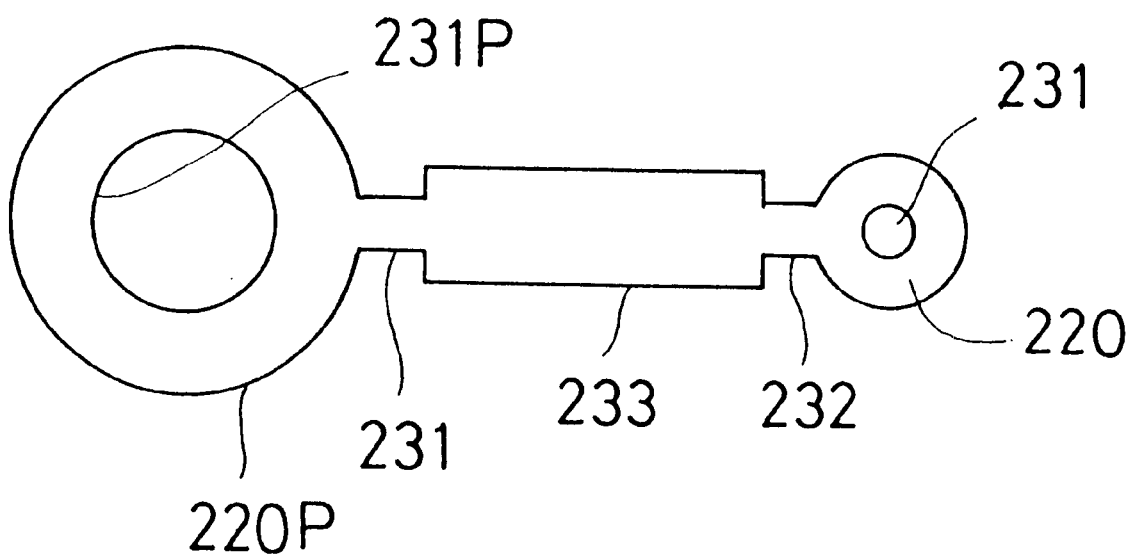
FIG. 29 is a plan view of a semiconductor device according to further another embodiment of the present invention.

FIG. 29 is a plan view of a bump interconnection for the case of electrodes of an integrated circuit having a pad region at one side thereof and not a pad region at the other side thereof, for example, illustrated in FIG. 4. A perforation pattern 231P of the protecting film of the pad region is designed/manufactured to be larger than a perforation pattern 231 of the protecting film of the electrode of the integrated circuit. Also, a barrier metal of the pad portion and a bump 220P are designed/manufactured to be larger than the other regions.

The perforation patterns 231P and 231 of the protecting film may have the same size, or may have the sizes reversely to the case mentioned-above. Any cases can be employed in the present invention. The pad region is required to be higher than the bumps of the other regions and therefore the barrier metal of the pad region is required to be made larger than the other regions (interconnection portion).

In FIG. 29, a barrier metal region 232 having a narrow line-width is disposed between a bump 233 of the interconnection portion and the bump 220P of the pad region. Further, a barrier metal region 232 having a line-width narrower than the respective barrier metals is disposed between the bump 233 of the interconnection portion and the other bump 220 of the electrode of the integrated circuit. As shown in FIG. 29, the regions of the barrier metals having the narrow line-width can prevent the bump from moving among the respective regions at the time of reflow of the bump.

Figure 30:
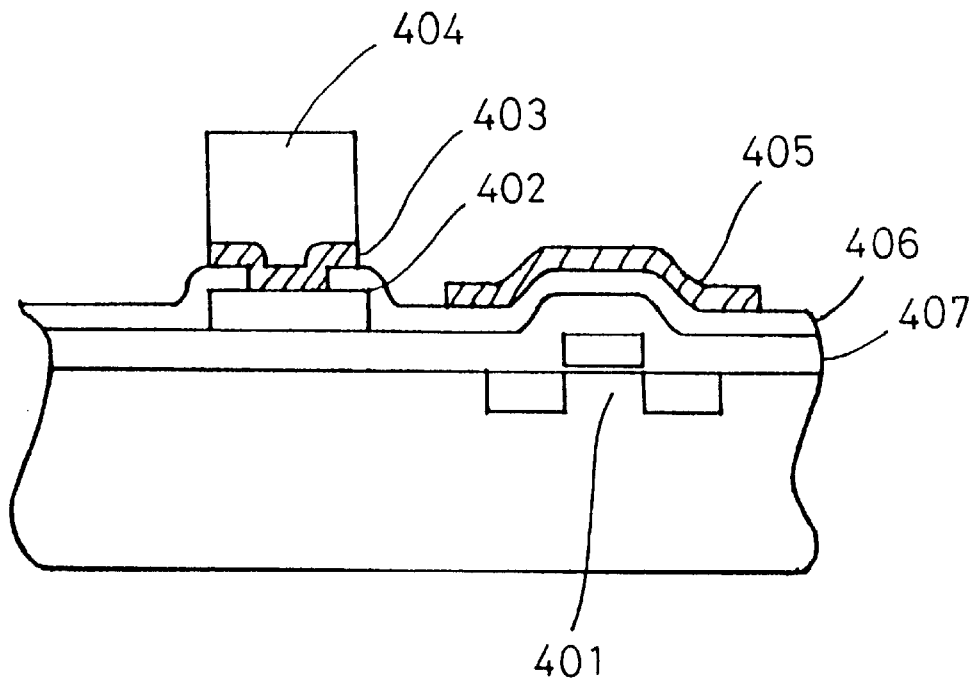
FIG. 30 is a sectional constitution view of a semiconductor device according to an embodiment of the present invention.

FIG. 30 is a sectional construction view of a semiconductor device according to an embodiment of the present invention. A gold bump will be described as an example of the bump here; however a solder bump will do. Also, a MOS transistor will be described here as an example of a semiconductor element, which includes elements varying in electric characteristic due to the radiation of the light such as diodes, resistors, and the like.

A semiconductor device according to the present invention is comprised of a semiconductor element (a MOS transistor comprising a gate electrode, source region and a drain region in this case) 401, an insulating film 407 made of a silicone nitride film and the like, disposed on the semiconductor element, a pad metal 402, a perforated protecting film 406, a barrier metal 403, a gold bump 404, and a light shielding film 405. The barrier metal film 403 is usually made of titanium, titanium-tungsten, and the like, and then has a light shielding effect if it has a thickness of not less than 0.05 $\mu$m. The bump is not remained, then only the barrier metal film 403 is remained as a light shielding film on the semiconductor element. In FIG. 30, the light shielding film 405 is not connected to the barrier metal film disposed on the pad metal. However, it is more preferable in view of the electric characteristic that the shielding film 405 is connected to a specific terminal to fix the voltage. In the case of the present invention, there is no big problem even if the light shielding film 405 is on a floating state, since the parasitic capacitance is small due to the fact that a protecting film and the like is interposed between the substrate of the semiconductor integrated circuit and the light sidling film.

Figure 31:
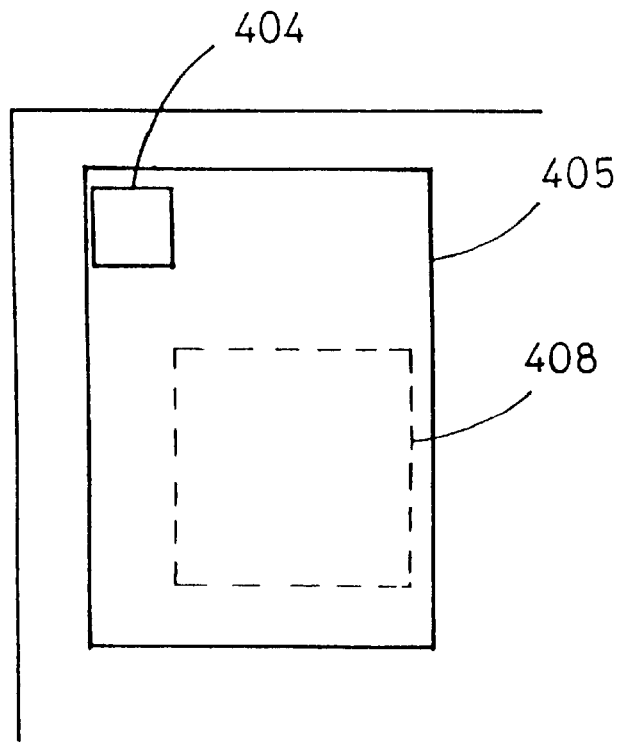
FIG. 31 is a view of a semiconductor device according to an embodiment of the present invention.

FIG. 31 shows a top view of a semiconductor device having a construction of FIG. 30. Since the leak electric current on a PN conjunction is generally increased when the light is applied on to the semiconductor, the light shielding film formed on the analogue circuit prevents the semiconductor device from malfunctioning. FIG. 31 shows the fact that the light shielding film 405 made of a barrier metal is connected to the terminal.

In the general semiconductor integrated circuit device having bump electrodes on an electronic circuit thereof, an electronic circuit, for example polysilicon resistors are formed on a semiconductor substrate, surfaces of the polysilicon resistors are covered by a passivation film, and then bump electrodes are formed on the passivation film through a barrier metal layer. Then, the semiconductor integrated circuit device having the bump electrodes is implemented on the external electrode substrate.

Figure 32A:
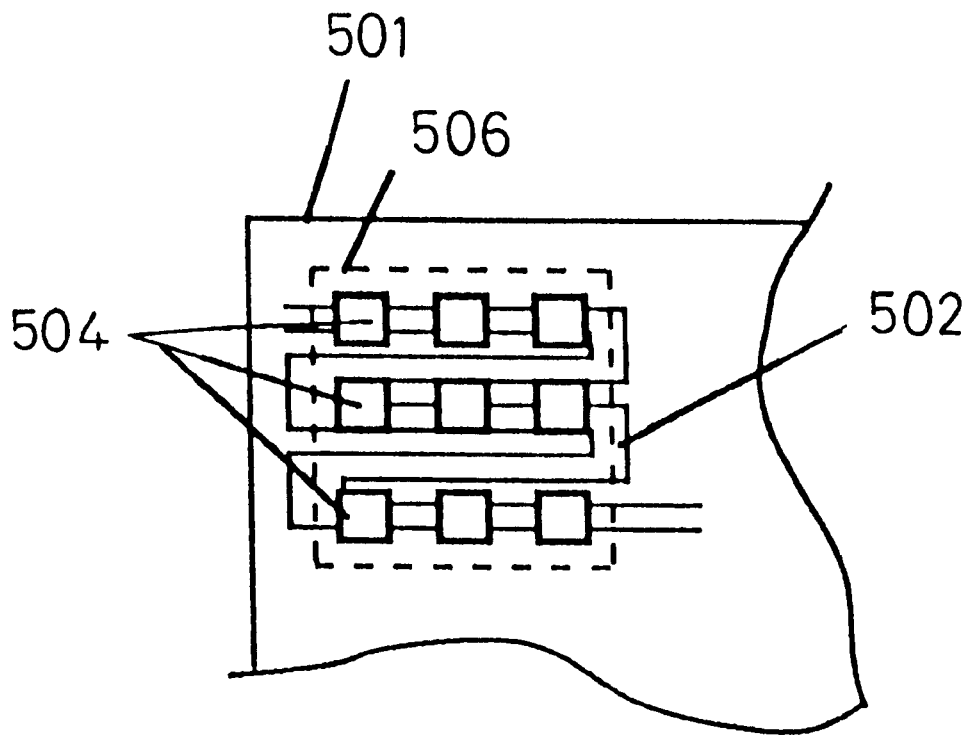
FIG. 32($a$) is a plan view of a semiconductor integrated circuit device according to one embodiment of the present invention, and FIG. 32($b$) is a sectional view of a semiconductor integrated circuit device according to the present invention, showing a state at the time of the implementation.

FIG. 32(a) is a plan view of a bump electrode of a semiconductor integrated circuit device according to one embodiment of the present invention. An electronic circuit, for example, polysilicon resistors are arranged on a semiconductor substrate 501, and bump electrodes 504 are separately formed in matrix-like manner on the polysilicon resistors through a passivation film, for example, a barrier metal layer 506 made of TiW, Au and the like. The matrix-like dots of the bump electrode 504 correspond to only one electrode of the electronic circuit, and then all of them are electrically connected thereto.

Figure 32B:
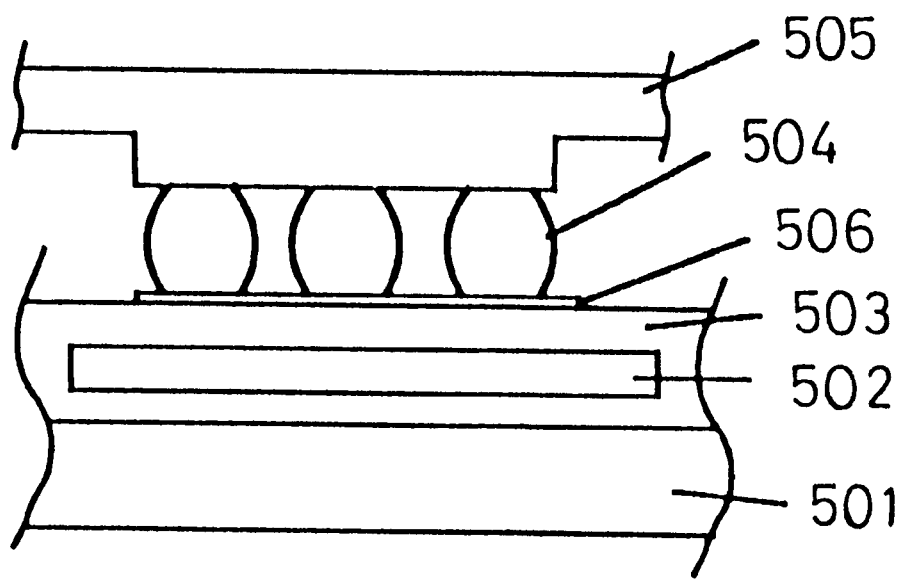

FIG. 32(b) is a sectional view of a semiconductor integrated circuit according to the present invention for the case of implementing it to the external circuit. A pressure is applied to a portion between the semiconductor substrate 501 and the external electrode substrate 505 in order to connect the respective bump dots of the bump electrode 504 to the external electrode substrate 505. The matrix bump dots of the bump electrode 504 are broken due to the stress, thereby being capable of discharging surplus stress received from the external electrode substrate 505. As a result, the stresses of the passivation film 503 and the polysilicon resistors 502 are reduced, thereby preventing the characteristic variation due to cracks of the passivation film 503 and deformation of the polysilicon resistor 502. The bump electrode 504 is comprised of a plurality of bump dots, which maintains the close-contact strength between the bump electrode 504 and the external electrode substrate 505, and the close-contact strength between the bump electrode 504 and the barrier metal 506.

Figure 33:
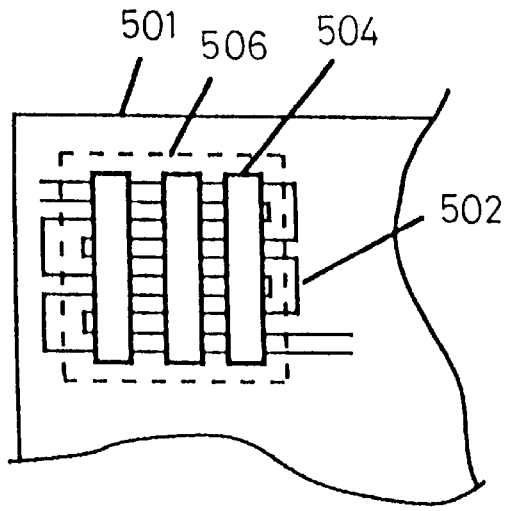
FIG. 33 is a plan view of a semiconductor integrated circuit according to another embodiment of the present invention.

FIG. 33 is a plan view of another embodiment of the present invention. Electronic circuit components, for example, polysilicon resistors 502 are arranged on a semiconductor substrate 501, bump electrodes 504 are formed on the polysilicon resistors 502 through a passivation film, for example, a barrier metal layer 506 made of TiW, Au and the like. This bump electrode 504 is divided into a plurality of strip-like members. The bump strips arranged in a strip-like manner (line-like manner) correspond to only one electrode of the electronic circuit, and then all of them are electrically connected thereto. In a case where the embodiment shown in FIG. 32(b) is implemented on to an external electrode substrate, the respective bump strips of the bump electrode 504 are broken, thereby being capable of discharging the surplus stress received from the external electrode substrate 505 in the lateral direction, similarly to the embodiment shown by the sectional view of FIG. 32(b). As a result, the stresses applied to the passivation film 503 and the polysilicon resistors 502 are reduced, thereby preventing the characteristic variation due to cracks of the passivation film 503 and deformation of the polysilicon resistors 502. Also, the bump electrode 504 is divided into a plurality of members, which maintains the close contact strength between the bump electrode 504 and the external electrode substrate 505 and the close contact strength between the bump electrode 504 and the barrier metal 506.

Figure 34:
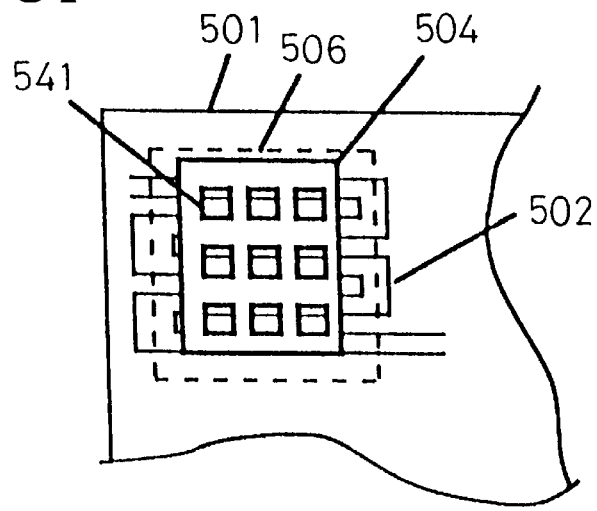
FIG. 34 is a plan view of a semiconductor integrated circuit according to another embodiment of the present invention.

FIG. 34 is a plan view of still further another embodiment of the present invention. Electronic circuit components, for example, the polysilicon resistors 502 are arranged on the semiconductor substrate 501, the bump electrodes 504 are formed on the polysilicon resistors 502 through a passivation film, for example, a barrier metal layer 506 such as TiW, Au and the like. Here, the bump electrode 504 is shaped like a lattice, and has gaps 541. In a case where the embodiment of FIG. 34 is implemented on to the external electrode substrate, the bump electrode 504 are broken in an outward direction and toward a gap, thereby being capable of discharging the surplus stress received from the external electrode substrate 505 in the lateral direction, similarly to the embodiment shown by the sectional view of FIG. 32(b). As a result, the stresses applied to the passivation film 503 and the polysilicon resistors 502 are reduced, thereby preventing the characteristic variation due to cracks of the passivation film 503 and deformation of the polysilicon resistors 502.

Also, the area of the bump electrode 504 can be increased, which maintains the close contact strength between the bump electrode 504 and the external electrode substrate 505 and the close contact strength between the bump electrode 504 and the barrier metal 506.

Figure 35:
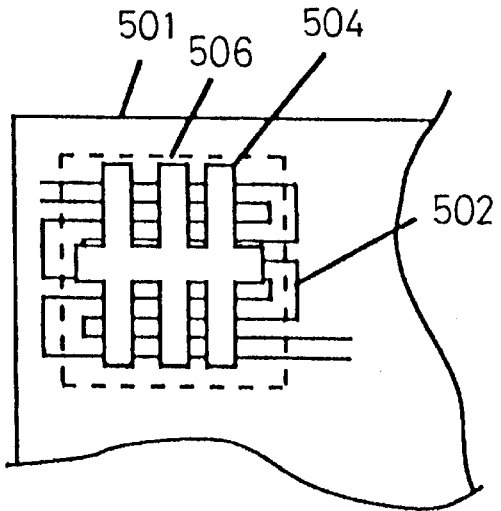
FIG. 35 is a plan view of a semiconductor integrated circuit according to another embodiment of the present invention.

FIG. 35 is a plan view of another embodiment of the present invention. Electronic circuit components, for example, the polysilicon resistors 502 are arranged on the semiconductor substrate 501, a comb-like bump electrodes 504 are formed on the polysilicon resistors 502 through the passivation film, for example, the barrier metal layer 506 such as TiW, Au and the like. In a case where the embodiment of FIG. 35 is implemented on to the external electrode substrate, the bump electrode 504 are broken in a gap direction of a comb, thereby being capable of discharging the surplus stress received from the external electrode substrate 505 in the lateral direction, similarly to the embodiment shown by the sectional view of FIG. 32(b). As a result, the stresses applied to the passivation film 503 and the polysilicon resistors 502 are reduced, thereby preventing the characteristic variation due to cracks of the passivation film 503 and deformation of the polysilicon resistors 502. Also, the area of the bump electrode 504 can be increased, which maintains the close contact strength between the bump electrode 504 and the external electrode substrate 505 and the close contact strength between the bump electrode 504 and the barrier metal 506.

In the embodiments of FIGS. 32, 33, 34 and 35, the semiconductor substrate 501 and the external electrode substrate 505 are contacted to each other with a pressure, and then heated to be joined.

Further, a combination of the above embodiments attains the same effect. For example, a combination of the embodiments of FIGS. 32 and 33 realizes an irregular pitch matrix bump. Also, a combination of the embodiments of FIGS. 34 and 35 realizes a bump having gap portions therein and having a comb-like outer portion, which attains the same effect.

In the present invention, the two dimensional gap portions are formed on the bump electrode 504 which is, usually, rectangular as shown in FIGS. 32, 33, 34 and 35, and the external electrode substrate 505 is contacted thereto with a stress, and therefore the material of the bump electrode 504 is discharged to the gap portions. The two dimensional gap portions are formed by the separated bump electrodes as apparent from the vertical section of the bump electrode 504 shown in FIG. 32(b).

From the above, the present invention can provides the semiconductor integrated circuit which, being superior in reliability, has the bump electrode on the electronic circuit, thereby preventing the characteristic variation of the circuit due to the construction of discharging the stress at the time of the implementation.

In an external electrically connecting portion in the general semiconductor integrated circuit device having an external electrically connecting terminal on an elecronic circuit, an elecronic circuit, for example polysilicon resistor is mounted on the semiconductor, a passivation film is covered thereon, and then an external electrically connecting terminal-use aluminum electrode is located further thereon. Moreover, bonded wires are connected to the external electrically connecting terminal-use aluminum electrode.

Figure 36A:
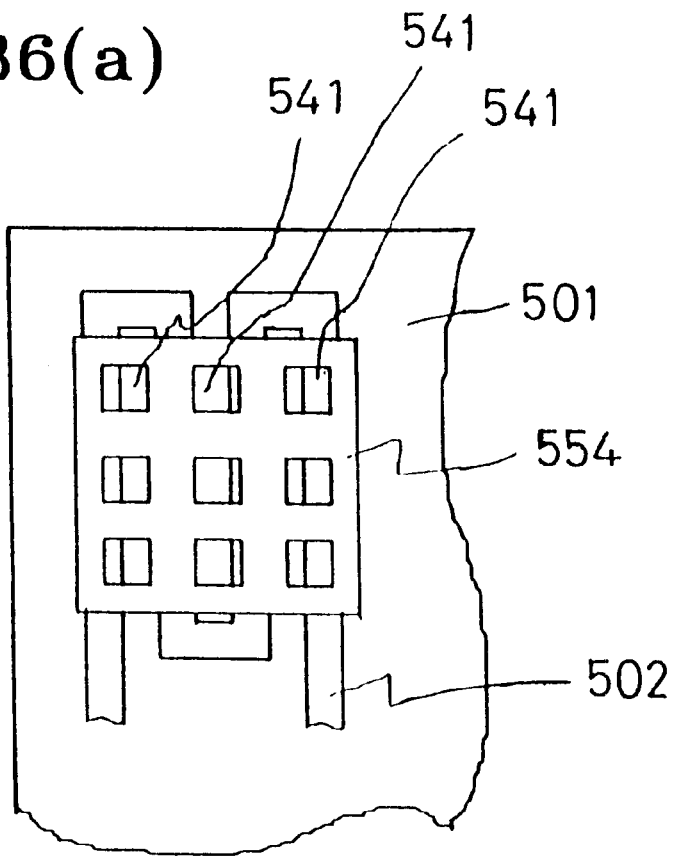
FIG. 36($a$) is a plan view of a semiconductor integrated circuit device according to one embodiment of the present invention, and FIG. 36($b$) is a sectional view of a semiconductor integrated circuit device according to the present invention, showing a state at the time of the implementation.

FIG. 36(a) is a plan view of an external electrically connecting terminal-use electrode portion of a semiconductor integrated circuit device according to an embodiment of the present invention. An electronic circuit, for example, polysilicon resistors 502 are arranged on a semiconductor substrate 501, an external electrically connecting terminal-use aluminum electrode 554 is disposed on the polysilicon resistors 502 through the passivation film. Moreover, the external electrically connecting terminal-use aluminum electrode 554 has gaps 541.

Figure 36B:
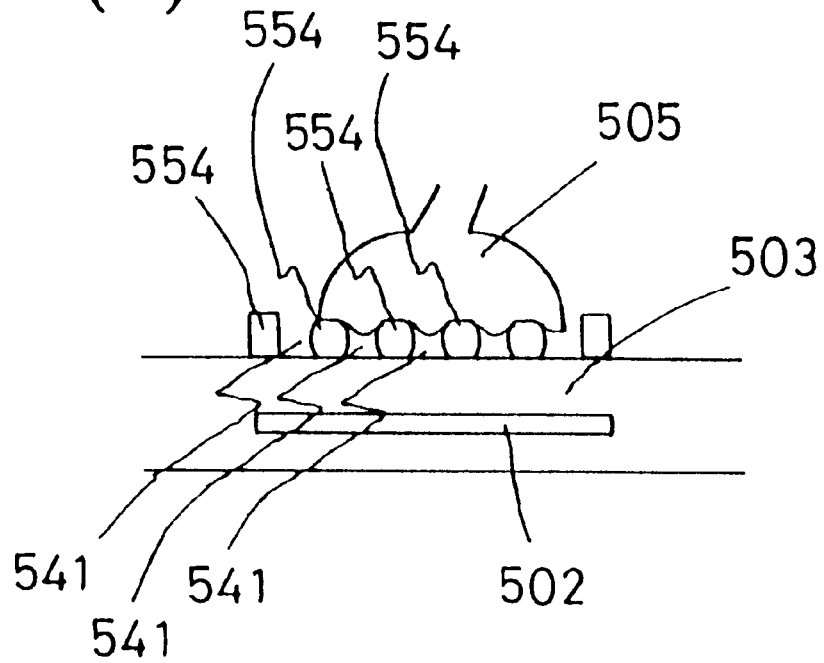

FIG. 36(b) is a sectional view of the semiconductor integrated circuit device of the present invention which is implemented by the wire bonding. In FIG. 36(b), a pressure is applied to a portion between the semiconductor substrate 501 and the bonded wire 505 in order to connect the external electrically connecting terminal-use aluminum electrode 554 and the bonded wire 505, then the external electrically connecting terminal-use aluminum electrode 554 is broken, thereby being capable of discharging the surplus stress received from the bonded wire 505 in the lateral direction, that is, toward the gap 541. As a result, the stress applied to the passivation film 503 and the polysilicon resistors 502 is reduced, which prevents the characteristic variation due to cracks of the passivation film 503 and deformation of the polysilicon resistors 502.

Figure 37:
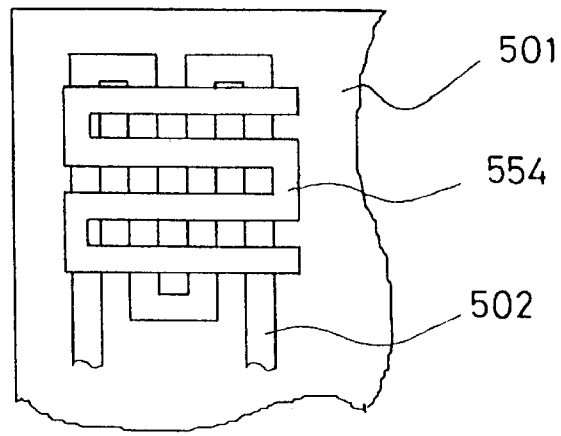
FIG. 37 is a plan view of a semiconductor integrated circuit according to another embodiment of the present invention.

FIG. 37 is a plan view of another embodiment of the present invention. An electronic circuit, for example, polysilicon resistors 502 are arranged on a semiconductor substrate 501, an external electrically connecting terminal-use aluminum electrode 554 is disposed on the polysilicon resistors 502 through the passivation film. Moreover, the external electrically connecting terminal-use aluminum electrode 554 is constructed by a combination of contiguous rectangular portions. In a case where the embodiment of FIG. 37 is implemented by the bonded wires, the external electrically connecting terminal-use aluminum electrode 554 is broken to an outside of the external electrically connecting terminal-use aluminum electrode and toward the gap, thereby being capable of discharging the surplus stress received from the bonded wire 505 in the lateral direction, similarly to the embodiment shown by the sectional view of FIG. 36(b). Also, although the interconnection resistance of the external electrically connecting terminal-use aluminum electrode 554 is greater than the embodiment of FIG. 36(a), the stress discharging space per unit area is increased, thereby being capable of discharging more stress. As a result, the stress applied to the passivation film 503 and the polysilicon resistors 502 is reduced, which prevents the decreasing of the reliability due to the cracks of the passivation film 503 and the characteristic variation due to the deformation of the polysilicon resistors 502.

Figure 38:
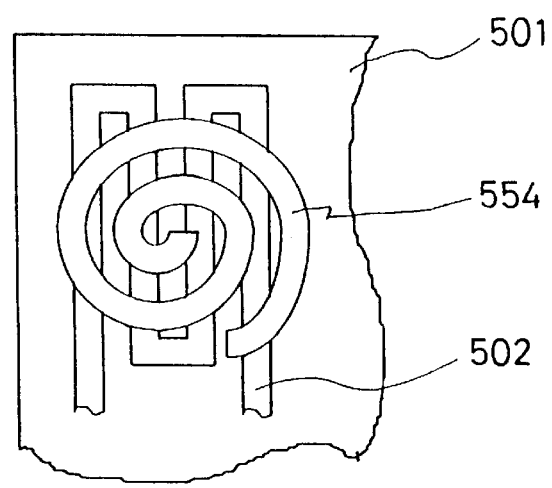
FIG. 38 is a plan view of a semiconductor integrated circuit according to another embodiment of the present invention.

FIG. 38 is a plan view of another embodiment of the present invention. An electronic circuit, for example, polysilicon resistors 502 are arranged on a semiconductor substrate 501, an external electrically connecting terminal-use aluminum electrode 554 is disposed on-the polysilicon resistors 502 through the passivation film. Moreover, the external electrically connecting terminal-use aluminum electrode 554 is shaped like a contiguous spiral. In a case where the embodiment of FIG. 38 is implemented by the bonded wires, the external electrically connecting terminal-use aluminum electrode 554 is broken, thereby being capable of discharging the surplus stress received from the bonded wire 505 in the lateral direction, that is, toward the gap, similarly to the embodiment shown by the sectional view of FIG. 36(b). Also, although the interconnection resistance of the external electrically connecting terminal-use aluminum electrode 554 is greater than the embodiment of FIG. 36(a), the stress discharging space per unit area is increased, thereby being capable of discharging more stress. Further, the bonded wire 505 is shaped like a circle in two dimensions, and contacts to the external electrically connecting terminal-use aluminum electrode 554. However, the external electrically connecting terminal-use aluminum electrode 554 is shaped like a spiral, thereby being capable of effectively receiving the stress from the bonded wire, and of effectively discharging the stress. As a result, the stress applied to the passivation film 503 and the polysilicon resistors 502 is reduced, which prevents the decreasing of the reliability due to the cracks of the passivation film 503 and the characteristic variation due to the deformation of the polysilicon resistors 502.

Figure 39:
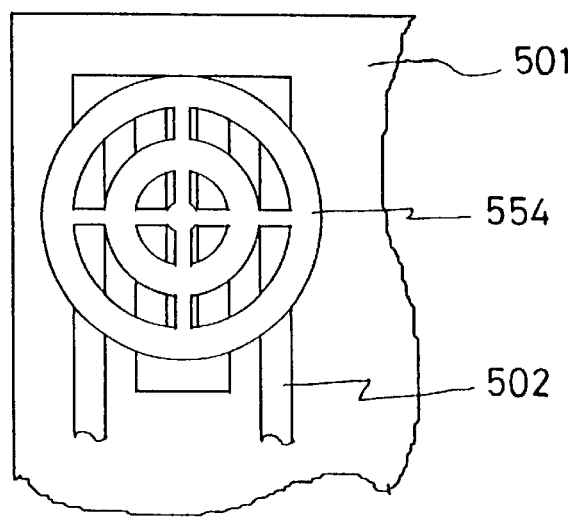
FIG. 39 is a plan view of a semiconductor integrated circuit according to another embodiment of the present invention.

FIG. 39 is a plan view of another embodiment of the present invention. An electronic circuit, for example, polysilicon resistors 502 are arranged on a semiconductor substrate 501, an external electrically connecting terminal-use aluminum electrode 554 is disposed on the polysilicon resistors 502 through the passivation film. Moreover, the external electrically connecting terminal-use aluminum electrode 554 is constructed by a combination of concentric circles which are electrically connected to one another. In a case where the embodiment of FIG. 38 is implemented by the bonded wires, the external electrically connecting terminal-use aluminum electrode 554 is broken, thereby being capable of discharging the surplus stress received from the bonded wire 505 in the lateral direction, that is, toward the gap, similarly to the embodiment shown by the sectional view of FIG. 36(b). Further, the bonded wire 505 is shaped like a circle in two dimensions, and contacts to the external electrically connecting terminal-use aluminum electrode 554. However, the external electrically connecting terminal-use aluminum electrode 554 is shaped like concentric circles, thereby being capable of effectively receiving the stress from the bonded wire, and of effectively discharging the stress. As a result, the stress applied to the passivation film 503 and the polysilicon resistors 502 is reduced, which prevents the decreasing of the reliability due to the cracks of the passivation film 503 and the characteristic variation due to the deformation of the polysilicon resistors 502.

Further, a combination of the above embodiments attains the same effect. For example, a combination of the embodiments of FIGS. 36 and 37 or a combination of the embodiments of FIGS. 36 and 38 realize the external electrically connecting terminal-use aluminum electrode having a closed outer portion, which attains the same effect.

Figure 40A:
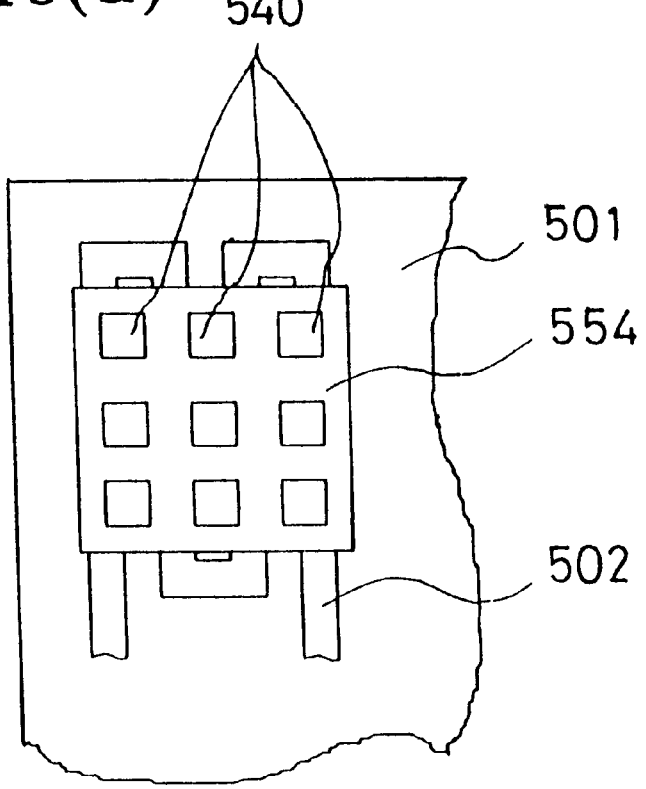
FIG. 40($a$) is a plan view of a semiconductor integrated circuit device according to one embodiment of the present invention, and FIG. 40($b$) is a sectional view of a semiconductor integrated circuit device according to the present invention, showing a state at the time of the implementation.

FIG. 40(a) is a plan view of an external electrically connecting terminal-use aluminum electrode according to an embodiment of the present invention. An electronic circuit, for example, the polysilicon resistors 502 are arranged on the semiconductor substrate 501, and then the external electrically connecting terminal-use aluminum electrode 554 is disposed on the polysilicon resistors 502 through the passivation film, while protrusions, or recesses 540 are disposed on the external electrically connecting terminal-use aluminum electrode.

Figure 40B:
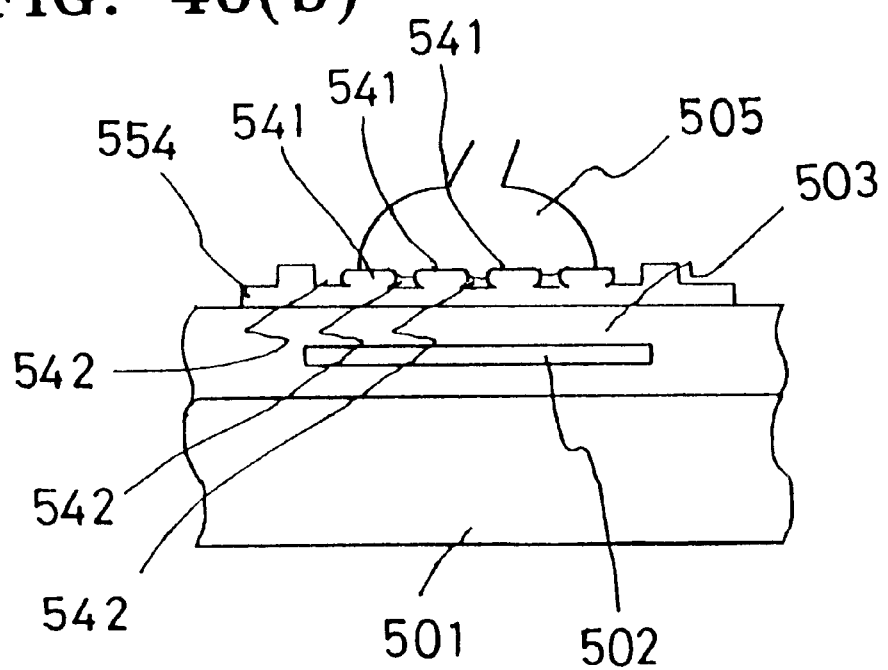

FIG. 40(b) is a sectional view of the semiconductor integrated circuit device of the present invention for the case that it is implemented by the wire bonding. In FIG. 40(b), an convexoconcave portion such as protrusions 541 and recesses 542 is disposed on the external electrically connecting terminal-use aluminum electrode 554. When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554 are broken, thereby being capable of discharging the surplus stress received from the bonded wires 505. As a result, the stress applied to the passivation film 503 and the polysilicon resistors 502 is reduced, which prevents the characteristic variation due to cracks of the passivation film 503 and deformation of the polysilicon resistors 502.

Figure 41:
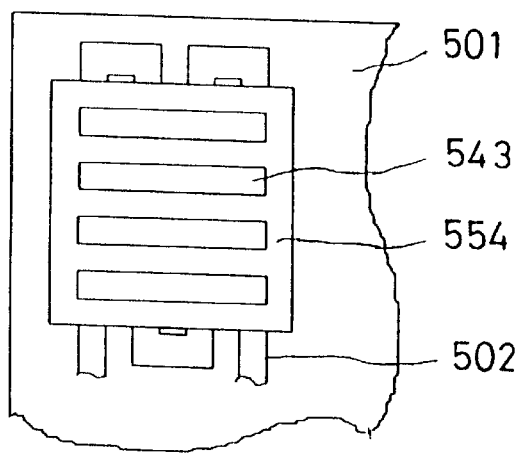
FIG. 41 is a plan view of a semiconductor integrated circuit according to another embodiment of the present invention.

FIG. 41 is a plan view of another embodiment of the present invention. An electronic circuit, for example, the polysilicon resistors 502 are arranged on the semiconductor substrate 501, and then the external electrically connecting terminal-use aluminum electrode 554 is disposed on the polysilicon resistors 502 through the passivation film, while a plurality of rectangular convexoconcave portion on the passivation film just below the external electrically connecting terminal-use aluminum electrode 554. Accordingly, the similar convexoconcave portion 543 are formed on the external electrically connecting terminal-use aluminum electrode 554. In a case where the embodiment of FIG. 41 is implemented by the bonded wire, the section of the construction is the same as that of FIG. 40(b). When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554, the protrusions 541 of the external electrically connecting terminal-use aluminum electrode 554 are broken, thereby being capable of discharging the surplus stress received from the bonded wires 505. As a result, the stress applied to the passivation film 503 and the polysilicon resistors 502 is reduced, which prevents the characteristic variation due to cracks of the passivation film 503 and deformation of the polysilicon resistors 502.

Figure 42:
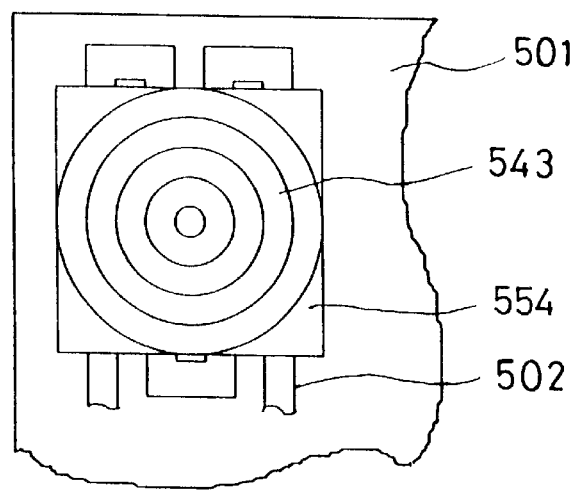
FIG. 42 is a plan view of a semiconductor integrated circuit according to another embodiment of the present invention.

FIG. 42 is a plan view of another embodiment of the present invention. An electronic circuit, for example, the polysilicon resistors 502 are arranged on the semiconductor substrate 501, and then the external electrically connecting terminal-use aluminum electrode 554 is disposed on the polysilicon resistors 502 through the passivation film, while a plurality of concentric circular convexoconcave portion on the passivation film just below the external electrically connecting terminal-use aluminum electrode 554. Accordingly, the similar convexoconcave portion 543 are formed on the external electrically connecting terminal-use aluminum electrode 554. In a case where the embodiment of FIG. 42 is implemented by the bonded wire, the section of the construction is the same as that of FIG. 40(b). When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554, the protrusions 541 of the external electrically connecting terminal-use aluminum electrode 554 are broken, thereby being capable of discharging the surplus stress received from the bonded wires 505. Further, the bonded wires 505 is circular in two dimensions, and then contacts to the external electrically connecting terminal-use aluminum electrode 554. However, the external electrically connecting terminal-use aluminum electrode 554 is a concentric circular, thereby being effectively receiving the stress from the bonded wires and effectively discharging it. As a result, the stress applied to the passivation film 503 and the polysilicon resistors 502 is reduced, which prevents the characteristic variation due to cracks of the passivation film 503 and deformation of the polysilicon resistors 502.

Figure 43:
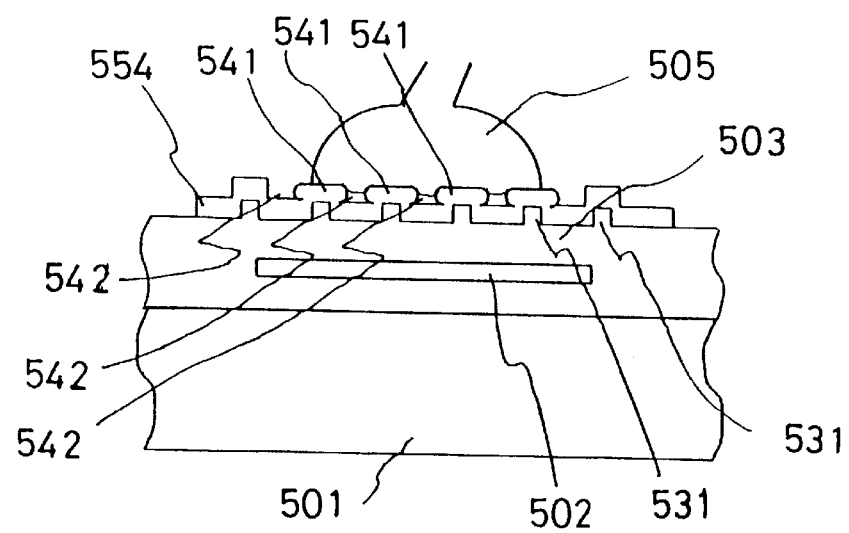
FIG. 43 is a plan view of a semiconductor integrated circuit according to another embodiment of the present invention.

FIG. 43 is a plan view of another embodiment of the present invention. In FIG. 43, protrusions 531 are disposed on the passivation film 503, and the external electrically connecting terminal-use aluminum electrode 554 is disposed on the protrusions 531, so that the protrusions 541 and the recesses 542 are formed on the external electrically connecting terminal-use aluminum electrode 554. When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554, the protrusions 541 of the external electrically connecting terminal-use aluminum electrode 554 are broken, thereby being capable of discharging the surplus stress received from the bonded wires 505. As a result, the stress applied to the passivation film 503 and the polysilicon resistors 502 is reduced, which prevents the characteristic variation due to cracks of the passivation film 503 and deformation of the polysilicon resistors 502.

Figure 44:
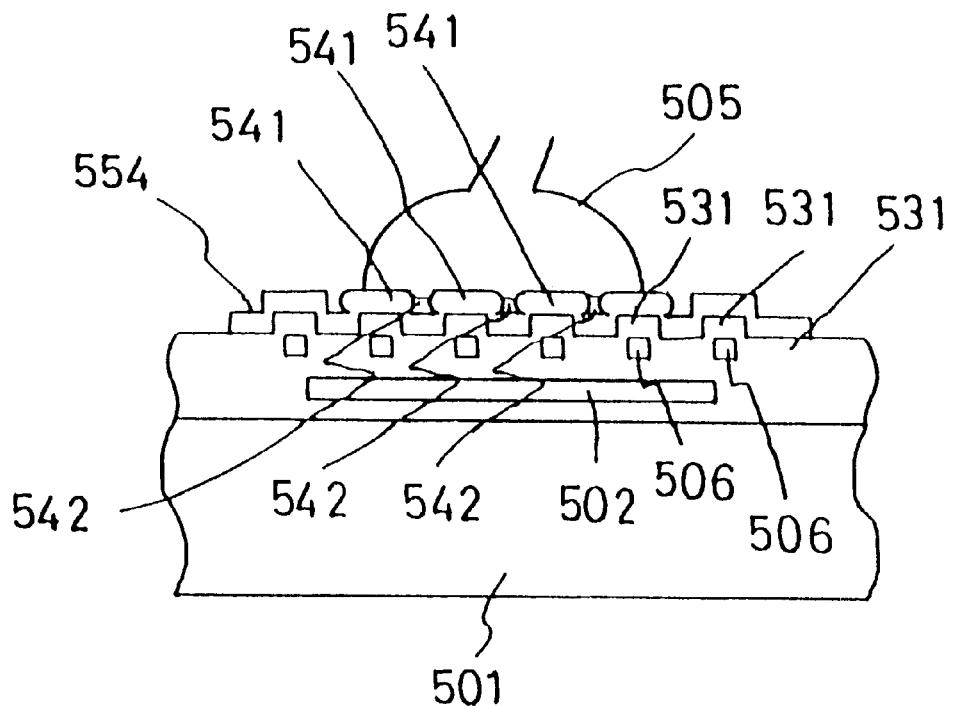
FIG. 44 is a plan view of a semiconductor integrated circuit according to another embodiment of the present invention.

FIG. 44 is a sectional view of another embodiment of the present invention. An electronic circuit, for example, polysilicon resistors 502 are arranged on a semiconductor substrate 501, a stepped portion forming pattern 506 made of aluminum is disposed on the polysilicon resistors 502. This pattern can be formed by the active interconnection. A formation of the passivation film 503 on the stepped portion forming pattern 506 forms protrusions 531 on the passivation film 503. A formation of the external electrically connecting terminal-use aluminum electrode 554 on the protrusions 531 forms protrusions 541 and recesses 542 on the external electrically connecting terminal-use aluminum electrode 554. When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554 are broken toward the recesses 554, thereby being capable of discharging the surplus stress received from the bonded wires 505. As a result, the stress applied to the passivation film 503 and the polysilicon resistors 502 is reduced, which prevents the characteristic variation due to cracks of the passivation film 503 and deformation of the polysilicon resistors 502.

Figure 45:
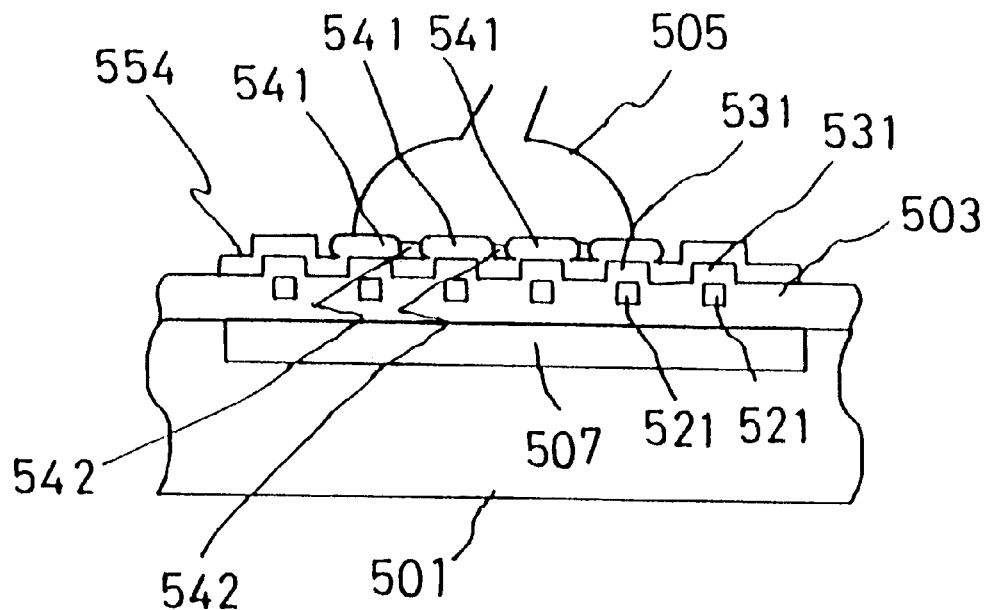
FIG. 45 is a plan view of a semiconductor integrated circuit according to another embodiment of the present invention.

FIG. 45 is a sectional view of another embodiment of the present invention. An electronic circuit, for example, diffusion resistors 507 502 are arranged on a semiconductor substrate 501, a stepped portion forming pattern 521 made of polysilicon is disposed on the diffusion resistors 507. A formation of the passivation film 503 on the stepped portion forming pattern 506 forms protrusions 531 on the passivation film 503. A formation of the external electrically connecting terminal-use aluminum electrode 554 on the protrusions 531 forms protrusions 541 and recesses 542 on the external electrically connecting terminal-use aluminum electrode 554. When a pressure is applied to a portion between the semiconductor substrate 501 and the bonded wires 505 in order to connect the external electrically connecting terminal-use aluminum electrode 554 with the bonded wires 505, the protrusions 541 of the external electrically connecting terminal-use aluminum electrode 554 are broken toward the recesses 554, thereby being capable of discharging the surplus stress received from the bonded wires 505. As a result, the stress applied to the passivation film 503 and the polysilicon resistors 502 is reduced, which prevents the lowering of the reliability due to cracks of the passivation film 503.

Further, a combination of the above embodiments attains the same effect. For example, a combination of the embodiments of FIGS. 40 and 41, or a combination of the embodiments of FIGS. 40 and 42 realizes the external electrically connecting terminal-use aluminum electrode having a closed outer portion, which attains the same effect.

Figure 46A:
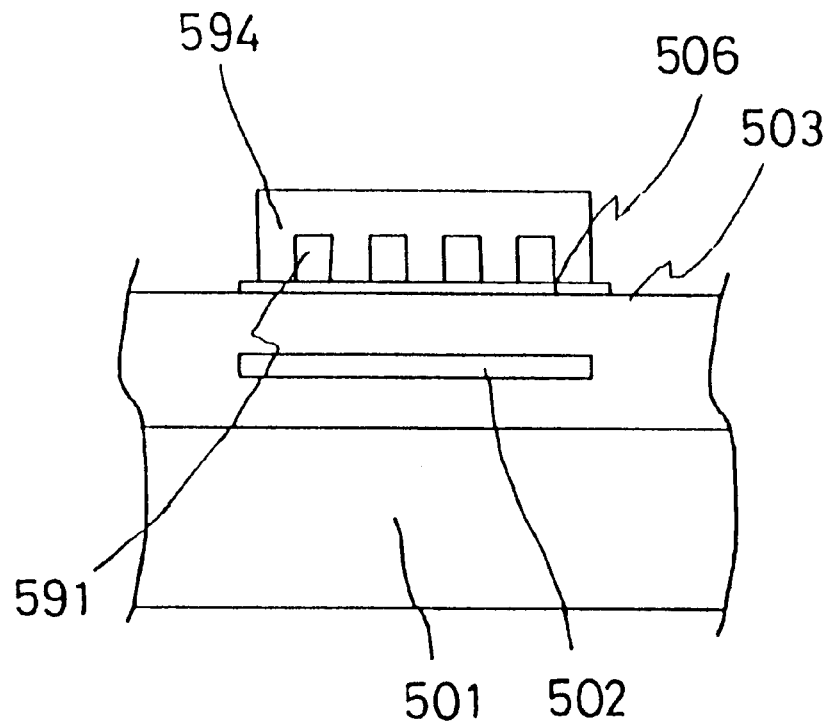
FIG. 46(a) is a plan view of a semiconductor integrated circuit device according to one embodiment of the present invention.

FIG. 46(a) is a sectional view of a bump electrode portion of a semiconductor integrated circuit device according to one embodiment of the present invention. An electronic circuit, for example, polysilicon resistors 502 are arranged on a semiconductor substrate 501, bump electrodes 594 are placed on the polysilicon resistors 502 through a passivation film 503 and a barrier metal layer 506 such as TiW, Au and the like. Hollow portions 591 are disposed in a lower portion of the bum electrode 594.

Figure 46B:
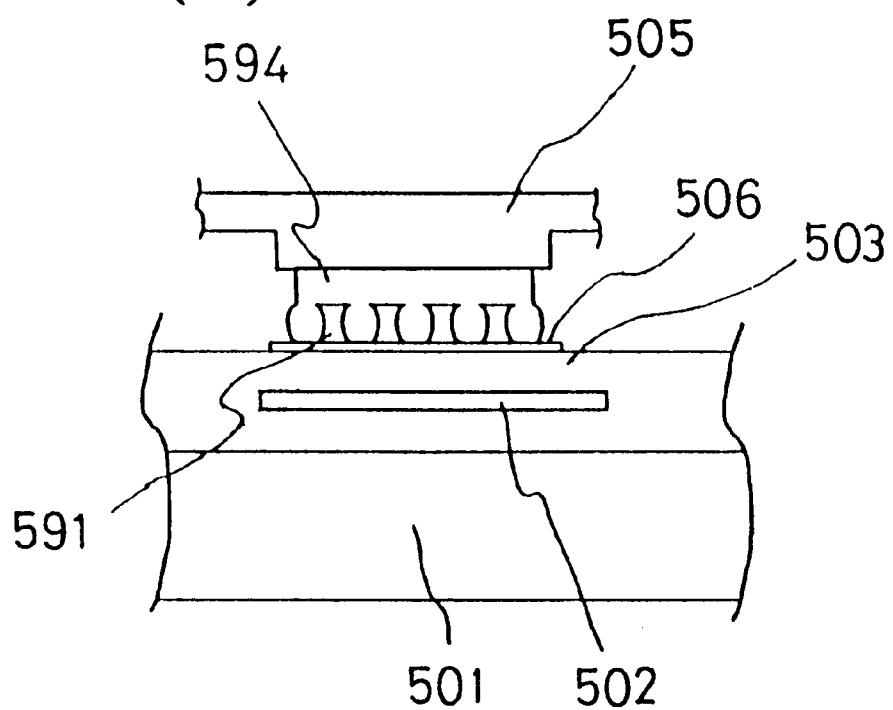
FIG. 46(b) is a sectional view of a semiconductor integrated circuit device according to the present invention, showing a state at the time of the implementation.

FIG. 46(b) is a sectional view of a semiconductor integrated circuit device of the present invention showing a case in which it is implemented on to the external circuit. In FIG. 46(b), when a pressure is applied to a portion between the semiconductor substrate 501 and the bonded wires 505 in order to connect the bump electrodes 594 with the bonded wires 505, the bump electrodes 594 is broken at the hollow portions 591 thereof, thereby being capable of discharging the surplus stress received from the bonded wires 505. As a result, the stress applied to the passivation film 503 and the polysilicon resistors 502 is reduced, which prevents the characteristic variation due to cracks of the passivation film 503 and deformation of the polysilicon resistors 502. Moreover, the hollow portions 591 may be filled with a material softer than the bump electrode material such as a polyimide resin, photoresist and the like, as well as remained hollow, which attains the same effect.

Figure 47:
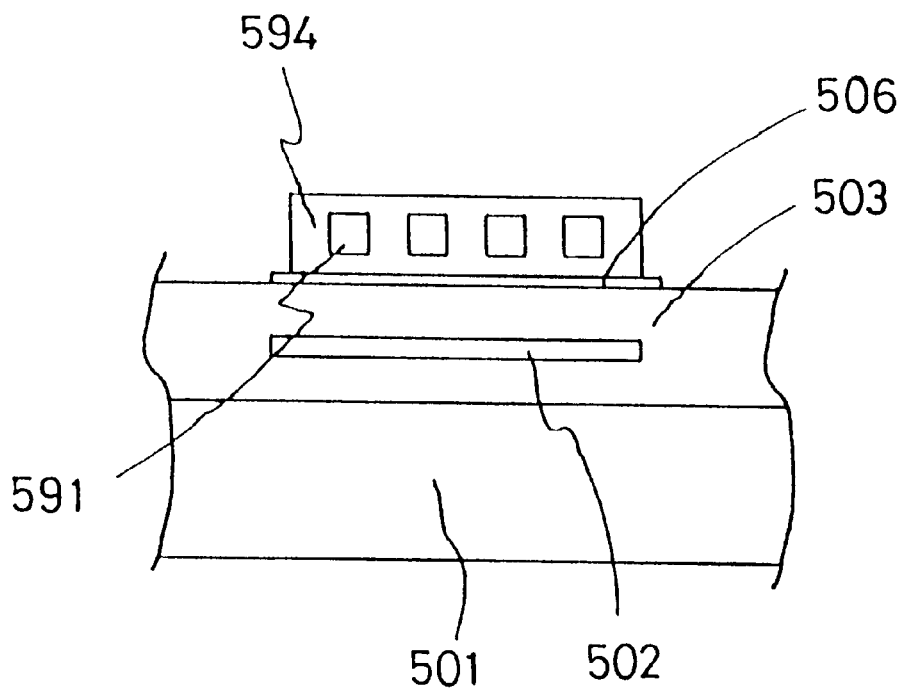
FIG. 47 is a plan view of a semiconductor integrated circuit according to another embodiment of the present invention.

FIG. 47 is a plan view of another embodiment of the present invention. An electronic circuit, for example, polysilicon resistors 502 are arranged on a semiconductor substrate 501, bump electrodes 594 are placed on the polysilicon resistors 502 through the passivation film and the barrier metal layer 506 such as TiW, Au and the like. The hollow portions 591 are disposed inside the bump electrodes 594. In the embodiment of FIG. 47 is implemented on to the external electrode substrate, the bump electrodes 594 are broken at the hollow portions similarly to the embodiment shown by the sectional view of FIG. 46(b), thereby being discharging the surplus stress received from the external electrode substrate 505 in the lateral direction. As a result, the stress applied to the passivation film 503 and the polysilicon resistors 502 is reduced, which prevents the characteristic variation due to cracks of the passivation film 503 and deformation of the polysilicon resistors 502. Also, since a contact area between the bump area and the barrier metal is large, a close contact between the bump metal 594 and the barrier metal 506 can be maintained. Moreover, the hollow portions 591 may be filled with a material softer than the bump electrode material such as a polyimide resin, photoresist and the like, as well as remained hollow, which attains the same effect.

Figure 48:
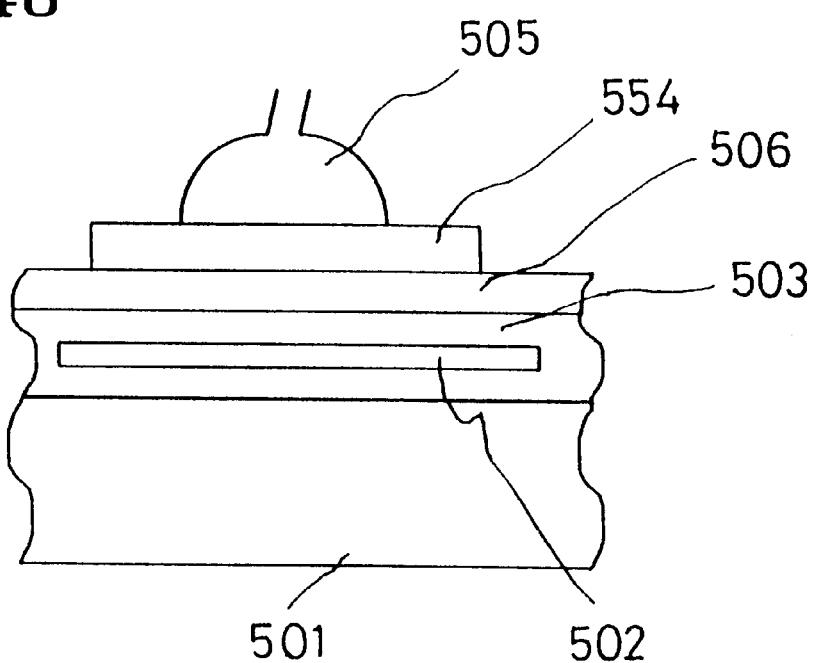
FIG. 48 is a sectional view of a semiconductor integrated circuit device according to one embodiment of the present invention.

FIG. 48 is a sectional view of the external electrically connecting terminal-use aluminum electrode of a semiconductor integrated circuit according to the present invention. An electronic circuit, for example, polysilicon resistors 502 are arranged on the semiconductor substrate 501, then a passivating nitride film 503 is arranged on the polysilicon resistors 502. Further, a polyimide film layer 506 is disposed on the passivating nitride film 503 on which the external electrically connecting terminal-use aluminum electrode 554 is disposed.

According to the integrated circuit device according to the present invention, a stress received from the bonded wire 505 is absorbed into the polyimide layer 506.

Accordingly, the stress is transmitted to the passivation film 503 and the polysilicon resistors 502, which prevents the passivation film 503 from cracking and the polysilicon resistors 502 from deforming, to thereby prevent the characteristic variation.

Figure 49A:
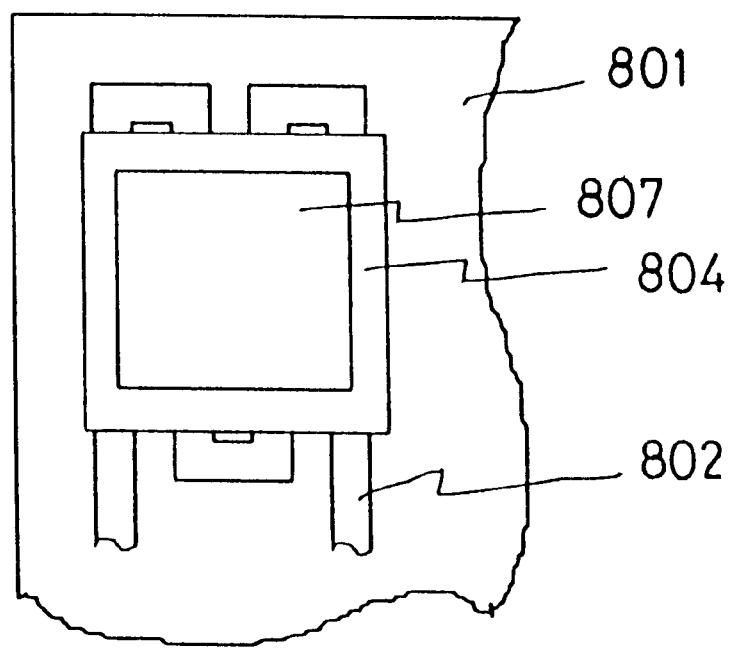
FIG. 49(a) is a plan view of a semiconductor integrated circuit device according to one embodiment of the present invention.

FIG. 49(a) is a plan view of the external electrically connecting terminal-use aluminum electrode of a semiconductor integrated circuit device according to one embodiment of the present invention. An electronic circuit, for example, polysilicon resistors 802 are arranged on a semiconductor substrate 801, then an external electrically connecting terminal-use metal electrode 804 is disposed on the polysilicon resistors 802 through the interlaminar film 803. Further, the passivation film 805 having an opening portion 807 on a part of the external electrically connecting terminal-use metal electrode 804. There is a case that the passivation film 805 having an opening portion 807 on a part of the external electrically connecting terminal-use metal electrode 804 is not formed with the interlaminar film 803 as. a protecting film.

Figure 49B:
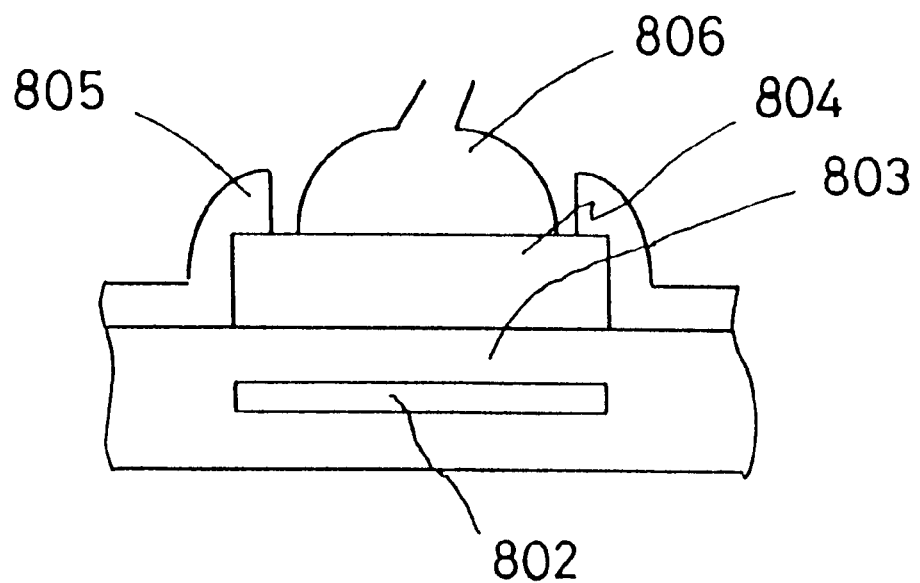
FIG. 49(b) is a sectional view of a semiconductor integrated circuit device according to the present invention, showing a state at the time of the implementation.

FIG. 49(b) is a sectional view of a semiconductor integrated circuit device according to the present invention showing a case in which it is implemented by the wire bonding. In FIG. 49(b), the external electrically connecting terminal-use metal electrode 804 is 1.5 to 4 μr in film thickness. When a pressure is applied to a portion between the external electrically connecting terminal-use metal electrode 804 and the bonded wire 806 in order to connect the external electrically connecting terminal-use metal electrode 804 with the bonded wire 806, the thick external electrically connecting terminal-use metal electrode 804 can absorb the surplus stress received from the bonded wire 806. As a result, the stress applied to the interlaminar film 803 and the polysilicon resistors 802 is reduced, thereby preventing the characteristic variation due to cracks of the interlaminar film 803 and deformation of the polysilicon resistors 802. The more the film thickness of the external electrically connecting terminal-use metal electrode 804 is, the more the stress is relieved. However, the most optimum value is 2 to 3 μm based on the degree of the difficulty of the manufacturing process and the degree of stress relief.

Figure 50A:
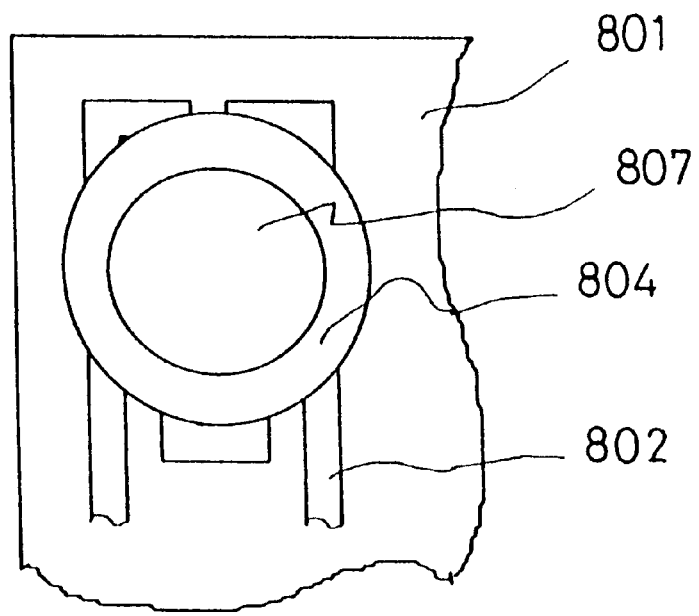
FIG. 50(a) is a plan view of a semiconductor integrated circuit device according to one embodiment of the present invention.

FIG. 50(a) is a plan view of the external electrically connecting terminal in which solder or gold bumps are disposed on the external electrically connecting terminal-use aluminum electrode of a semiconductor integrated circuit device according to one embodiment of the present invention. An electronic circuit, for example, polysilicon resistors 802 are arranged on a semiconductor substrate 801, then an external electrically connecting terminal-use metal electrode 804 is disposed on the polysilicon resistors 802 through the interlaminar film 803. Further, a solder or gold bump electrode 808 is disposed on a part of the external electrically connecting terminal-use metal electrode 804 through the passivation film 805 having an opening portion 807. There is a case that the passivation film 805 having an opening portion 807 on a part of the external electrically connecting terminal-use metal electrode 804 is not formed with the interlaminar film 803 as a protecting film.

Figure 50B:
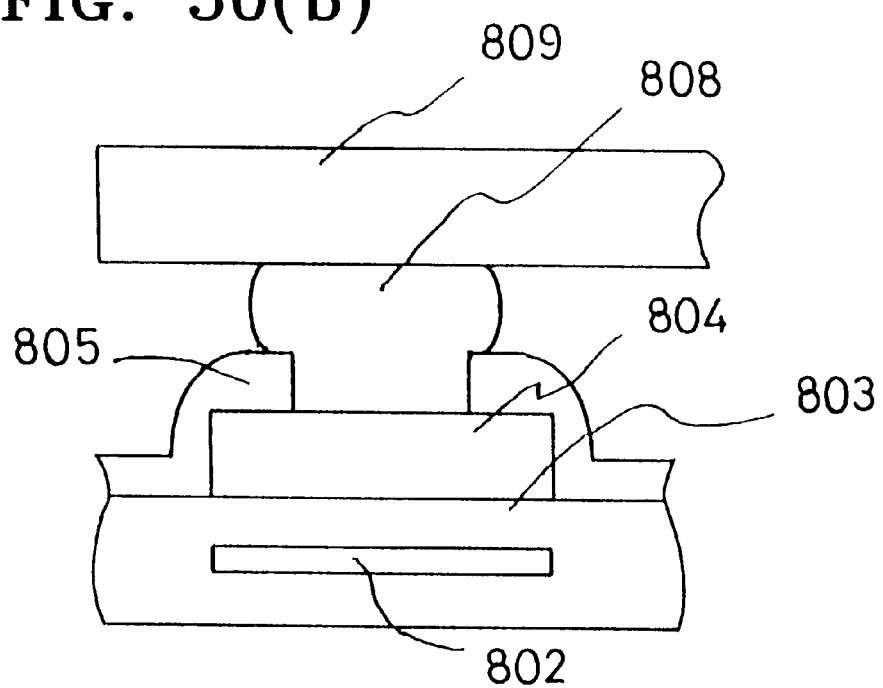
FIG. 50(b) is a sectional view of a semiconductor integrated circuit device according to the present invention, showing a state at the time of the implementation.

FIG. 50(b) is a sectional view of a semiconductor integrated circuit device according to the present invention showing a case in which it is implemented by solder of gold bumps. In FIG. 50(b), the external electrically connecting terminal-use metal electrode 804 is 1.5 to 4 μm in film thickness. If a pressure is applied to a semiconductor substrate 801 and the external electrode substrate 809 when an external electrically connecting terminal-use solder or gold electrode 808 and an external electrode substrate 809 are connected, the thick external electrically connecting terminal-use metal electrode 804 can absorbs the surplus stress received from the bonded wire 806. As a result, the stress applied to the interlaminar film 803 and the polysilicon resistors 802 is reduced, thereby preventing the characteristic variation due cracks of the interlaminar film 803 and deformation of the polysilicon resistors 802. The more the film thickness of the external electrically connecting terminal-use metal electrode 804 is, the more the stress is relieved. However, the most optimum value is 2 to 3 μm based on the degree of the difficulty of the manufacturing process and the degree of stress relief.

Further, the external electrically connecting terminal-use metal electrode 804 used in the above embodiments can be used for an interconnection layer of the semiconductor electronic circuit, and another metal layer can be used for an interconnection layer of the semiconductor electronic circuit.

The above external electrically connecting terminal-use metal electrode 804 can be made of a material such as aluminum, silicone, copper, tungsten, and the like, or a compound thereof, preferably a compound of aluminum, silicone and copper.

A semiconductor integrated circuit device according to one embodiment of the present invention will be described hereinafter with reference to the drawings. The circuit element here means a pad electrode, a protecting circuit or an internal circuit.

Figure 51:
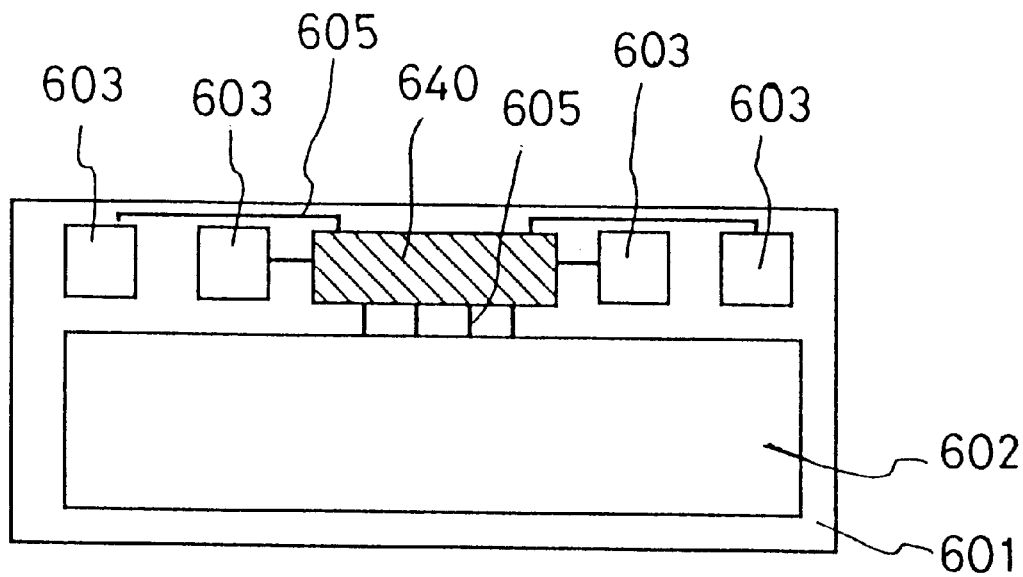
FIG. 51 is a plan view of a semiconductor integrated circuit device according to one embodiment of the present invention.

FIG. 51 is a plan view of a semiconductor integrated circuit according to one embodiment of the present invention. Four pad electrodes 603, 603, 603, 603 are formed on an outer periphery portion of a semiconductor substrate 601 of a semiconductor integrated circuit device. The pad electrodes 603 is an terminal for receiving a signal from an external circuit not shown or outputting a signal to the external circuit, which are connected to interconnections not shown, respectively. The four pad electrodes 603, 603, 603, 603 are connected to the protecting circuit block 640, respectively. The protecting circuit block 640 have a protecting circuit for the respective four pad electrodes 603, 603, 603, 603. In other words, the protecting circuits for the four pad electrodes 603, 603, 603, 603 are arranged at one place to form the protecting circuit block 640.

External signals communicated through the four pad electrodes 603, 603, 603, 603 reach to the internal circuit 602 through the protecting circuit block 640. The protecting circuit block 640 has four protecting circuit for four signals of the four pad electrodes 603, 603, 603, 603. However, the protecting circuits are arranged so closely to one another because they are not required to be separated from one another, thereby being capable of making the area of the protecting circuit block 640 less than the total area of the four protecting circuits 604 shown in FIG. 4 which is of the prior art. Also, in FIG. 51, the distance between the pad electrodes 603, 603 at the both condo and the protecting circuit block G40 is set as the illustrated relationship between the pad electrodes 603, 603 and the protecting circuit block 640, so that the protecting circuit block 640 can be arranged freely according to the circumstances of the protecting circuit block 640, thereby being capable of effectively using the area of the semiconductor substrate 601. As a result, the semiconductor integrated circuit device can be reduced in the chip size.

Figure 52:
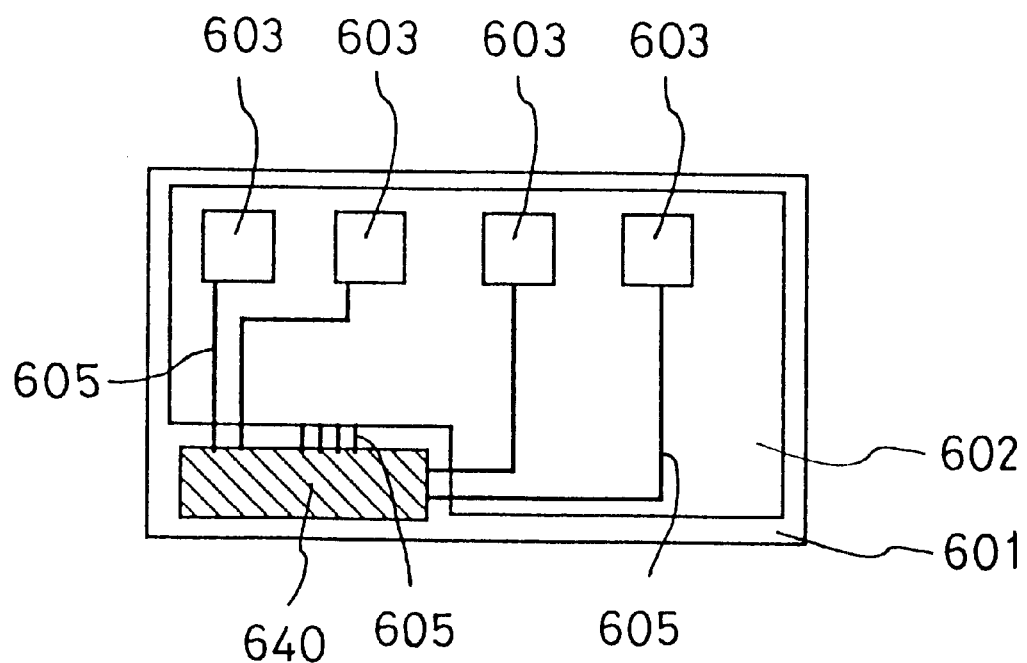
FIG. 52 is a plan view of a semiconductor integrated circuit according to another embodiment of the present invention.

The present invention becomes particularly advantageous in a case where the pad electrodes 603 are superposed on the internal circuit 602 (in two dimensions). FIG. 52 is a plan view of another embodiment of the present invention. The four pad electrodes 603, 603, 603, 603 are superposed on the internal circuit 602 in two dimensions. External signals communicated through the four pad electrodes 603, 603, 603, 603, passing through the electrode interconnections 605, 605, 605, 605 extending on a surface of a semiconductor element, reach to the internal circuit 602 through the protecting circuit block 640. The protecting circuit block 640 has four protecting circuit for four signals of the four pad electrodes 603, 603, 603, 603. However, the protecting circuits are arranged so closely to one another because they are not required to be separated from one another, thereby being capable of making the area of the protecting circuit block 640 less than the total area of the four protecting circuits 604 shown in FIG. 51. FIG. 52 shown an example in which the protecting circuit block 640 is arranged on the semiconductor substrate 601 on the opposite side to the four pad electrodes 603, 603, 603, 603. In a case where the pad electrodes 603, 603, 603, 603 are arranged and superposed on the internal circuit 602 longitudinally, there is originally required an electrode interconnection forming process, thereby in turn freely laying out the electrode interconnections 605, 605, 605, 605 on a surface of a semiconductor integrated circuit through an insulating film without increasing the processes, further in turn arranging the protecting circuit block 640 on any location. As a result, the surface area of the semiconductor substrate 601 can be effectively used, thereby reducing the chip size of the semiconductor integrated circuit device.

Figure 53:
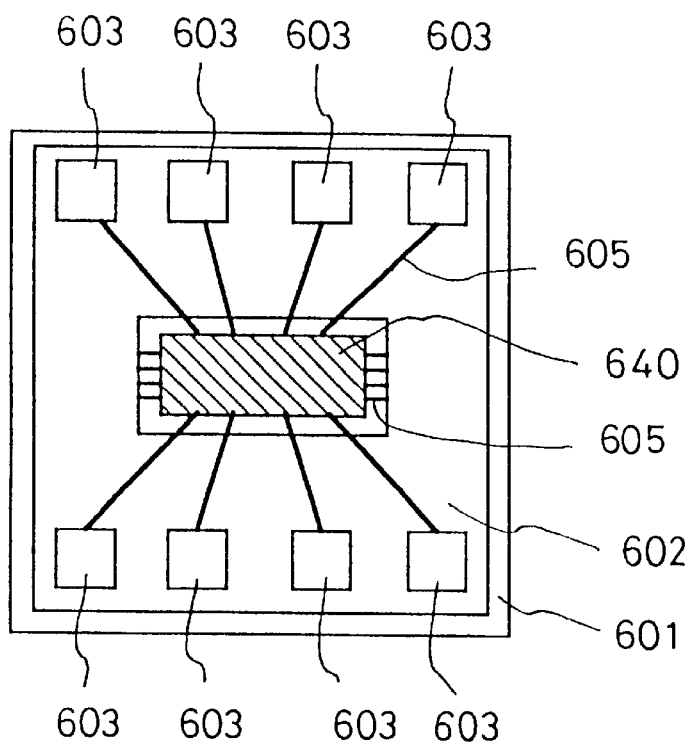
FIG. 53 is a plan view of a semiconductor integrated circuit according to still another embodiment of the present invention.

The present invention becomes more effective when the number of the pad electrodes is increased. FIG. 53 is a plan view of another embodiment of the present invention. Eight pad electrodes 603, 603, . . . are arranged and superposed longitudinally on the internal circuit 602 in two dimensions. External signals communicated through the pad electrodes 603, 603, . . . , passing through the electrode interconnections 605, 605, . . . , extending on a surface of a semiconductor element, reach to the internal circuit 602 through the protecting circuit block 640. The protecting circuit block 640 has eight protecting circuit for eight signals of the eight pad electrodes 603, 603 . . . However, the protecting circuits are arranged so closely to one another because they are not required to be separated from one another, thereby being capable of making the area of the protecting circuit block 640 less than two of the protecting circuit blocks 640 each including the four protecting circuits 604 shown in FIG. 52. FIG. 53 shows an example in which the protecting circuit block 640 is arranged on the semiconductor substrate 601 at a center portion. In a case where the pad electrodes 603, 603, . . . are arranged and superposed on the internal circuit 602 in two dimensions, there is originally required a electrode interconnection forming process, thereby in turn freely laying the electrode interconnections 605, 605, . . . on a surface of a semiconductor integrated circuit through an insulating film without increasing the processes, further in turn arranging the protecting circuit block 640 on any location. As a result, the surface area of the semiconductor substrate 601 can be effectively used, thereby reducing the chip size of the semiconductor integrated circuit device.

Figure 54:
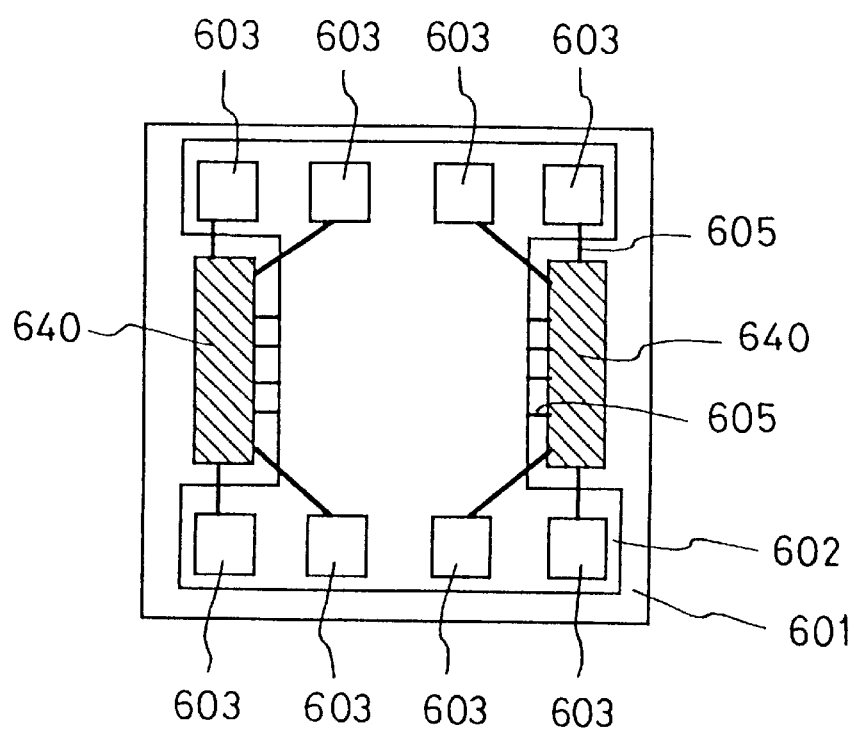
FIG. 54 is a plan view of a semiconductor integrated circuit according to further another embodiment of the present invention.

It is effective to group the protecting circuits 604 into a plurality of the protecting circuit blocks 640 by several without grouping all of them into one. FIG. 54 is a plan view of another embodiment of the present invention. Eight pad electrodes 603, 603, . . . Are arranged and superposed longitudinally on the internal circuit 602 in two dimensions. External signals communicated through the pad electrodes 603, 603, . . . , passing through the electrode interconnections 605, 605, . . . , extending on a surface of a semiconductor element, reach to the internal circuit 602 through the protecting circuit blocks 640, 640. One of the protecting circuit blocks 640 has four protecting circuit for four signals of the four pad electrodes 603, 603, . . . and the other of the protecting circuit blocks 640 has four protecting circuit for four signals of the four pad electrodes 603, 603, . . . However, the protecting circuits are arranged so closely to one another because they are not required to be separated from one another, thereby being capable of making the area of the protecting circuit block 640 less than the total area of the eight protecting circuits 604 shown in FIG. 51. In a case where the pad electrodes 603, 603, . . . are arranged and superposed on the internal circuit 602 in two dimensions, there is originally required a electrode interconnection forming process, thereby in turn freely laying the electrode interconnections 605, 605, . . . on a surface of a semiconductor integrated circuit through an insulating film without increasing the processes, further in turn arranging the protecting circuit block 640 on any location. As a result, the surface area of the semiconductor substrate 601 can be effectively used, thereby reducing the chip size of the semiconductor integrated circuit device.

The above-mentioned embodiments exemplify that a plurality of protecting circuits 604 are grouped into one or bore blocks to decrease the total area of the protecting circuits 604, 604, . . . Further, the protecting circuits 604 can be freely laid out only by arranging the pad electrodes 603, 603, . . . and the corresponding protecting circuits 604, 604, . . . so as to be separated from each other, thereby being capable of reducing the chip size. This, in other words, enables the other circuit elements to be interposed between at least one pad electrodes out of a plurality of pad electrodes and the corresponding protecting circuits. The circuit element here the other pad electrode 603, the other protecting circuit 604, and the other internal circuit 602.

Figure 60:
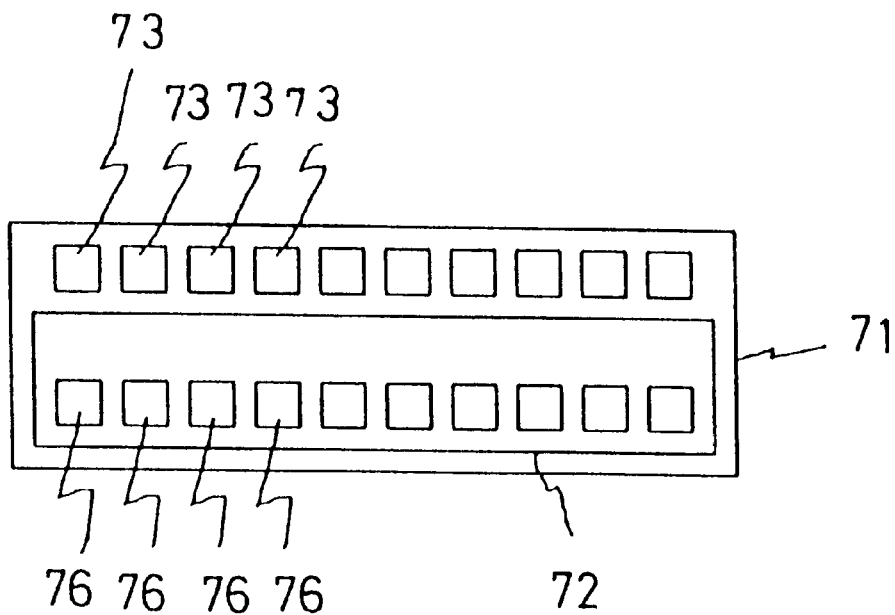
FIG. 60 is a plan view of a semiconductor integrated circuit device according to one embodiment of the present invention.

FIG. 60 is a plan view of a semiconductor integrated circuit according to the present invention. There are arranged on a semiconductor substrate 71 an integrated circuit 72 including resistors, transistors, capacitors and interconnections, and bump electrodes 73 communicating signals and an electric source with the integrated circuit and the external circuit, while dummy bumps 76 are arranged on the integrated circuit 72. The integrated circuit 72 is protected by an insulating film, what is called a passivation, on which the dummy bumps 76 are formed. In the case of forming the dummy bumps 76, the barrier metal layer is interposed between the dummy bumps 76 and the insulating film in order to raise the close contact strength therebetween. In FIG. 60, the semiconductor substrate 71 requires only the area corresponding to the bump electrodes 73 and the integrated circuit 72, thereby eliminating the need for a region for the dummy bumps, which can reduce the size of the semiconductor substrate.

Figure 61:
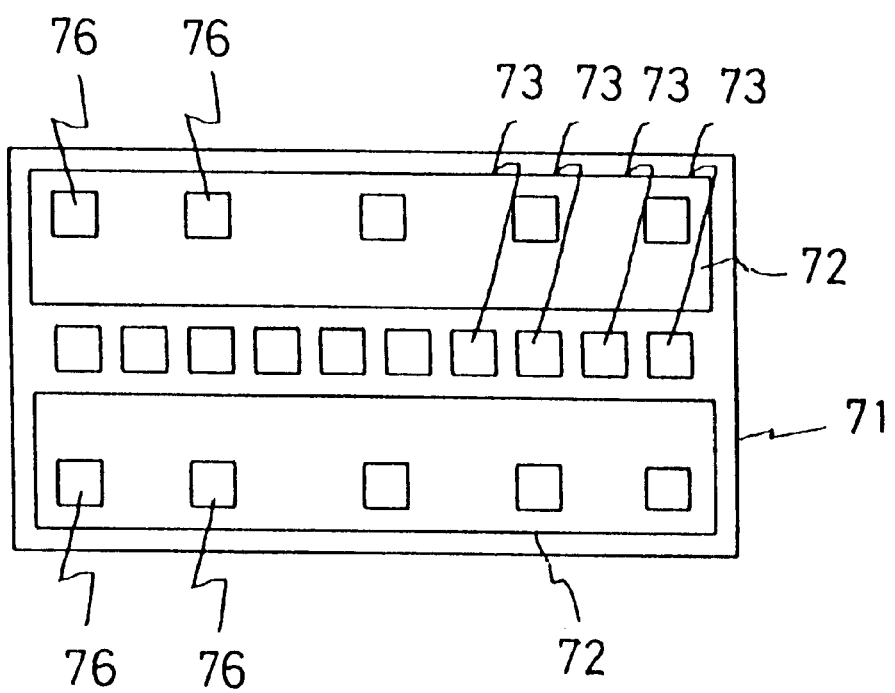
FIG. 61 is a plan view of a semiconductor integrated circuit according to another embodiment of the present invention.

FIG. 61 shows another embodiment according to the present invention. There are arranged on a semiconductor substrate 71 an integrated circuit 72 including resistors, transistors, capacitors and interconnections, and bump electrodes 73 communicating signals and an electric source with the integrated circuit and the external circuit, while dummy bumps 76 are arranged on the integrated circuit 72. The semiconductor integrated circuit device is implemented on to the external circuit while applying a pressure to a portion between the semiconductor substrate 71 and the external electrode substrate. At that time, the integrated circuit 72 just below the dummy bumps 76 is broken by the dummy bumps 76 and the semiconductor substrate 71, which damages the integrated circuit 72 due to the conditions such as the pressure at the time of the implementation and the implementation time, to exert a bad influence upon the characteristic, as the case may be. Therefore, in the embodiment of FIG. 61, an enlargement of the dummy bumps 76 distributes the force applied to the integrated circuit 72 by the dummy bumps 76 at the time of the implementation, thereby preventing the integrated circuit 72 being damaged. In FIG. 61, the semiconductor substrate 71 requires only the area corresponding to the bump electrodes 73 and the integrated circuit 72, there by entirely eliminating the need for a region for the dummy bumps, to reduce the chip size.

The bump electrodes necessary for a general integrated circuit for a thermal printer head driver are bump electrodes for leading a signal to the external portion, thereby bringing about the uneven distribution of the bumps on a part of the semiconductor chip. If only the bump electrodes necessary for the operation of the electronic circuits are disposed, bad circuits are created by the unexpected contact of the substrate due to the fact that the semiconductor integrated circuit device is mounted on to the external electrode substrate obliquely, and the like, when the semiconductor integrated circuit device is implemented on to the external circuit substrate, or bad contacts are created between the dump electrodes and the circuit substrate even if the uniform pressure is applied to the semiconductor circuit substrate at the time of the implementation, and therefore providing a dummy dump region to equip the dummy bumps.

Figure 55:
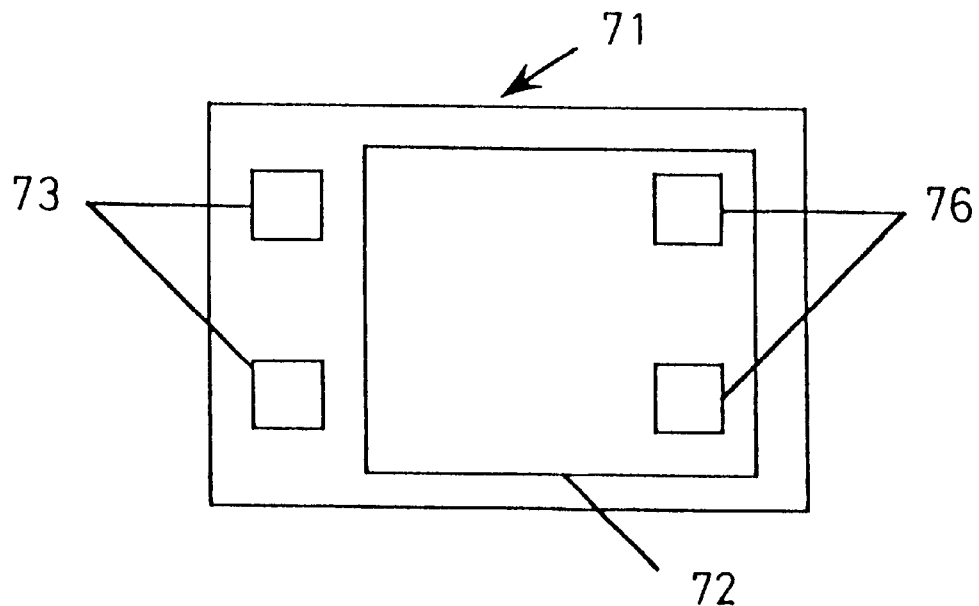
FIG. 55 is a plan view of a semiconductor integrated circuit device according to one embodiment of the present invention.

FIG. 55 is a plan view of a semiconductor integrated circuit according to the present invention. On a semiconductor substrate 71 are arranged an integrated circuit 72 including resistors, transistors, capacitors and interconnections, and bump electrodes 73 for communicating signals and an electric source with the integrated circuit and the external circuit, while dummy bumps 76 are arranged on the integrated circuit 72. The integrated circuit 72 is protected by an insulating film, what is called a passivation, on which the dummy bumps 76 are formed. That is, the integral circuit 72 is not affected by the dummy bumps in view of a circuit. Incidentally, the dummy bumps 76 are not formed on the insulating film through the barrier metal layer in order to raise the close contact strength therebetween. In FIG. 55, the semiconductor substrate 71 requires only the area corresponding to the bump electrodes 73 and the integrated circuit 72, thereby eliminating the need for a region for the dummy bumps, which can reduce the size of the semiconductor substrate.

Figure 56:
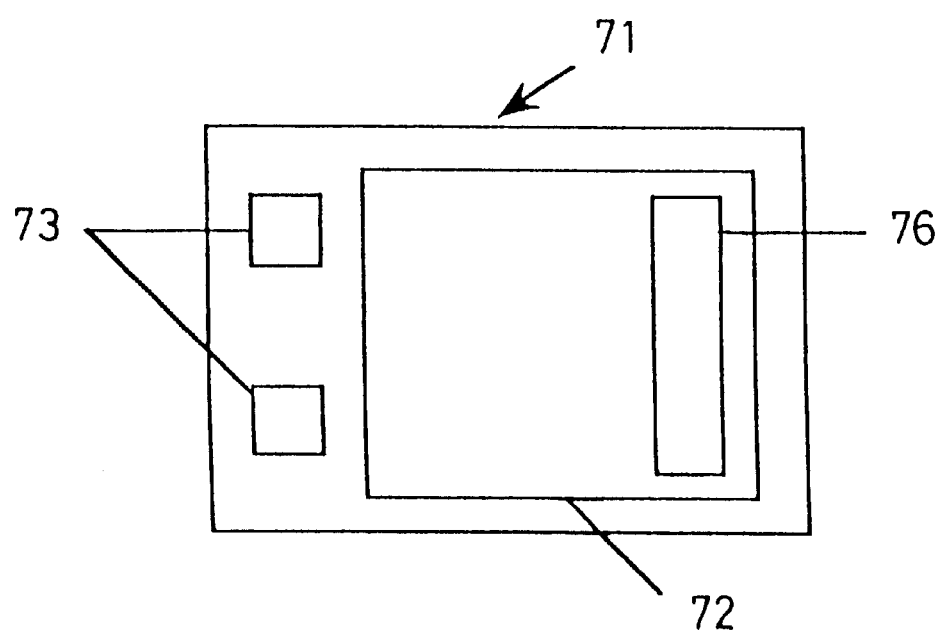
FIG. 56 is a plan view of a semiconductor integrated circuit according to another embodiment of the present invention.

FIG. 56 shows another embodiment according to the present invention. On a semiconductor substrate 71 are arranged an integrated circuit 72 including resistors, transistors, capacitors and interconnections, and bump electrodes 73 communicating signals and an electric source with the integrated circuit and the external circuit, while a dummy bump 76 larger than the bump electrode 73 is arranged on the integrated circuit 72. The semiconductor integrated circuit device is implemented on to the external circuit while applying a pressure to a portion between the semiconductor substrate 71 and the external circuit substrate. At that time, the integrated circuit 72 just below the dummy bump 76 is broken by the dummy bump 76 and the semiconductor substrate 71, which damages the integrated circuit 72 due to the conditions such as the pressure at the time of the implementation and the implementation time, to exert a bad influence upon the characteristic, as the case may be. Therefore, in the embodiment of FIG. 56, an enlargement of the dummy bumps 76 distributes the force applied to the integrated circuit 72 at the time of the implementation, thereby preventing the integrated circuit 72 from being damaged. In FIG. 56, the semiconductor substrate 71 requires only the area corresponding to the bump electrodes 73 and the integrated circuit 72, which entirely eliminates the need for a region for the dummy bump, to reduce the chip size.

Figure 57:
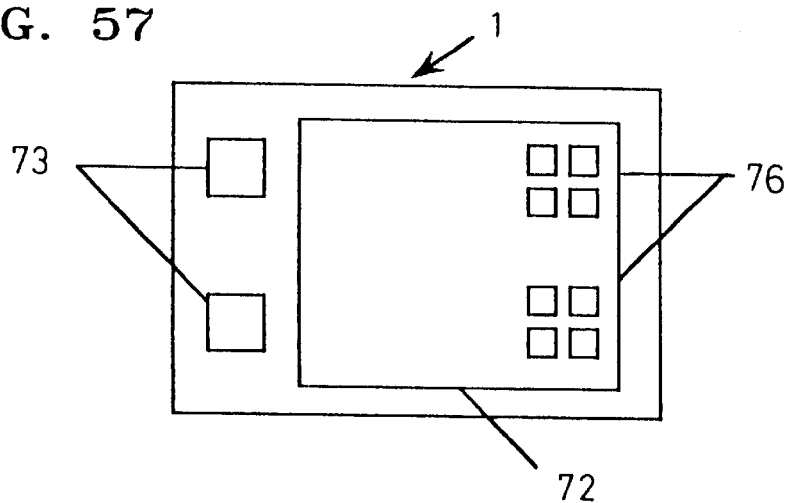
FIG. 57 is a plan view of a semiconductor integrated circuit according to another embodiment of the present invention.

FIG. 57 shows still another embodiment according to the present invention. On a semiconductor substrate 71 are arranged an integrated circuit 72 including resistors, transistors, capacitors and interconnections, and bump electrodes 73 for communicating signals and an electric source with the integrated circuit and the external circuit, while dummy bumps 76, each of which is smaller than the bump electrode 73, are arranged in a matrix form on the integrated circuit 72. The matrix form arrangement of the small dummy bumps distributes the force received by the integrated circuit 72 at the time of the implementation on to the external circuit, thereby preventing the semiconductor integrated circuit device from being damaged. In FIG. 57, the semiconductor substrate 71 requires only the area corresponding to the bump electrodes 73 and the integrated circuit 72, which entirely eliminates the need for a region for the dummy bumps, to reduce the chip size.

Figure 58:
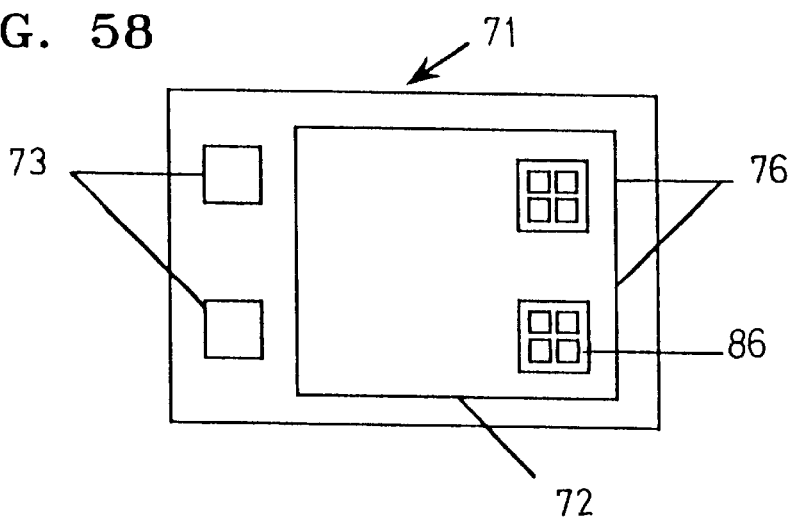
FIG. 58 is a plan view of a semiconductor integrated circuit according to another embodiment of the present invention.

FIG. 58 shows still another embodiment according to the present invention. On a semiconductor substrate 71 are arranged an integrated circuit 72 including resistors, transistors, capacitors and interconnections, and bump electrodes 73 for communicating signals and an electric source with the integrated circuit and the external circuit, while dummy bumps 76, each of which has one or more holes 86, are arranged on the integrated circuit 72. The use of the bumps each having holes distributes the force received by the integrated circuit 72 at the time of the implementation on to the external circuit, thereby preventing the semiconductor integrated circuit device from being damaged. In FIG. 58, the semiconductor substrate 71 requires only the area corresponding to the bump electrodes 73 and the integrated circuit 72, which entirely eliminates the need for a region for the dummy bumps, to reduce the chip size.

Figure 59:
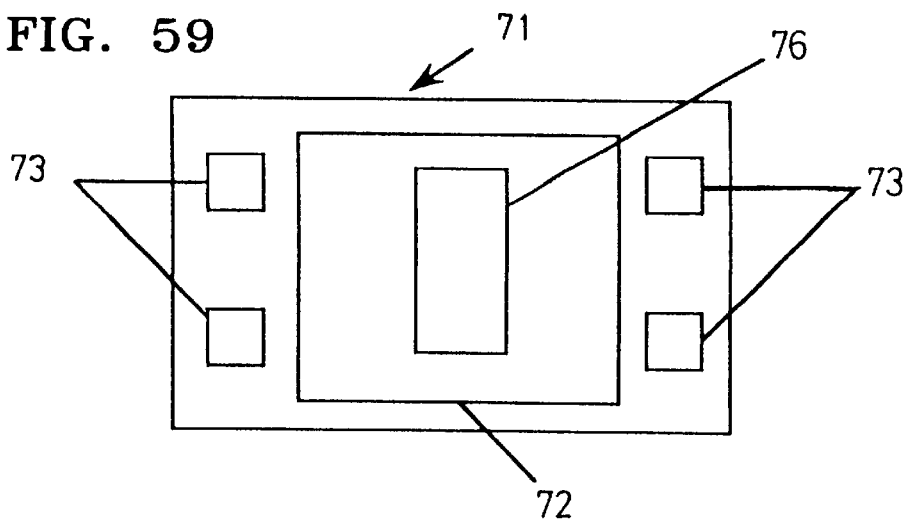
FIG. 59 is a plan view of a semiconductor integrated circuit according to another embodiment of the present invention.

FIG. 59 shows another embodiment according to the present invention. On a semiconductor substrate 71 are arranged an integrated circuit 72 including resistors, transistors, capacitors and interconnections, and bump electrodes 73 for communicating signals and an electric source with the integrated circuit and the external circuit, while a dummy bump 76 is arranged on a center portion of the integrated circuit 72. The semiconductor integrated circuit device is implemented on to the external circuit while applying a pressure to a portion between the semiconductor substrate 71 and the external electrode substrate. When the bump electrodes are arranged on the peripheral portion as with this embodiment, the center portion of the chip is deformed due to the received pressure if the chip is large, thereby varying the characteristic of the integrated circuit, as the case may be. In the case of FIG. 59, the dummy bumps 76 are disposed on the center portion of the chip, thereby preventing the chip from deforming. In FIG. 59, the semiconductor substrate 71 requires only the area corresponding to the bump electrodes 73 and the integrated circuit 72, which entirely eliminating the heed for a region for the dummy bumps, to thereby prevent the integrated circuit from being damaged without increasing the chip size.

All of the above embodiments are directed to the case in which there are provided with bump electrodes for leading the signals to the external portion, at the periphery portion of the semiconductor substrate. Not only the above embodiments but also the ones in which the bump electrodes are located on the center portion of the integrated circuit and the dummy bumps are disposed on the peripheral portion thereof, or the external leading bump electrode and the dummy bumps are arranged at random, are capable of making the area of the semiconductor substrate smaller by locating the dummy bumps on the integrated circuit.

There is well known a general method of manufacturing a semiconductor integrated circuit, comprising the steps of forming a plurality of semiconductor integrated circuits on a surface of a silicone substrate by using a photolithography technique, and then cutting off the silicon substrate into the respective semiconductor integrated circuits as chips at a scribing process. On the surface of the silicone substrate in the vicinity of the scribed region at the scribing process are formed electronic circuits each including a diffusion region. A protecting film is disposed on the surface of the electronic circuits. The scribed region (region in which the protecting film and the electronic circuit are not formed) is disposed between the respective integrated circuits, and then the silicone substrate is diced at a center portion of the scribed region thereof to be cut by a mechanical means.

Figure 65A:
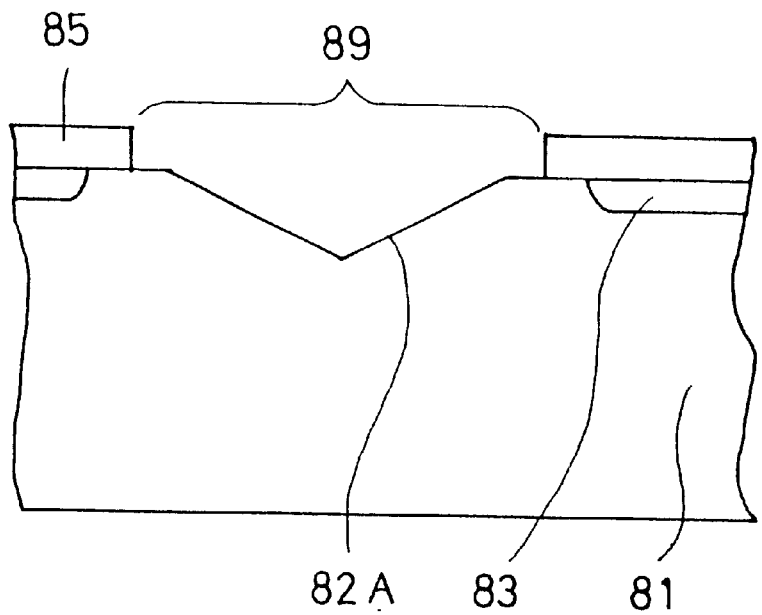
FIGS. 65(a) 65(b) are sectional view of the vicinity of a scribed region of the semiconductor integrated circuit, for explaining processes of a method of manufacturing the semiconductor integrated circuit according to the present invention.
Figure 65B:
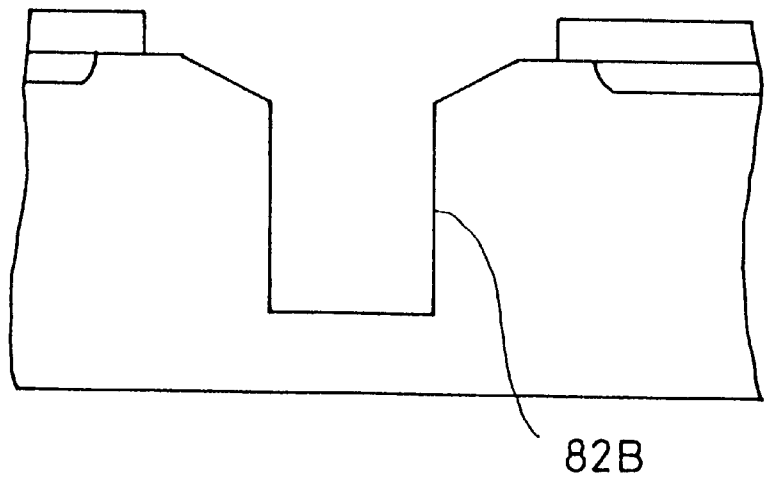

FIG. 65(*a*) is a sectional view of a semiconductor integrated circuit (hereinafter referred to as the IC) according to the present invention, showing processes of a manufacturing method of the IC. A plurality of elements including resistors, transistors, capacitors, and the like are formed on a surface of a silicon substrate (wafer), and then they are connected to one another by the metal interconnections.

In FIG. 65(*b*), for example, an N type diffusion layer 83 is disposed on a surface of a P type silicone substrate 81. The N type diffusion region 83 is one of the constituent elements of the electronic circuit. A protecting film 85 corresponding to a scribed region 89 on a surface of the silicone substrate 81 for the scribed region 89 is removed for the silicon substrate 81 to be easily cut during the scribing process. Respective electronic circuits are disposed on both sides of the scribed region 89. After the formation of the metal interconnections, the final protecting film 85 is formed except the final protecting film 85 and external electrically connecting region (usually pad region) . After the final protecting film 85 is patterned, the surface of the silicone substrate 82 for the scribed region is removed during a first silicone substrate removing process. At the first silicone substrate removing process, the silicone substrate is removed more deeply than the diffusion region 83. When the diffusion region 83 is a source-drain region of the transistor, the silicone substrate 81 is removed deeply by about at least 2 μm. When the diffusion region 83 is a well of a CMOS circuit, the silicone substrate 81 is removed deeply by at least 5 μm. The removing speed of the silicone substrate is slower in the first silicone substrate removing process than in the next second silicone substrate removing process (corresponding to the conventional scribing process), which prevents crystal defects from being induced in the vicinity of the scribed surface. Since the removing speed of the silicone substrate at the first silicone substrate removing process is slow, the depth is 50 μm at the most. Therefore, in the first silicone substrate removing process, the silicone substrate is removed at a depth of 2 to 50 μm, generally 5 to 50 μm, then preferably 10 to 50 μm. There is preferably used in the first silicone substrate removing process a chemical means such as a wet etching, or both of a chemical means and a physical means such as a dry etching. When a mechanical means is used at the first silicone substrate removing process, there is preferably carried out the dicing in which a removing width is reduced toward a center portion of the scribed region 89, as shown in FIG. 65(*a*). The V-like scribed surface 82A shown in FIG. 65(*a*) increases the distance between the diffusion layer 83 and the scribed surface, whereby the crystal defects created on the scribed surface is hard to affect on the diffusion layer 83.

After the first silicone substrate removing process, the silicone substrate 81 is vertically cut substantially in a depthwise direction at the second silicone substrate removing process, as shown in FIG. 65(*b*). The scribed surface 82B is cut all over, or almost all over the silicone substrate 81 at the second silicone substrate removing process. At the second silicone substrate removing process, the silicone substrate 81 is removed in the same manner as the conventional scribing process, that is, the mechanical means. The width of the scribed silicone substrate 81 is narrower than that of the scribed surface 82B formed at the first silicone substrate removing process. At the second silicone substrate removing process, many large crystal defects are created on the silicone substrate 81 inside the scribed surface 82B. However, the scribed surface 82B is away from the diffusion layer 83, which prevents the deterioration of the characteristic of the electronic circuits. In other words, in the IC manufacturing method according to the present invention, the scribed region 89 is arranged in the vicinity of the diffusion layer 83, thereby reducing the chip size.

Figure 62A:
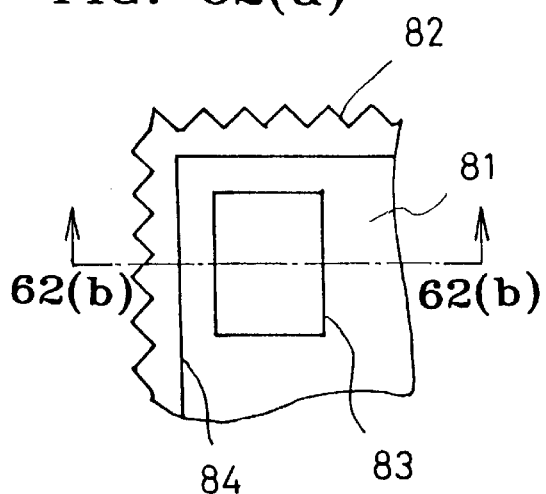
FIG. 62(a) is a plan view of a chip corner portion of a semiconductor integrated circuit according to the present invention.
Figure 62B:
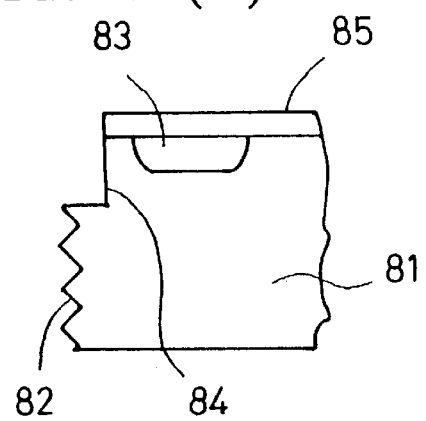
FIG. 62(b) is a sectional view taken along the line 62(b)—62 (b) of FIG. 62(a).

FIG. 62(*a*) is a plan view of a corner portion of a semiconductor integrated circuit according to the present invention, and FIG. 62(*b*) is a sectional view taken along the line 62(*b*)—62(*b*) in: FIG. 62(*a*). In a semiconductor integrated circuit, the respective chips on a surface of a silicone substrate have the same construction on which resistors, transistors and capacitors are formed. After that, the silicone substrate is cut at a scribed region of the chips, which is called a scribe line, into respective chips at the dicing process.

FIG. 62(*a*) is a plan view of a corner portion of the scribed chip. A silicone substrate for forming an integrated circuit and a diffusion region 83 of a reverse conductive type are disposed inside a scribed surface 82. A stepped surface 84 of the silicone substrate made by etching the substrate 81 is formed between the scribed surface 82 and the diffusion region 83.

As shown in FIG. 62(*b*), a vertically stepped surface 84 is disposed between the scribed surface 82 and the diffusion region B3. A surface of the substrate 81 including the diffusion region 83 is covered by a protecting film 85. The silicone stepped portion 84 is disposed slightly inside the scribed surface as shown in FIG. 62, thereby narrowing the distance between the diffusion region 83 and the scribed surface 82. At the dicing process, the silicone substrate 82 is cut by the mechanical means, inducing the crystal defects inward the silicone substrate from the scribed surface. However, in the semiconductor integrated circuit, the scribed surface 82 is located more deeply than the diffusion region 83, whereby the crystal defects inducing from the scribed surface 82 do not reach the diffusion region 83. The silicone stepped portion 84 is formed at a process of etching the silicone substrate including a chemical reaction, which is, accordingly, at a level of hardly forming the crystal defects. In particular, the wet etching is hardly subjected to the physical reaction, thereby almost eliminating the creation of the crystal defects. Further, when an ani-sotropic etching is carried out by using the etching including the physical reaction such as the reactive ion etching, the wet etching including the isotropic etching is added slightly, thereby being capable of removing the crystal defects caused by the etching. The depth of the etching step is required to be deeper than at least the diffusion region 83. In a case where the semiconductor integrated circuit is constructed by the CMOS circuit, the diffusion region of not less than 2 μm in depth, which is called a well, is disposed on the surface of the substrate. Accordingly, in the case of the CMOS circuit, the depth is not less than 2 μm, which is deeper than the well, preferably not less than 10 μm. The deep stepped portion narrows the distance between scribed surface and the diffusion region 83 to about 5 to 15 μm.

Figure 63:
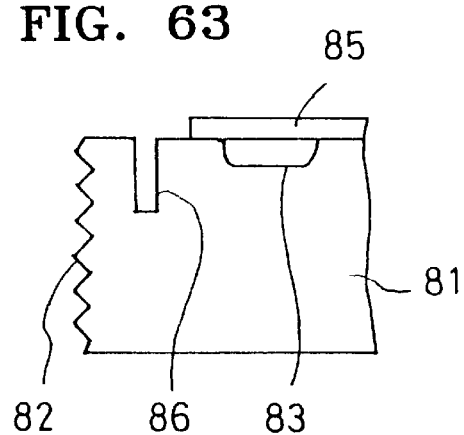
FIG. 63 is a sectional view of a chip corner portion of a semiconductor integrated circuit according to another embodiment of the present invention.

FIG. 63 is a sectional view of an end portion of a chip formed in a chip form, in a semiconductor integrated circuit according to another embodiment of the present invention. A scribed surface 82 is comprised of a surface of a substrate 81 as in the case of the conventional one. However, a groove 86 which is deeper than a diffusion region 83 is formed between the diffusion region 83 and the scribed surface 82, which reduces the distance between scribed surface 82 and the diffusion region 83. The crystal defects inducing form the scribed surface does not progress into a groove 86 due to the presence of the groove 86, so that the diffusion region 83 can be arranged closely to the scribed surface 82.

Figure 64:
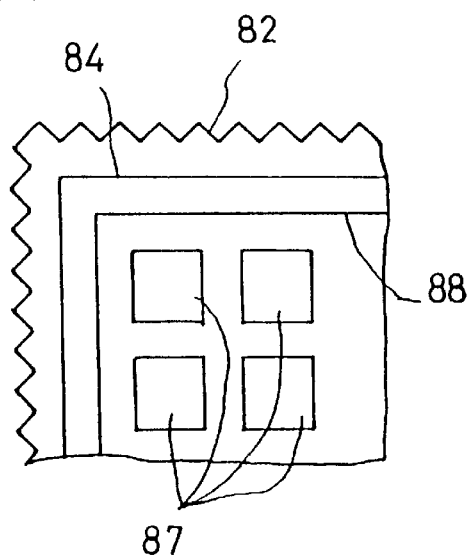
FIG. 64 is a plan view of a chip corner portion of the semiconductor integrated circuit according to another embodiment of the present invention.

As apparent from the embodiments of FIGS. 62 and 63, the silicone stepped portion is disposed between the scribed surface 82 and the diffusion region 83, thereby reducing the area of the periphery of the chip. The present invention has a particular advantage for the semiconductor integrated circuit shown in FIG. 64. FIG. 64 is a plan view of a chip-like semiconductor integrated circuit. A silicone stepped portion 84 is disposed inside a scribed surface 82, and further a circuit region 88 on which electronic circuits are formed is disposed inside the silicone stepped portion 84. The circuit region 88 includes a diffusion region 84. A plurality of pad regions 87 as external electrically connecting terminals are arranged on the circuit region 88. In the semiconductor integrated circuit shown in FIG. 64, since the pad regions 87 are arranged on the circuit region 88, the area of the chip is effectively made small by reducing the distance between the circuit region 88 and the scribed surface 82.

In general, the semiconductor integrated circuit is designed in such a manner that the peripheral length of the chip is made short thereby effectively using the internal area of the chip. Accordingly, it is preferable that the shape of the chip is a square. However, a closely contact image sensor or thermal head driving semiconductor integrated circuit is the IC in which the width-length ratio of the chip is not less than ten times. For example, the IC is an elongated one having a width of 0.5 mm and a length-of 7 mm. A so-called extra fine IC is one in which the side is long as compared with the area, and therefore the periphery length of the chip is longer twice times than that of the square chip having the same area. Accordingly, the construction according to the present invention is capable of reducing the area of the periphery of the chip, which is more effective than usual ICs.

The sectional construction of a pad portion of the general semiconductor integrated circuit will be described with a P type silicone substrate exemplified. Different N$^+$ impurity regions are disposed on a surface of the substrate so as to be separated from each other with a separation region. The separation region aims to separate the different N$^+$ type impurity regions from each other.

A thick insulating film is disposed on a surface of the substrate at the separating region. Pad portions as external connecting terminals are disposed on the separation region, and then a conductive film (pad electrode) which constitutes pad portions is disposed on the separation region for the pad portions.

The electric source voltage may be applied to the conductive film. The threshold voltage of the separation region is set to be lager (generally about twice) than the electric source voltage, thereby electrically separating a portion between the N$^+$ impurity regions. The conductive film of the pad region is generally made of a film of mainly aluminum, which serves as an interconnection.

Figure 66:
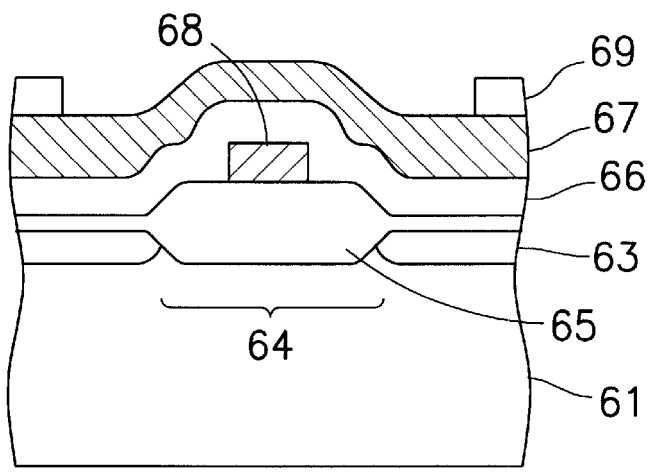
FIG. 66 is a sectional view of a separation region of a pad portion of a semiconductor device according to the present invention

FIG. 66 is a sectional view of a pad portion of a semiconductor device of the present invention. A pad is superposed on a transistor in order to reduce the chip size of the integrated circuit. The transistor is comprised of a MOS type transistor which is suitable for a low electric consumption. The pad portion is disposed on a plurality of MOS transistors. FIG. 66 is a sectional view of a portion of a separation region between the MOS transistor disposed below the pad electrode, or between a source region and a drain region of the MOS transistor. The construction of the separation region except the pad portion is the same as that of the conventional one. When a substrate 61 is made of a P type silicone semiconductor, a separation region 64 is disposed for electrically separating a N$^+$ impurity region 62 and N$^+$ impurity region 63. A field insulating film 65 which is sufficiently thick as compared with a gate insulating film is disposed on a surface of the substrate 61 at the separation region 64. A conductive film 68 is disposed on the field insulating film 65. A pad electrode 67 is disposed on the conductive film 68 through an intermediate film 66. The pad electrode 67 is made of an aluminum film which generally also serves as the interconnection of the integrated circuit. The conductive film 68 serves as the gate electrode of the MOS transistor, which can be made without complicating the manufacturing processes. When the interconnection of the integrated circuit is of a double metal construction (the number of interconnections except the gate electrodes), the conductive film 68 is made of a metal interconnection of the first layer, which can be made without complicating the manufacturing processes.

The potential of the conductive film 68 is set to any one of the potentials of the substrate 61, the source region, the drain region and the gate electrode of the MOS transistor, and the electric source voltage. When the conductive film 68 is made of the same film as the gate electrode, which serves as the gate electrode, the gate electrode of the MOS transistor is disposed on the separation region 64. In this case, the potential of the conductive film 68 is the same as that of the gate electrode of the MOS transistor. The interconnection except the pad portion is covered by a final protecting film 69. In other words, the protecting film 69 is perforated in order to be made into the external connecting terminal.

Figure 67:
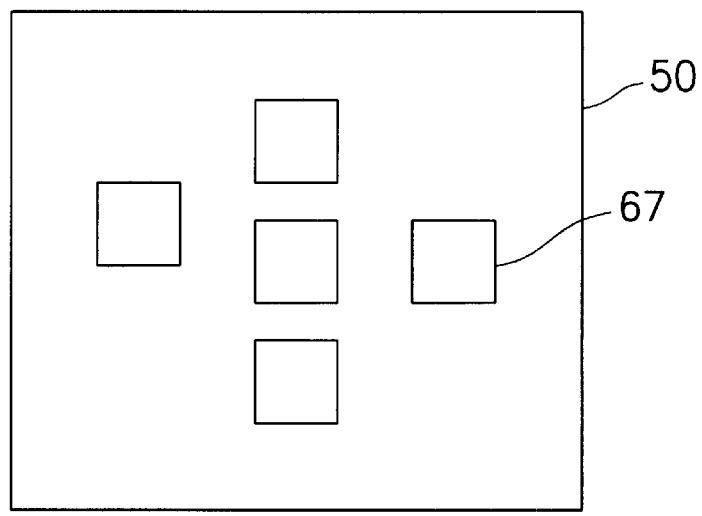
FIG. 67 is a plan view of a semiconductor device according to the present invention.

It is found that the separation construction shown in FIG. 66 prevents the creation of a leak electric current through the separation region 64 in a case where the large static electricity is added to the pad electrode 67. The surface portion of the substrate 61 of the separation region 64 is electrically shielded by the conductive film 68, thereby preventing the strong electric field from being added to the field insulating layer 65 on the surface of the substrate 61. The width (distance between the region 62 and the region 63) of the separation construction shown in FIG. 66 excessively becomes larger than the conventional construction. In the semiconductor device according to the present invention, the separation region below the pad electrode is separated as shown in FIG. 66. FIG. 67 is a plan view of the semiconductor device according to the present invention. A plurality of the pad electrodes 67 are disposed on the chip 50 at a portion including a center portion thereof. The pad electrode 67 is disposed on the gate electrode of the transistor. In the case of the integrated circuit in which the pad electrode is not less in area than the chip (For example, the rate is not less than 20%), the pad electrode is laminated on the transistor as shown in FIG. 67, thereby effectively reducing the chip area. In the semiconductor device according to the present invention, the construction shown in FIG. 66 is used for the separation region below the pad electrode 67, thereby reducing the width of the separation region between the transistors except the pad electrodes 67.

The separation construction shown in FIG. 66 presents the reversal of the substrate 61 by the shield electrode 68, thereby preventing the leak electric current from flowing. Accordingly, the separation due to the shield electrode shown in FIG. 66 is called a shield separation. In the separation region shown in FIG. 67, a partially thick region of the field insulating film 65 due to the selective oxidation method raises the threshold value of the voltage thereat, which prevents the leak electric current form flowing. Generally, a P type impurity is doped on a surface of the substrate 61 below the field oxide film 65 in order to raise the threshold of the voltage.

In the case of the shield separation, although the field insulating film 65 due to the selective oxidation method is employed for the embodiment of FIG. 66, the formation of the thick field insulating film 68 is not a necessary condition.

As described above, in the semiconductor integrated circuit in which the pad electrodes are laminated on a plurality of the transistors, the separation construction between the transistors below the pad electrodes is shield-separated, thereby preventing the creation of the leak electric current between the separation regions caused when the static electricity is added to the pad electrode. A portion between the transistors on the region on which the pad electrode is not formed need not be applied with the shield separation, but is applied with the different separation which enables the width of the separation region to be minimized, thereby reducing the area of the chip.

Figure 68:
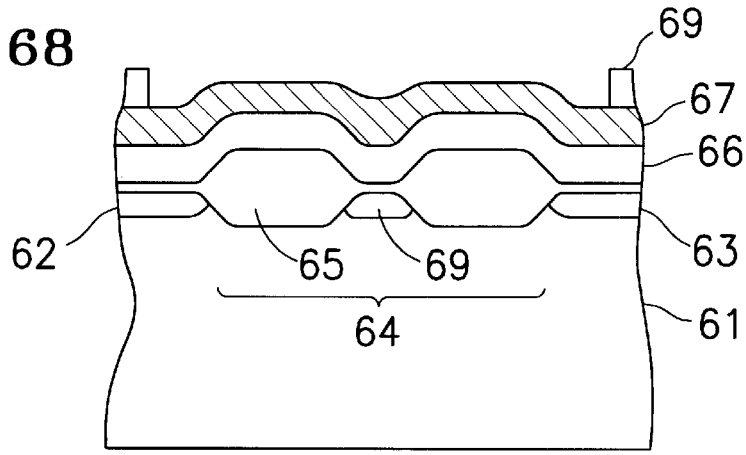
FIG. 68 is a sectional view of a separation region of a pad portion of a semiconductor device according to the present invention.

FIG. 68 shows an embodiment of the separation construction different from the shield separation construction used below the pad electrode. A separation region 64 between an N type impurity region 62 and an N type impurity region 63 is formed in such a manner that a P type impurity region of high density (not less than $10^{19}$ atoms/cm$^3$) is disposed on a perforation region which is formed on an intermediate portion of a thick field insulating film 65.

In FIG. 68, the impurity region 69 of high density is disposed on an intermediate portion between the N type impurity region 62 and the N type impurity region 63 to be separated, away from the respective impurity regions 62, 63. The separation construction is called a diffusion separation, since the impurity regions are separated by a diffusion region 69. The diffusion separation separates the transistors below the pad region on the chip, thereby preventing the creation of the leak electric current. The diffusion separation has a disadvantage that the width of the separation region is large. Accordingly, the separation on a portion except the pad electrode is preferably subjected to another type separation construction. The diffusion separation does not require the thick field insulating film 65 due to the selective oxidation method like the shield separation.

Figure 69:
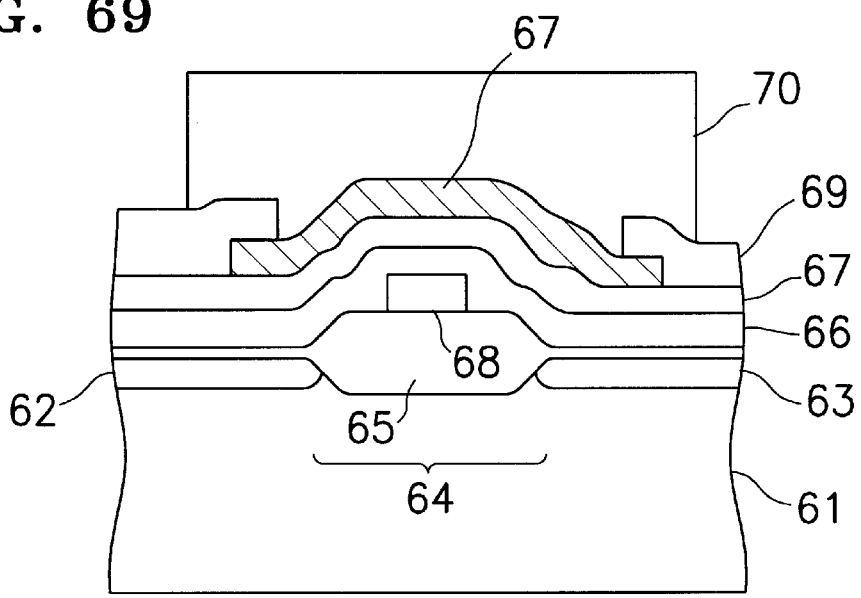
FIG. 69 is a sectional view of a separation region of a pad portion of another semiconductor according to the present invention.

FIG. 69 is a sectional view of a semiconductor device according to an embodiment of the present invention, in which a bump electrode 70 is disposed on a pad electrode 67. Generally, a bonded wire is often used for the pad electrode as an external connecting means. When the pad electrode is disposed on the transistor to bond the wire on to the pad electrode, the transistor is deteriorated due to the wire bonding in some cases. As shown in FIG. 69, the external connecting means of a face down manner using the bump electrode such as a solder bump is used instead of the wire bonding, which in turn facilitates to prevent the deterioration of the transistor below the pad electrode 70.

In the semiconductor integrated circuit used for a general electronic circuit, a plurality of pad portions 703 as an external connecting terminal are arranged between an active element region including transistor, and a chip. In other words, the active element region and the pad portion are arranged in two dimensions on a surface of the chip at individual regions. Further, to the pad portion is connected the wire, which is connected to the leads of the respective package, then the leads are soldered to the metal interconnections of the printed circuit board.

Figure 70:
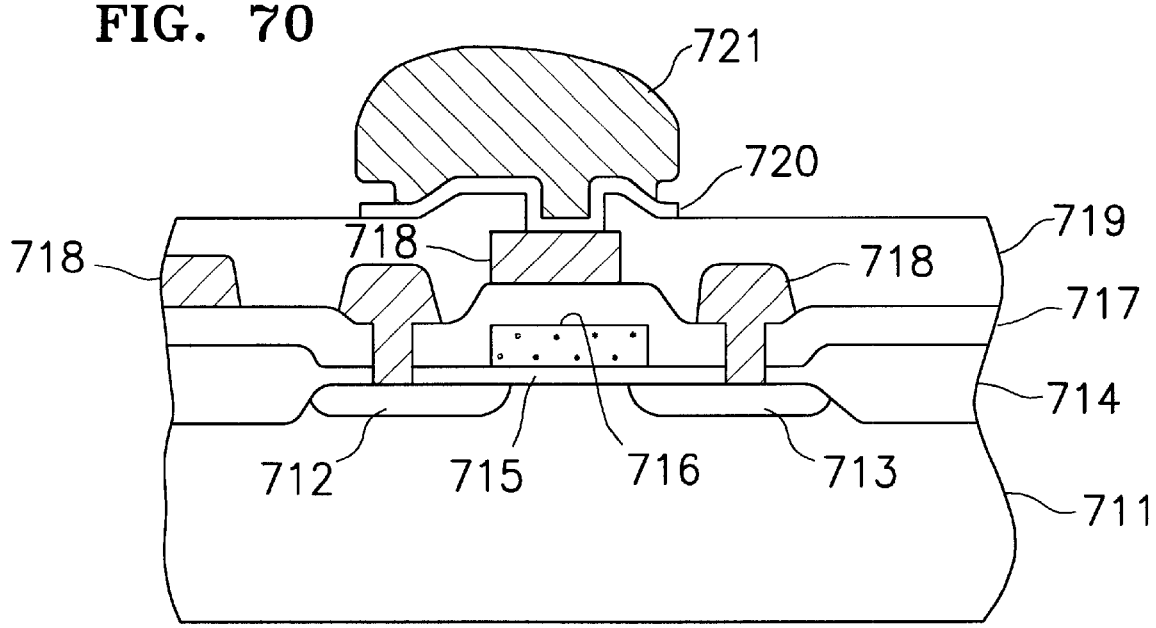
FIG. 70 is a sectional view of a semiconductor device to be used for an electronic circuit according to the present invention.

FIG. 70 is a sectional view of a semiconductor integrated circuit to be used for an electronic circuit according to the present invention.

A silicone semiconductor 711 used as a substrate will be described hereinafter. A insulating gate type electric field transistor is formed on a surface of a P type silicone substrate. The insulating gate type electric field transistor is comprised of a source region 711 and a drain region 713, of N type, disposed on a P type silicone substrate away from each other, and a gate electrode 716 disposed on a surface of a silicone substrate between the source region 712 and an drain region 713 through a gate insulating film 715. A interlaminar insulating film 717 is formed between the gate electrode 716 and the interconnection metal 718. A thick insulating film 714 is formed between the respective transistors disposed on a surface of the substrate 711. When the metal interconnection 718 is arranged on the thick insulating film 714, the thick insulating film prevents the type of the substrate surface portion from reversing from P type to N type. In other words, the thick insulating film 714 aims to electrically separate the respective transistors. A protecting film 719 is disposed on the metal interconnection. The protecting film 719 is on the uppermost metal interconnection, regardless of how many layers the metal interconnections are disposed, such as one, two three layers.

FIG. 70 shows the embodiment of the integrated circuit having one layer of the metal interconnection. The external terminal connecting pad on the transistor is made of the same film as that of the metal interconnection. The protecting film 719 on the metal film of the pad is perforated as shown in FIG. 70, and then a solder bump 721 is formed so as to cover the perforated region. A barrier metal 720 is disposed between the metal film 718 of the pad and the solder bump. For example, when the metal interconnection 718 is made of aluminum, the barrier metal 720 is formed by a chromium film, which has a good adhesiveness, by a spattering. The semiconductor integrated circuit according to the present invention is constructed such that the pad portion is formed on the gate electrode 718 and the solder bump 721 is disposed on the pad portion as shown in FIG. 70.

Figure 71:
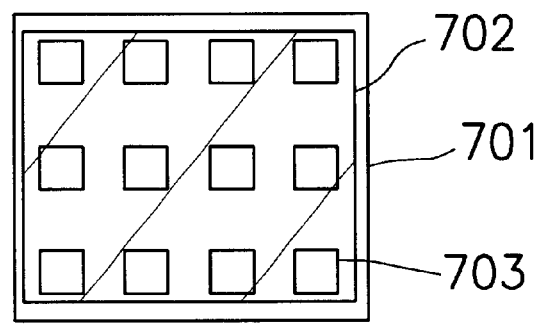
FIG. 71 is a plan view of a semiconductor device used for an electronic circuit according to the present invention.

FIG. 71 is a plan view of the semiconductor integrated circuit having the construction shown in FIG. 70, in which a pad portion 703 is superposed on an active element region, thereby reducing the area of a chip 701. Further, the solder bump can be directly implemented on to a printed circuit board in two dimensions, thereby being capable of arranging in two dimensions not less than three of the pads in a longitudinal direction and in a lateral direction of the chip, respectively, also of arranging on a center portion of the chip.

Figure 72:
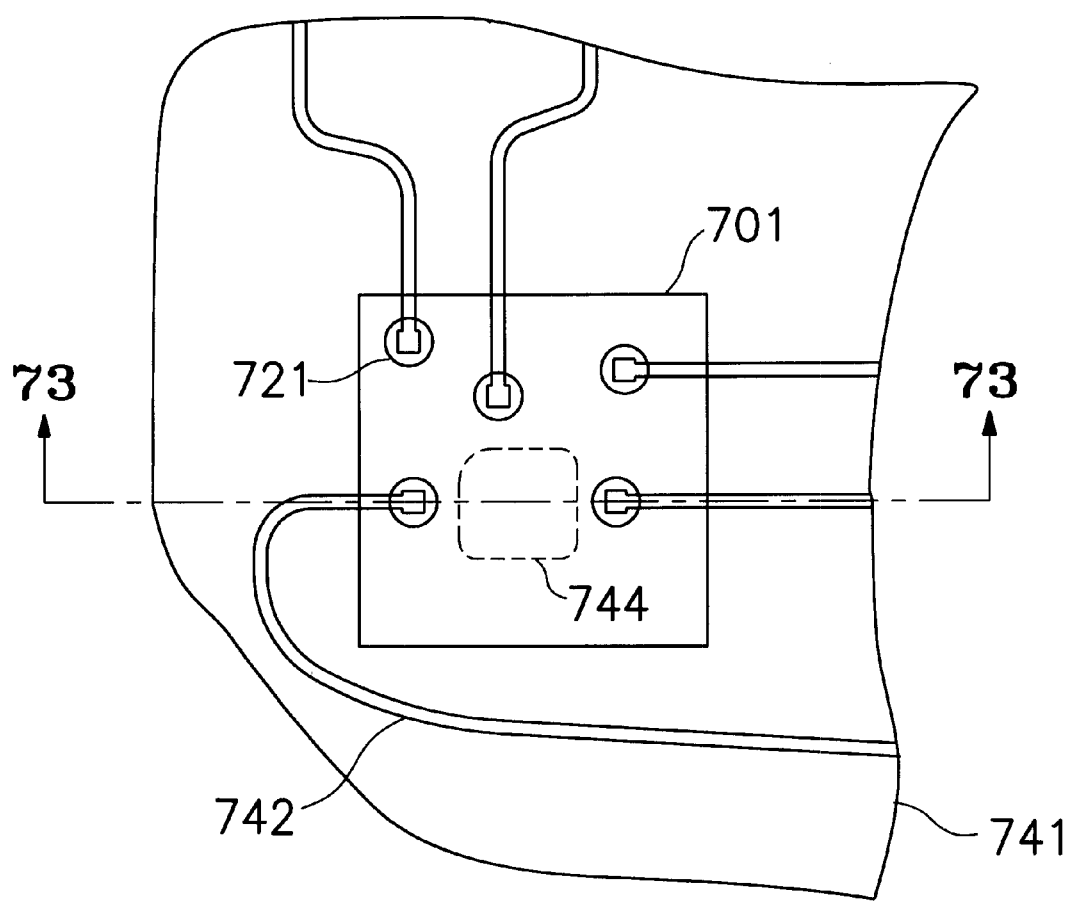
FIG. 72 is a plan view of an electronic circuit according to the present invention.

FIG. 72 is a plan view of an electronic circuit in which a chip is implemented on to a printed circuit substrate 741. A surface of a chip is adhered to a surface of a printed circuit board in a face down manner, which is constructed such that the rear face of the chip can be seen form the front surface of the printed circuit board 701.

Figure 73:
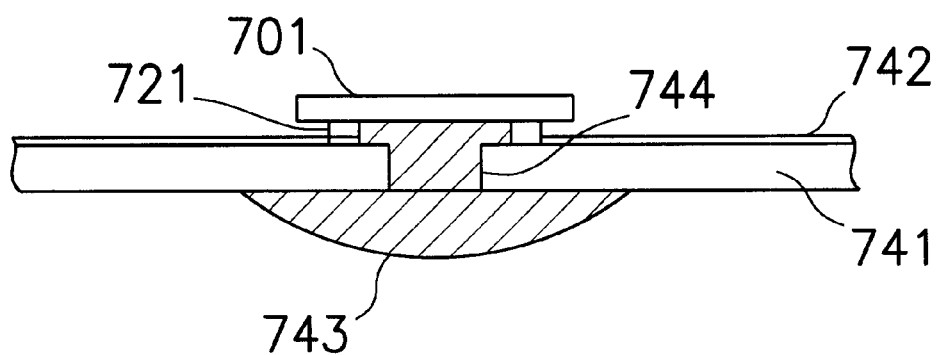
FIG. 73 is a sectional view taken along the line 73—73, of FIG. 72.

FIG. 73 is a sectional view taken along the line 73—73 of FIG. 72. The interconnection 42 of the printed circuit board 741 and the bump 721 are connected electrically and mechanically to each other.

A method of manufacturing the electronic circuit shown in FIGS. 72 and 73 will be described hereinafter. First, an integrated circuit is formed on a surface of a wafer by the use of a general integrated circuit manufacturing method. The respective integrated circuits are separated in two dimensions by the use of the scribing lines. A plurality of the pad electrodes 703 of the integrated circuit are superposed on the active element region 702. The protecting film 710 on the pad electrode 703 is perforated, then the barrier metal 720 is formed so as to be directly connected electrically and mechanically to the pad electrode 703. The barrier metal 720 is patterned so as to cover the respective pad regions. Next, the solder 721 is selectively plating-grown on the barrier metal, thereby manufacturing the semiconductor integrated circuit in a wafer form.

Further, the electric characteristics of the respective semiconductor integrated circuit in the wafer are evaluated to be classified into a non-defective unit or a defective unit. Next, the evaluated wafer is scribed along a scribing line into chips, and then the respective chips 701 are adhered to predetermined locations of the printed circuit board 741 in a face down manner by automatic equipments. For the purpose of realizing the face down manner adhesion, flux (resin flux cored solder) on the surface of the respective bumps 721, and then adhered to the printed circuit board 741 so as to be positioned at a predetermined location thereof. The printed circuit substrate and the chip can be positioned as described below. The printed circuit substrate and the chip are monitored by an electronic camera which is positioned at a predetermined location. The printed circuit substrate is partially perforated at a portion 744 with which the chip is superposed. The chip is monitored through the perforation 744 from the rear surface of the printed circuit board by the camera. The computer operates the image information, and then the automation equipment can arrange the chip on the printed circuit substrate at a predetermined location based on the operated result.

Figure 74:
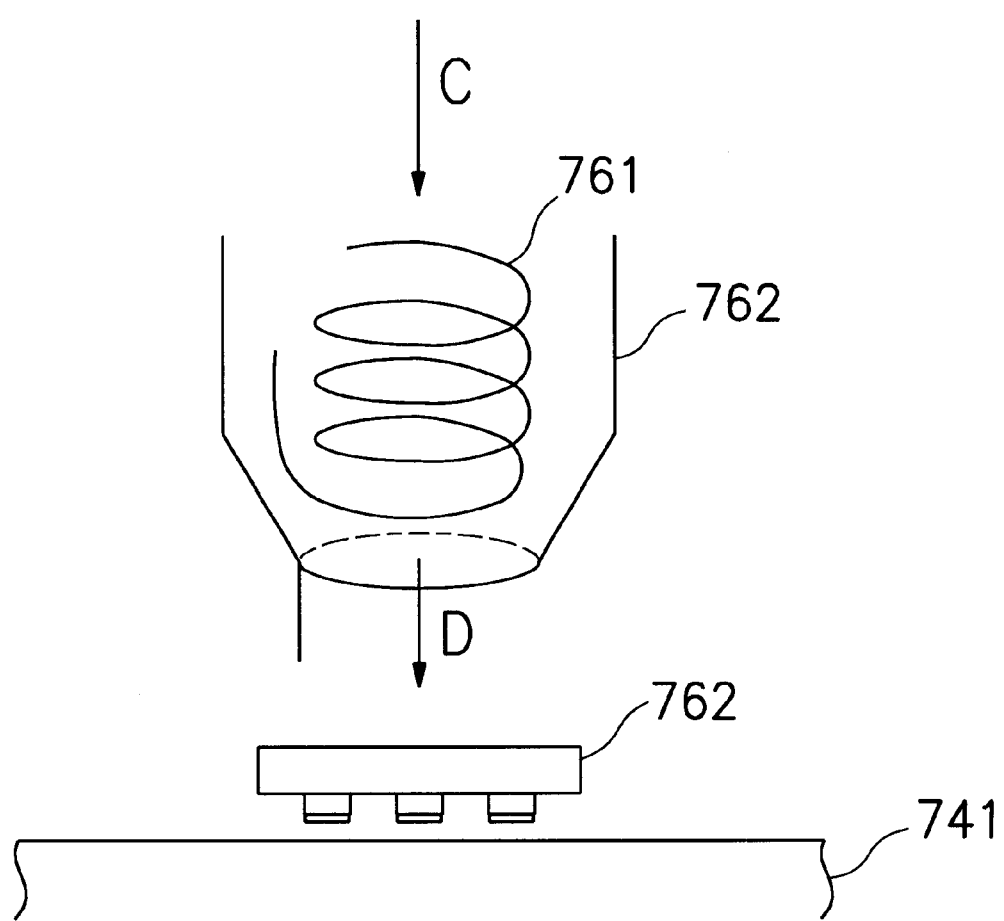
FIG. 74 is a schematic view showing a method of manufacturing an electronic circuit according to the present invention.

Moreover, the printed circuit substrate 741 and the semiconductor integrated circuit 701 are electrically connected to each other. FIG. 74 is a schematic diagram of the above processes. The hot wind is applied toward the chip from above the chip. The hot wind is sent to the chip 701 through a cylindrical container 762 having a hollow therein. A heater 761 is disposed inside the container 762 for controlling the temperature of the chip 701 by the use of the electric power consumed by the heater. An air in a room passes through the heater as shown by an arrow C to become a hot wind, and then is sent to the chip with a directionality shown by an arrow D. The hot wind having the directionality can locally heat the chip portion of the printed circuit substrate. The solder bump 721 of the chip and the metal interconnection of the printed circuit substrate are alloyed due to the hot wind to be strongly connected electrically and mechanically to each other. The control of the wind pressure of the hot wind having the directionality prevents the semiconductor integrated circuit from deteriorating due to the mechanical stress. In the alloying process, the alloying can be realized due to the self-weight of the chip.

Then, an organic resin 743 is molded so as to cover the chip 701 from the surface of the chip 701, which resin is disposed for preventing the light from entering into the integrated circuit from the outside, that is, has a function as a light shielding film. Also, when forming a printed circuit board for an electronic clock with the function of the chip and the printed circuit board as the electronic device of FIGS. 72 and 73, the result according to the purpose can be obtained. In particularly, this can be realized in the electric device according to the present invention, when the electric power consumption is very small. That is, in the present invention, the heat radiation capability of the chip is worse as compared with the conventional implemented construction. However, in a case where the electric current consumption is not greater than 10 $\mu$m as an electric clock, the purpose of the present invention can be realized by the simple construction shown in FIG. 72.

A CMOSIC (Complimentary Metal Oxide Semiconductor Integrated Circuit) is used as the semiconductor integrated circuit in order to make the electric current consumption not greater than 10 $\mu$A. The CMOSIC has an disadvantage to easily change in characteristic by the mechanical stress as compared with a bipolar integrated circuit, which, however, can be prevented by carrying out the implementation while controlling the pressure of the chip by using the above solder bump. Further, in the present invention, the chip is implemented on to the printed circuit substrate in a face down manner, thereby being capable of implementing a plurality of chips simultaneously, which improves the manufacturing efficiency of the implementation.

As described above, the semiconductor device for use in a thermal head according to the present invention is constructed such that a part of a transistor and a pad region as an output terminal are superposed in two dimensions, thereby having an effect to reduce the area of the chip to reduce the manufacturing cost, and further to elongate the distance between the gate electrode of the transistor and the contact hole of the drain region to. thereby raise the static withstand voltage.

Also, the semiconductor device according to the present invention is capable of realizing the semiconductor device having a high electrical current driving capability with a small area and a low cost while maintaining a high withstand voltage, and further of being resistant to the static electricity.

The semiconductor integrated circuit according to the present invention makes the thickness of the gate insulating film thin into 100 to 250Å, thereby obtaining the sufficient electric current driving capability for a facsimile only by arranging the HVMISFET on the periphery of the output pad, and further arranges the HVMISFET on the periphery of the output pad, thereby reducing the area of the chip to reduce the cost.

According to the present invention, a number of at least output pads of, for example, a driver integrated circuit are disposed on the corresponding driving transistors or logic circuits, thereby reducing the area of the chip and reducing the cost. The bump electrode or the barrier metal are employed as the interconnection, thereby having effects to reduce the area of the chip, and then to apply the large electric current without variation.

According to the present invention, the opening portion of the passivation film having a small area is disposed on the electronic circuit so as to be superposed on the external electrically connecting terminal-use metal electrode, thereby providing the semiconductor integrated circuit which is high in degree of freedom of designing of the electronic circuit and reduced in chip size.

According to the present invention, the bump construction can be utilized as not only the external electrically connecting terminal but also the interconnecting means without increasing the manufacturing processes, thereby reducing the area of the chip to reduce the cost.

According to the present invention, the semiconductor integrated circuit having the bump and the metal film below the bump, can shield the light by putting the metal film on the semiconductor element, thereby eliminating the gap to prevent the light from leaking, which operates the elements stably.

According to the present invention, there is realized a construction of escaping the stress at the time of the implementation, thereby providing the semiconductor integrated circuit of high reliability, having the bump electrode on the electronic circuit, which does not change the characteristic of the circuit.

According to the present invention, there is realized a construction of escaping the stress at the time of the implementation, thereby providing the semiconductor integrated circuit of high reliability, having the external electrically connecting terminal-use aluminum electrode on the electronic circuit, which does not change the characteristic of the circuit.

According to the present invention, there is realized a construction of escaping the stress at the time of the implementation, thereby providing the semiconductor integrated circuit of high reliability, having the bump electrode on the electronic circuit, which does not change the characteristic of the circuit.

According to the present invention, there is realized a construction of relieving the stress at the time of the implementation, thereby providing the semiconductor integrated circuit of high reliability, having the external electrically connecting terminal-use aluminum electrode or the bump on the electronic circuit, which does not change the characteristic of the circuit.

According to the present invention, the area of the protecting circuit can be reduced and the layout is carried out freely, thereby reducing the chip size of the semiconductor integrated circuit device.

According to the present invention, in the semiconductor integrated circuit device employing the dump electrode, the dummy bump required for implementing the semiconductor integrated circuit device on the external substrate is arranged on the integrated circuit, thereby reducing the area of the chip to reduce the cost.

According to the present invention, the silicone stepped portion is disposed for preventing the crystal defects, induced between the scribed surface and the circuit region by scribing, from reaching the circuit region, thereby reducing the area of the chip to reduce the cost. In particularly, the present invention has a specific effect in the semiconductor integrated circuit having the external connecting terminal (pad) on the circuit region. Also, in the present invention, the integrated circuit must be shaped like an elongated form for the purpose of the use thereof. For example, the periphery length of the chip is very large in the closely contact type image sensor integrated circuit, or the thermal head driving integrated circuit, thereby having an effect to reduce the area of the chip.

According to the present invention, the following effects can be attained:

(1) to reduce the chip size since the pad electrode is formed on the transistor;
(2) to improve the static withstand voltage characteristic by separating a portion between the transistors below the pad electrode by the shield separation or the diffusion separation;
(3) to reduce the chip size;
(4) to miniaturize the electronic circuit;
(5) to improve the manufacturing efficiency of the electronic circuit; and
(6) to reduce the cost of the electronic circuit.

What is claimed is:

1. A semiconductor integrated circuit comprising:

a first conductive type semiconductor substrate;

a second conductive type field effect transistor disposed on a surface of said semiconductor substrate, having a first drain region of a second conductive deep impurity region of low density and a second drain region of a second conductive type shallow impurity region of high density disposed on an inside surface of said first drain region for a high withstand voltage construction;

an external electrically connecting terminal disposed so as to be electrically connected to the second drain region through a metal film for connecting an external circuit;

a protecting film for protecting and covering the semiconductor integrated circuit;

an opening hole formed at the protecting film and superposed on the second drain region so as to expose the metal film; and a bump disposed on the metal through the opening hole.

2. The semiconductor integrated circuit device as claimed in claim 1, wherein said external electrically connecting terminal is provided on the drain region through wiring and a barrier metal thereon.

3. The semiconductor integrated circuit device as claimed in claim 1, wherein wiring at the opening hole is a pad.

4. The semiconductor integrated circuit device as claimed in claim 2, wherein said wiring has a thickness between 2 $\mu$m to 4 $\mu$m.

5. The semiconductor integrated circuit device as claimed in claim 1, wherein said external electrically connecting terminal is not superposed on a gate electrode of the second conductive type field effect transistor.

6. The semiconductor integrated circuit device as claimed in claim 5, wherein wiring at the opening hole is a pad.

7. The semiconductor integrated circuit device as claimed in claim 5, wherein said external electrically connecting terminal is provided on the drain region through wiring and a barrier metal thereon.

8. The semiconductor integrated circuit device as claimed in claim 7, wherein said wiring has a thickness between 2 $\mu$m to 4 $\mu$m.

* * * * *